(12) United States Patent
Ikuma et al.

(10) Patent No.: US 12,101,568 B2
(45) Date of Patent: Sep. 24, 2024

(54) SOLID-STATE IMAGING APPARATUS AND IMAGING APPARATUS INCLUDING A PLURALITY OF OVERFLOW ELEMENTS AND STORAGE CAPACITIVE ELEMENTS

(71) Applicant: Nuvoton Technology Corporation Japan, Kyoto (JP)

(72) Inventors: Makoto Ikuma, Hyogo (JP); Hiroyuki Amikawa, Ishikawa (JP); Kazutoshi Onozawa, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 341 days.

(21) Appl. No.: 17/513,622

(22) Filed: Oct. 28, 2021

(65) Prior Publication Data

US 2022/0053152 A1 Feb. 17, 2022

Related U.S. Application Data

(63) Continuation of application No. PCT/JP2020/019359, filed on May 14, 2020.

(30) Foreign Application Priority Data

May 31, 2019 (JP) .................................. 2019-103378

(51) Int. Cl.
*H04N 25/59* (2023.01)
*H01L 27/146* (2006.01)
(Continued)

(52) U.S. Cl.
CPC ....... *H04N 25/59* (2023.01); *H01L 27/14612* (2013.01); *H01L 27/14656* (2013.01);
(Continued)

(58) Field of Classification Search
CPC ...... H04N 25/59; H04N 25/621; H04N 25/75; H04N 25/771; H01L 27/14612; H01L 27/14656; H01L 27/14831
See application file for complete search history.

(56) References Cited

U.S. PATENT DOCUMENTS

2004/0041077 A1* 3/2004 Fossum ............. H01L 27/14609
348/E3.018
2008/0067325 A1 3/2008 Tani et al.
(Continued)

FOREIGN PATENT DOCUMENTS

JP 2008-104150 A 5/2008
JP 2009-165186 A 7/2009
(Continued)

OTHER PUBLICATIONS

International Search Report issued in corresponding International Patent Application No. PCT/JP2020/019359, dated Aug. 4, 2020, with English translation.

*Primary Examiner* — Luong T Nguyen
(74) *Attorney, Agent, or Firm* — Rimon P.C.

(57) ABSTRACT

A solid-state imaging apparatus includes: an overflow element group that accumulates a signal charge that overflows from a photodiode; and a floating diffusion layer that selectively holds a signal charge transferred from the photodiode and a signal charge transferred from the overflow element group. The overflow element group includes m groups (m≥2) connected in series in stages, each group including an overflow element and a storage capacitive element. An overflow element among the groups transfers, to the storage capacitive element included in the same group as the overflow element, a signal charge that overflows from the photodiode or a signal charge from an upstream storage capacitive element among the groups.

20 Claims, 118 Drawing Sheets

(51) Int. Cl.
*H01L 27/148* (2006.01)
*H04N 25/621* (2023.01)
*H04N 25/75* (2023.01)

(52) U.S. Cl.
CPC ..... *H01L 27/14831* (2013.01); *H04N 25/621* (2023.01); *H04N 25/75* (2023.01)

(56) References Cited

U.S. PATENT DOCUMENTS

| | | | | |
|---|---|---|---|---|
| 2009/0045319 | A1* | 2/2009 | Sugawa | H04N 25/771 |
| | | | | 250/208.1 |
| 2011/0108735 | A1* | 5/2011 | Ruetten | H04N 5/32 |
| | | | | 250/371 |
| 2016/0155768 | A1* | 6/2016 | Yi | H04N 25/772 |
| | | | | 257/225 |
| 2017/0134675 | A1 | 5/2017 | Hynecek | |
| 2017/0366764 | A1* | 12/2017 | Innocent | H04N 25/771 |
| 2020/0260026 | A1 | 8/2020 | Ono et al. | |

FOREIGN PATENT DOCUMENTS

| | | |
|---|---|---|
| JP | 4497366 B2 | 7/2010 |
| JP | 2019-80305 A | 5/2019 |

* cited by examiner

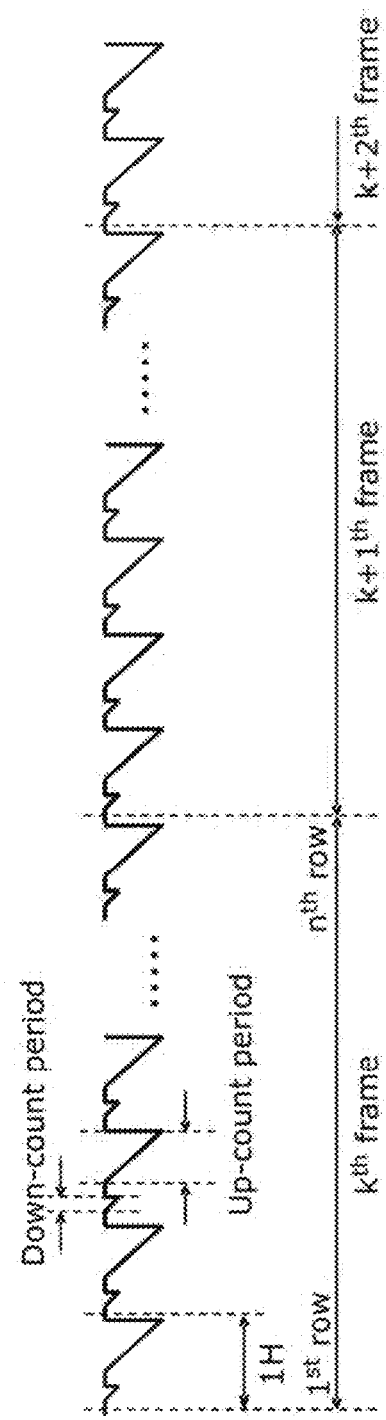

FIG. 11

| Unit | HCG readout | MCG readout | LCG readout |
|---|---|---|---|
| Reset component (down-count) | (1) | — | (4) |
| Signal component (up-count) | (2) | — | (3) |
| Reset component and signal component readout order: (1)→(2)→(3)→(4) | | | |

FIG. 15B

| (1) | C1 accumulation: 0 --> Q1 |
|---|---|
| (2) | Charge distribution C1<N>+C2<N>: Q1<br>C2<N> hold (Q1/M) |
| (3) | C1 accumulation: 0 --> Q2 |
| (4) | C2<N-1> hold (Q0+Q2)/M |
| (5) | =(2)+(4)<br>=mix of C2<N> and C2<N-1><br>=(Q0+Q1+Q2)/M |
| (6) | C1<N>: Q2 |
| (7) | C1<N>+C2<N-1>: Q0+Q2 |

FIG. 15C

| (1)→(2) | Attenuate to C2<N> when Q1 charge of C1<N> is redistributed with C1<N>+C2<N> (attenuation ratio M = 9.5 dB) |
|---|---|
| (3)→(4) | Attenuate to C2<N-1> when Q2 charge of C1<N> and Q0 charge of PD are redistributed with C1<N>+C2<N-1> (attenuation ratio M = 9.5 dB) |
| (5) | Mix C2<N> from (2) and C2<N-1> from (4) |

FIG. 22

| | Unit | PD<N> @ HCG readout | <N> @ MCG readout | C2<N-1> @ LCG readout | C2<N> @ LCG readout |
|---|---|---|---|---|---|
| FD potential | Charge (ele) | Q0 | — | (Q0+Q2)/M | Q1/M |
| | FD potential (V) | Q0/C0 | — | (Q0+Q2)/(M×(C0+C2)) | Q1/(M×(C0+C2)) |
| FD mixed potential | Total charge (ele) | Q0 | — | (Q0+Q1+Q2)/M | |
| | FD potential (V) | Q0/C0 | — | (Q0+Q1+Q2)/(M×(C0+C2)×2)† | Q1/(M×(C0+C2)×2)† |
| | LSB | ADH = ADC × FD potential | — | ADL = ADC × FD potential | |

Read1 (low-illuminance frame): PD<N> @ HCG readout, <N> @ MCG readout
Read2 (high-illuminance frame): C2<N-1> @ LCG readout, C2<N> @ LCG readout ADC: quantization unit (LSB/mV)
Attenuation ratio M = (C1+C2)/C2

† ×2 because of capacitances of both <N−1> and <N1>
† Approximation also possible when C2>>C0

FIG. 23

| Case No. | C2 (relative value) | C1 (relative value) | Total (relative value) | Attenuation ratio M (dB) (1) (C1+C2)/C2 | C2-DR (dB) (3) | C1-DR (dB) (2) | Overall DR (dB) (4)=def+(2) | Advantageous effect (reduced area) | Advantageous effect (extended DR) |
|---|---|---|---|---|---|---|---|---|---|
| 0 | 4 | 4 | 8 (*1) | 6.0 | 0.0 | 0.0 | 120.0 (*2) | No implementation (def.) | |
| 1 | 2 | 4 | 6 | 9.5 | -6.0 | 0.0 | 120.0 | ○ | Same (*2) |
| 2 | 1 | 4 | 5 | 14.0 | -12.0 | 0.0 | 120.0 | ○ | Same (*2) |
| 3 | 2 | 6 | 8 | 12.0 | -6.0 | 3.5 | 123.5 | Same (*1) | ○ |

FIG. 26

| Unit | HCG readout | MCG readout | LCG readout |
|---|---|---|---|
| Reset component (down-count) | (1) | (6) | (5) |
| Signal component (up-count) | (2) | (3) | (4) |
| Reset component and signal component readout order: (1)→(2)→(3)→(4)→(5)→(6) | | | |

| | |
|---|---|
| (1) | C2 accumulation |
| (2) | C3<N> hold (Q2/M) |
| (3) | C2 accumulation |
| (4) | C3<N-1> hold (Q0+Q1+Q3)/M |
| (5) | =(2)+(4) <br> =Mix of C3<N> and C3<N-1> <br> =(Q0+Q1+Q2+Q3)/M |
| (6) | C2<N>: Q3 |
| (7) | C2<N>+C3<N-1>: Q0+Q1+Q3 |

FIG. 35

| | | Read1 (low-illuminance frame) | Read3 (middle-illuminance frame) | Read2 (high-illuminance frame) | |
|---|---|---|---|---|---|
| | Unit | PD<N> @ HCG readout | C1<N> @ MCG readout | C3<N-1> @ LCG readout | C3<N> @ LCG readout |
| | Charge (ele) | Q0 | Q1 | (Q0+Q1+Q3)/M | Q2/M |
| FD potential | FD potential (V) | Q0/C0 | Q1/(C0+C1) | (Q0+Q1+Q3)/(M×(C0+C3)) | Q2/(M×(C0+C3)) |
| | Total charge (ele) | Q0 | Q0+Q1 | Q0+Q1+Q2+Q3 | |
| FD mixed potential | FD potential V | Q0/C0 | (Q0+Q1)/(C0+C1) | (Q0+Q1+Q2+Q3)/(M×(C0+C3)×2)† | |
| | LSB | ADH = ADC × FD potential | ADM = ADC × FD potential | ADL = ADC × FD potential | |

ADC: quantization unit (LSB/mV)   M=(C2+C3)/C3

†×2 because of capacitances of both <N-1> and <N>
†Approximation also possible when C3>>C0

FIG. 37

| Case No. | C3 (relative value) | C2 (relative value) | C1 (relative value) | Total (relative value) | Attenuation ratio M (dB) (1) (C2+C3)/C3 | C3-DR (dB)(3) | C2-DR (dB)(3) | Overall DR (dB) (4)=def +(2) | Advantageous effect (reduced area) | Advantageous effect (extended DR) |
|---|---|---|---|---|---|---|---|---|---|---|
| 0 | 20 | 20 | 8 | 48 (*1) | 6.0 | 0.0 | 0.0 | 120.0 | No implementation (def.) | |
| 1 | 10 | 20 | 8 | 38 | 9.5 | -6.0 | 0.0 | 120.0 | ○ | Same (*2) |
| 2 | 5 | 20 | 8 | 33 | 14.0 | -12.0 | 0.0 | 120.0 | ○ | Same (*2) |
| 3 | 10 | 30 | 8 | 48 | 12.0 | -6.0 | 3.5 | 123.5 | Same (*1) | ○ |

FIG. 39

| Unit | HCG readout | MCG readout | LCG readout |
|---|---|---|---|
| Reset component (down-count) | (1) | — | (4) |
| Signal component (up-count) | (2) | — | (3) |
| Reset component and signal component readout order: (1)→(2)→(3)→(4) | | | |

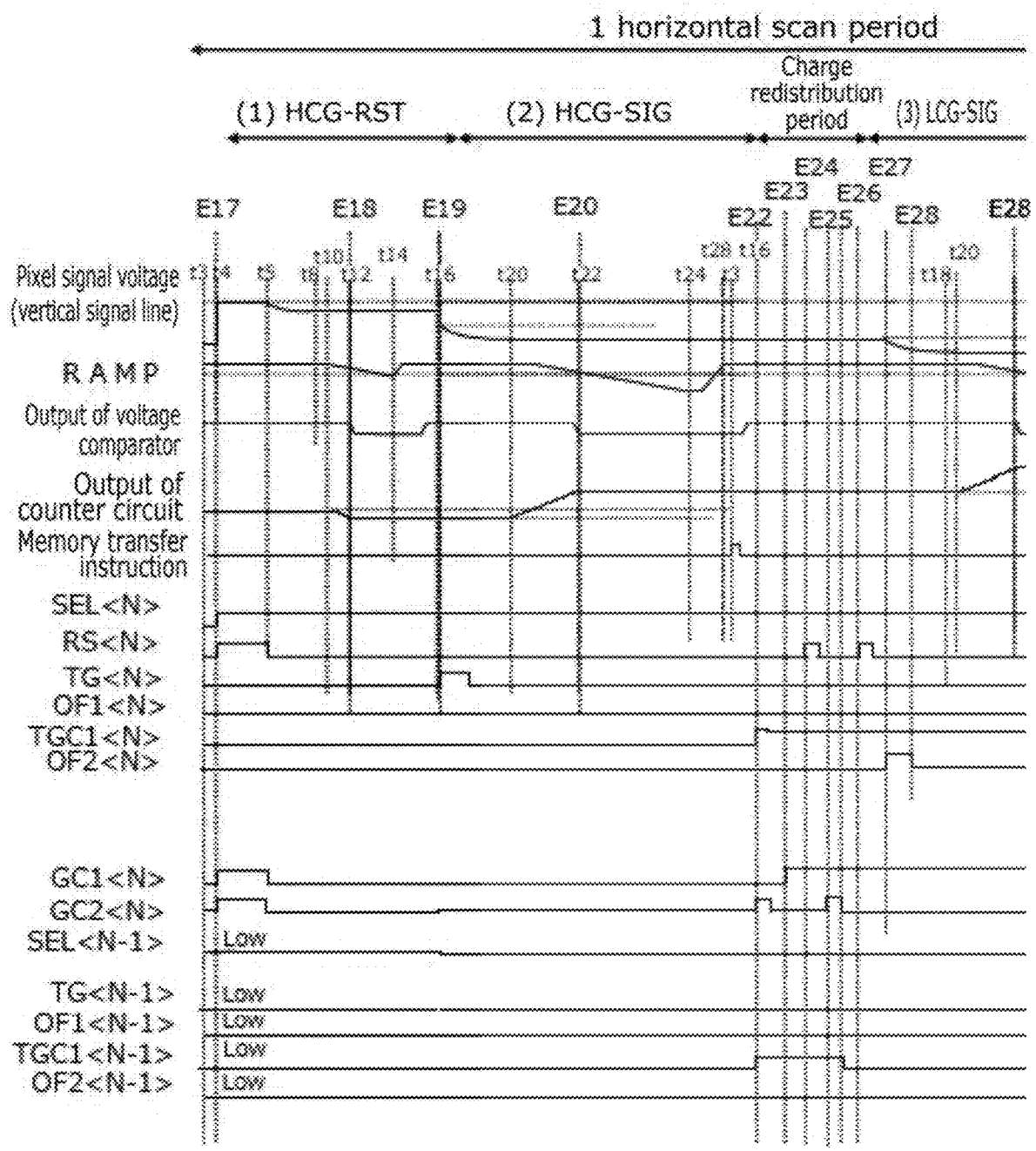

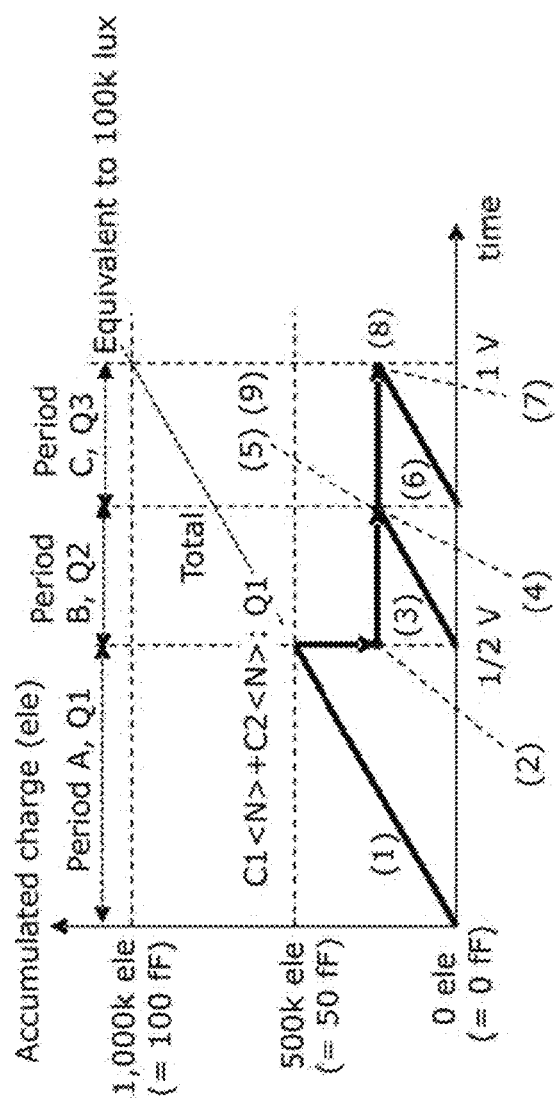

FIG. 41B (1) C1+C2 accumulation
(2) C2<N> hold (Q1/2)
(3) C1 accumulation
(4) C1<N> hold (Q2/2)
(6) C1 accumulation
(7) C1<N> hold (Q0+Q3)/4
(5) =(2)+(4) =C2<N>+C1<N>: (Q1+Q2)/2
(9) =(5)/2=C2<N>: (Q1+Q2)/4
(8) =(9)+(7) Mix of C2<N> and C1<N> =(Q0+Q1+Q2+Q3)/2

FIG. 41C

| | |
|---|---|
| (1)→(2) | Attenuation by redistribution of Q1 charge of C1<N>+C2<N> with C2<N> |
| (3)→(4) | Attenuation by redistribution of Q2 charge of C1<N> with C1<N-1> |
| (5)→(9) | Mix C2<N> of (2) and C1<N> of (4), and attenuate by redistribution with C2<N> |
| (6)→(7) | Attenuation by redistribution of Q3 charge of C1<N> and Q0 charge of PD with C1<N-1> |
| (8) | Mix C2<N> of (9) and C1<N> of (7) |

FIG. 48

| | | Unit | Read1 (low-illuminance frame) PD<N> @ HCG readout | <N> @ MCG readout | Read2 (high-illuminance frame) C1<N> @ LCG readout | C2<N> @ LCG readout |
|---|---|---|---|---|---|---|
| FD potential | Charge (ele) | Q0 | — | $(Q0+Q3)/4$ | $(Q1+Q2)/4$ |
| | FD potential (V) | $Q0/C0$ | — | $(Q0+Q3)/(4\times(C0+C1))$ | $(Q1+Q2)/(4\times(C0+C2))$ |
| FD mixed potential | Total charge (ele) | Q0 | — | $(Q0+Q1+Q2+Q3)/4$‡ | |
| | FD potential (V) | $Q0/C0$ | — | $(Q0+Q1+Q2+Q3)/(4\times(C0+C1+C2))$† | |
| | LSB | ADH = ADC × FD potential | — | ADL = ADC × FD potential | |

ADC: quantization unit (LSB/mV)　M=(C1+C2)/C2=2　†M×2=4 since there are two attenuation operations
‡Approximation also possible when C2, C1>>C0

FIG. 50

| Case No. | C2 (relative value) | C1 (relative value) | Total (relative value) | Attenuation ratio M (dB) (1) (C1+C2)/C2 | C2-DR (dB)(3) | C2-DR (dB)(2) | Overall DR (dB) (4)=def +(2) | Advantageous effect (reduced area) | Advantageous effect (extended DR) |
|---|---|---|---|---|---|---|---|---|---|
| 0 | 2 | 2 | 4 | 6.0 | 0.0 | 0.0 | 120.0 *2 =def | No implementation (def.) | No implementation (def.) |
| 1 | 1 | 1 | 3 | 6.0 | -6.0 | 0.0 *1 | 120.0 | ○ | Same |

FIG. 53

| Unit | HCG readout | MCG readout | LCG readout |
|---|---|---|---|
| Reset component (down-count) | (1) | (6) | (5) |
| Signal component (up-count) | (2) | (3) | (4) |
| Reset component and signal component readout order: (1)→(2)→(3)→(4)→(5)→(6) | | | |

FIG. 56B (1) C2<N>+C3<N> accumulation
(2) C3<N> hold (Q2/2)
(3) C2 accumulation
(4) C2<N> hold (Q3/2)
(5) =(2)+(4)
       =C3<N>+C2<N> : (Q2+Q3)/2
(9) C3<N> : (Q2+Q3)/4
(6) C2 accumulation
(7) C2<N> hold (Q0+Q1+Q4)/4
(8) =(5)+(7)
       =Mix of C3<N> and C2<N>
       =(Q0+Q1+Q2+Q3+Q4)/4

FIG. 56C

| (1)→(2) | Indicates charge amount of C3<N> when Q2 charge of C2<N>+C3<N> is redistributed with C3<N> |
| --- | --- |
| (3)→(4) | Attenuation by redistribution of Q3 charge of C3<N> with C3<N-1> |
| (5)→(9) | Mix C3<N> of (2) and C3<N> of (4), attenuate by charge redistribution with C3<N> |
| (6)→(7) | Attenuation by redistribution of Q4 charge of C2<N> and Q0 charge of PD with C2<N-1> |
| (8) | Mix C3<N> of (5) and C2<N> of (7) |

FIG. 62

| | Unit | Read1 (low-illuminance frame) PD<N> @ HCG readout | Read2 (middle-illuminance frame) C1<N> @ MCG readout | Read3 (high-illuminance frame) C2<N> @ LCG readout | C3<N> @ LCG readout |
|---|---|---|---|---|---|
| FD potential | Charge (ele) | Q0 | Q1 | $(Q0+Q1+Q4)/4$ | $(Q2+Q3)/4$ |
| | FD potential (V) | Q0/C0 | Q1/(C0+C1) | $(Q0+Q1+Q4)/(4\times(C0+C2))$ | $(Q2+Q3)/(4\times(C0+C3))$ |
| FD mixed potential | Total charge (ele) | Q0 | Q0+Q1 | $(Q0+Q1+Q2+Q3+Q4)/4$† | |
| | FD potential (V) | Q0/C0 | $(Q0+Q1)/(C0+C1)$ | $(Q0+Q1+Q2+Q3+Q4)/(4\times(C0+C1+C2+C3))$† | |
| | LSB | ADH = ADC × FD potential | ADM = ADC × FD potential | ADL = ADC × FD potential | |

ADC: quantization unit (LSB/mV)   M=(C2+C3)/C3=2

†M×2=4 since there are two attenuation operations
†Approximation also possible when C3, C2, C1 >> C0

FIG. 64

| Case No. | C3 (relative value) | C2 (relative value) | C1 (relative value) | Total (relative value) | Attenuation ratio M (dB) (1) (C2+C3) /C3 | C3-DR (dB)(3) | C2-DR (dB)(2) | Overall DR (dB) (4)=def +(2) | Advantageous effect (reduced area) | Advantageous effect (extended DR) |
|---|---|---|---|---|---|---|---|---|---|---|
| 0 | 2 | 2 | 1 | 5 | 6.0 | 0.0 | 0.0 | 120.0 | No implementation (def.) | No implementation (def.) |
| 1 | 1 | 1 | 1 | 3 | 6.0 | -6.0 | 0.0 *1 | 120.0 | ○ | Same |

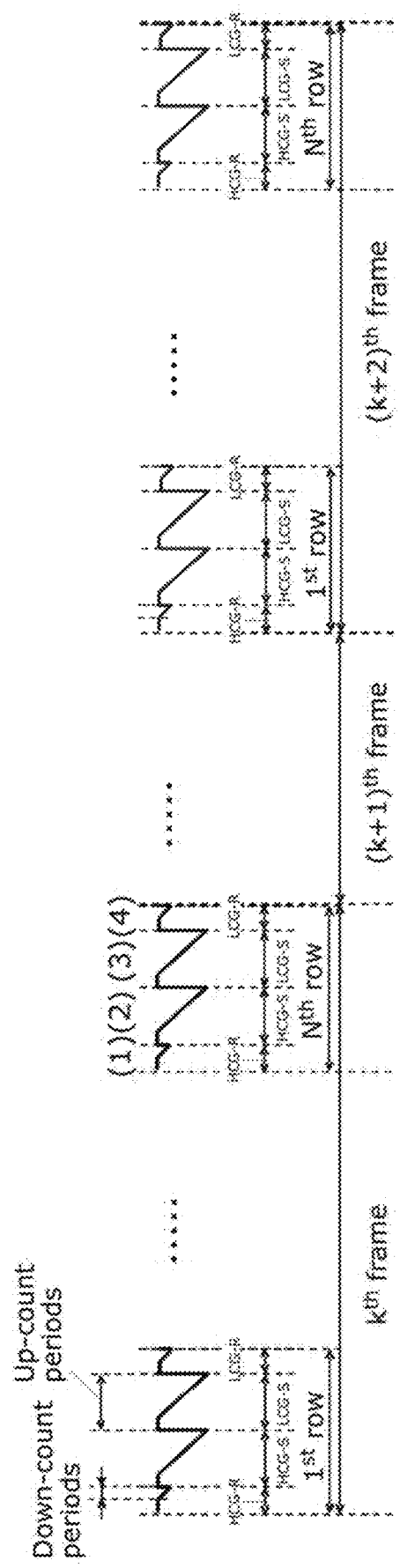

FIG. 67

| Unit | HCG readout | MCG readout | LCG readout |
|---|---|---|---|
| Reset component (down-count) | (1) | — | (4) |
| Signal component (up-count) | (2) | — | (3) |
| Reset component and signal component readout order: (1)→(2)→(3)→(4) | | | |

FIG. 70B

| (1) | C1 accumulation |
| (6) | C1<N>: Q1 |
| (7) | =mix of C1<N>+C1<N+1><br>= Q0+Q1 |
| (5) | =Attenuation by charge<br>redistribution of (7)<br>=(Q0+Q1)/M |

FIG. 70C

| (1)→(7) | Q1 charge of C1<N> becomes saturated in 1 V ((6)), then Q0 charge of PD is mixed, resulting in Q0+Q1 |
|---|---|
| (7)→(5) | Attenuated to C1<N> when Q0+Q1 charge of C1<N> is redistributed with C1<N-1> (attenuation ratio M=6 dB) |

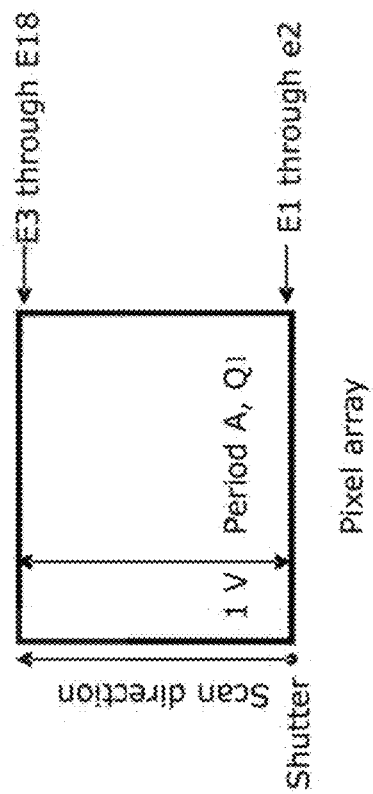

FIG. 76

| | Unit | Read1<br>Long frame (low-illuminance frame) | | Read2<br>Short frame (high-illuminance frame) |
|---|---|---|---|---|
| | | PD<N> @<br>HCG readout | <N> @ MCG<br>readout | C2<N> @ LCG<br>readout |
| FD potential | Charge (ele) | Q0 | — | (Q0+Q1)/M |
| | FD potential (V) | Q0/C0 | — | (Q0+Q1)/(M×(C0+C1)) |
| FD mixed potential | Total charge (ele) | Q0 | — | (Q0+Q1)/M |
| | FD potential (V) | Q0/C0 | — | (Q0+Q1)/(M×(C0+C1)) |
| | LSB | ADH =<br>ADC × FD potential | — | ADL=<br>ADC × FD potential<br>†Approximation also possible<br>when C1>>C0 |

ADC: quantization unit (LSB/mV)  M=(C1+C1)/C1=2

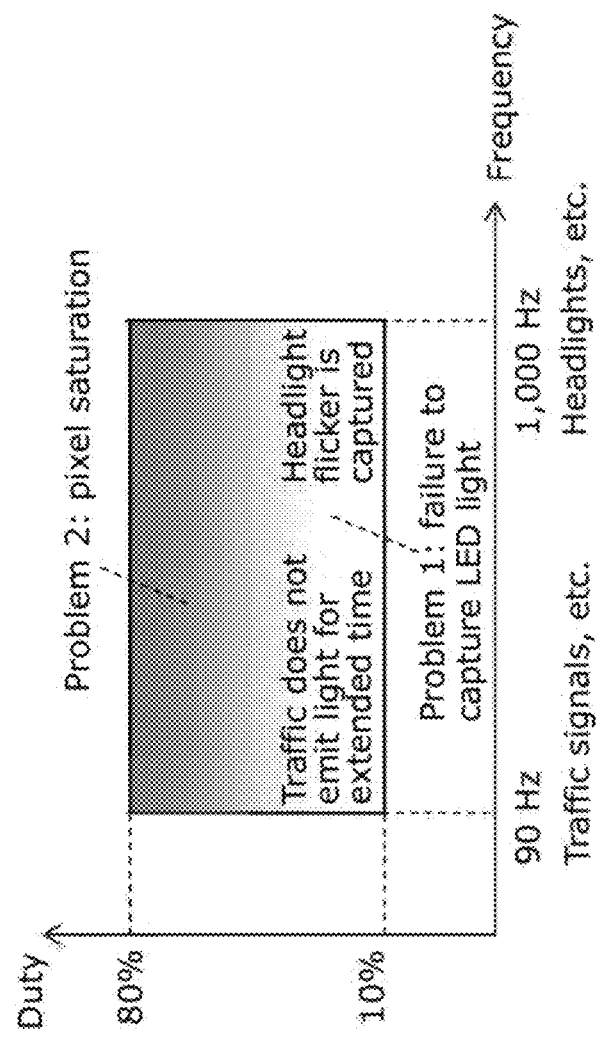

SOLID-STATE IMAGING APPARATUS AND IMAGING APPARATUS INCLUDING A PLURALITY OF OVERFLOW ELEMENTS AND STORAGE CAPACITIVE ELEMENTS

CROSS REFERENCE TO RELATED APPLICATIONS

This is a continuation application of PCT International Application No. PCT/JP2020/019359 filed on May 14, 2020, designating the United States of America, which is based on and claims priority of Japanese Patent Application No. 2019-103378 filed on May 31, 2019. The entire disclosures of the above-identified applications, including the specifications, drawings, and claims are incorporated herein by reference in their entirety.

FIELD

The present invention relates to a solid-state imaging apparatus and an imaging apparatus including the same.

BACKGROUND

For example, Patent Literature (PTL) 1 discloses a method for extending the dynamic range in a solid-state imaging apparatus. The solid-state imaging apparatus to which the method of PTL 1 is applied has a single-pixel architecture, and includes an overflow gate that transfers the charge that overflows from the photodiode and a storage capacitive element that accumulates the charge transferred by the overflow gate in response to an accumulation operation. The low-illuminance signal and the high-illuminance signal are combined to extend the dynamic range.

CITATION LIST

Patent Literature

PTL 1: Japanese Patent No. 4497366

SUMMARY

Technical Problem

Unfortunately, with PTL 1, it is not possible to both extend the dynamic range and mitigate flicker.

First, flicker mitigation will be described. In recent years, light-emitting diode light sources (LED light sources) and laser diode light sources (LD lights sources) have come into use. Such light sources often employ dynamic lighting whereby the light source repeatedly turns on and off at a rate so rapid it is undetectable by the naked eye. Stated differently, the light source flickers at a rapid rate that is undetectable by the naked eye. For example, in addition to luminaires, LED light sources are used in traffic lights, vehicle headlights, and vehicle brake lights.

With dynamic light emission, although a light source appears to be continuously on to the naked eye, the flickering affects solid-state imaging apparatuses. When the solid-state imaging apparatus captures an image of such a light source or captures an image of an environment in which such a light source is used, the image may be an image in which the light source is emitting light (or a bright image) or an image in which the light source is not emitting light (or a dark image). In other words, the flickering of the light source is captured in the images. The capturing of the latter image, i.e., the capturing of an image in which the light source is not emitting light (or a dark image), can be said to be substandard capturing. The mitigation of such substandard capturing resulting from light source flicker is referred to as flicker mitigation.

With the configuration according to PTL 1, since the dynamic range is insufficient, the exposure time can be extended when performing low-illuminance capturing, but that requires the exposure time when performing high-Illuminance capturing to be shortened.

As a result, the exposure time when performing high-illuminance capturing becomes so short that it prohibits all flicker signals from being captured and thus flicker cannot be mitigated. Similarly, even when a chopping method that chops up the exposure time in 1 V period (1 vertical scan line period) or 1 H period (1 horizontal scan line period) is used to achieve as uniform exposure as possible, all flicker signals still cannot be captured and thus flicker cannot be mitigated.

Conversely, flicker signals can be mitigated if the exposure time is extended, but the pixel becomes saturated and the dynamic range narrows, reducing image quality.

In view of this, the present disclosure provides a solid-state imaging apparatus and an imaging apparatus capable of both extending the dynamic range and mitigating flicker.

Solution to Problem

In order to overcome above-described problems, a solid-state imaging apparatus according to the present disclosure includes: a photodiode that generates a signal charge dependent on an amount of light received; an overflow element group that accumulates a signal charge that overflows from the photodiode; and a floating diffusion layer that selectively holds a signal charge transferred from the photodiode and a signal charge transferred from the overflow element group. The overflow element group comprises m (m≥2) groups connected in series in stages, each group comprising an overflow element and a storage capacitive element. An overflow element among the groups transfers, to the storage capacitive element included in a same group as the overflow element, a signal charge that overflows from the photodiode or a signal charge from an upstream storage capacitive element among the groups.

Advantageous Effects

With the solid-state imaging apparatus and the Imaging apparatus according to the present disclosure, it is possible to both expand the dynamic range and mitigate flicker.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 8 is a time chart of a few frames illustrating an example of signal readout operations that accompany n exposure operations of the solid-state imaging apparatus, which form the basis of Embodiment 1.

FIG. 11 illustrates pixel signal readout order in CDS in 1 H period.

FIG. 15B is for explaining each point in FIG. 15A.

FIG. 15C is for explaining each point in FIG. 15A.

FIG. 22 illustrates signal charge amount and FD potential at Read1, which is the first readout of a low-illuminance frame, and Read2, which is the second readout of a high-illuminance frame.

FIG. 23 illustrates advantageous effects achieved by an embodiment, namely storage capacitive element surface area reduction and dynamic range extension.

FIG. 26 illustrates pixel signal readout order in CDS in 1 H period.

FIG. 28C is a continuation from FIG. 28B illustrating potentials at main points in FIG. 27.

FIG. 29B is for explaining each point in FIG. 29A.

FIG. 35 illustrates signal charge amount and FD potential at Read1, which is the first readout of a low-illuminance frame, Read2, which is the second readout of a middle-illuminance frame, and Read3, which is the third readout of a high-illuminance frame.

FIG. 37 illustrates advantageous effects achieved by an embodiment, namely storage capacitive element surface area reduction and dynamic range extension.

FIG. 39 illustrates pixel signal readout order in CDS in 1 H period according to Embodiment 3.

FIG. 40A is a time chart illustrating an example of pixel readout operations accompanied by gain control according to Embodiment 3.

FIG. 41A is an explanatory diagram illustrating the concept of pixel mixing.

FIG. 41B is for explaining each point in FIG. 41A.

FIG. 41C is for explaining each point in FIG. 41A.

FIG. 48 illustrates signal charge amount and FD potential at Read1, which is the first readout of a low-illuminance frame, and Read2, which is the second readout of a high-illuminance frame.

FIG. 50 illustrates advantageous effects achieved by an embodiment, namely storage capacitive element surface area reduction and dynamic range extension.

FIG. 53 illustrates pixel signal readout order in CDS in 1 H period.

FIG. 56B is for explaining each point in FIG. 56A.

FIG. 56C is for explaining each point in FIG. 56A.

FIG. 62 illustrates signal charge amount and FD potential at Read1, which is the first readout of a low-illuminance frame, Read2, which is the second readout of a middle-illuminance frame, and Read3, which is the third readout of a high-illuminance frame.

FIG. 64 illustrates advantageous effects achieved by an embodiment, namely storage capacitive element surface area reduction and dynamic range extension.

FIG. 66 illustrates the order in which a few frames are read out in Embodiment 5.

FIG. 67 illustrates pixel signal readout order in CDS in 1 H period.

FIG. 70B is for explaining each point in FIG. 70A.

FIG. 70C is for explaining each point in FIG. 70A.

FIG. 71 is an explanatory diagram of the scan periods in FIG. 70A.

FIG. 76 illustrates signal charge amount and FD potential at Read1, which is the first readout of a low-illuminance frame, and Read2, which is the second readout of a high-illuminance frame.

FIG. 82 is an explanatory diagram for explaining LED flicker.

DESCRIPTION OF EMBODIMENTS

Figure 1:
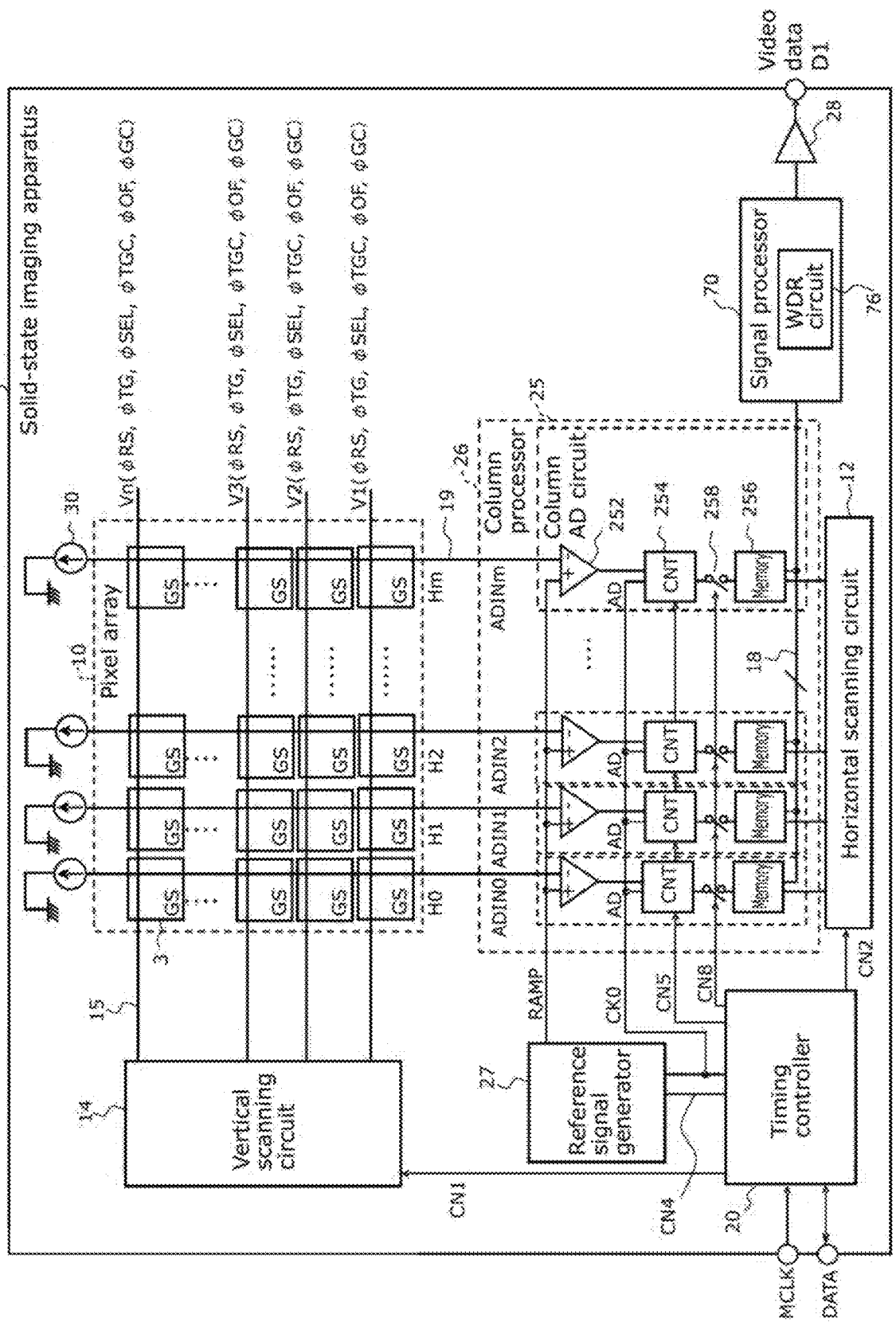
FIG. 1 is a diagram illustrating an example of a configuration of a solid-state imaging apparatus according to Embodiment 1.

Underlying Knowledge Forming Basis of an Aspect of the Present Disclosure

First, the issues mentioned in the Summary section above will be explained with reference to FIG. 82.

FIG. 82 is an explanatory diagram for explaining LED flicker. Flicker frequency, i.e., frequency in one on-off cycle of the LED, is represented on the vertical axis in the same figure. Flicker duty, i.e., the percentage of time that the LED is on in a single on-off cycle, is represented on the horizontal axis. For example, the flicker frequency of a traffic signal is approximately 90 Hz while the flicker frequency of a vehicle headlight is approximately 1000 Hz.

The first problem is the failure to capture LED light (light emission in which the light source is repeatedly turned on and off; pulsed light) (Problem 1). This problem is caused by a mismatch in rolling shutter exposure timing and LED emission timing, particularly when the exposure time is short in bright conditions (Cause 1).

The second problem is pixel saturation (Problem 2). This problem is caused by the pixel reaching its saturation level and disrupting the white balance when the duty of the LED flicker is high or the exposure time is long (Cause 2).

Problem 1 and Problem 2 are addressed by increasing the pixel saturation level to increase the saturation/sensitivity ratio and extend the dynamic range.

This makes it possible to, when capturing images of transport equipment (one example being an automobile) using a solid-state imaging apparatus, individually set parameters for mitigating flicker and achieving a wide dynamic range function (WDR function), and realize both at the same time.

First, overflow element groups connected in series in multiple stages (m≥2) are provided. Each group includes an overflow element (OF) and a storage capacitive element (C). Accordingly, overflow elements (OF1 through OF(m)) and storage capacitive elements (C1 through C(m)) are provided.

During the exposure period, the charge that overflows from a photodiode is accumulated in a storage capacitive element via an overflow element. The charge that overflows from this storage capacitive element is further accumulated in a storage capacitive element via an overflow element. The signal charge accumulated in the storage capacitive element is then redistributed and attenuated during the exposure period.

This embodiment makes it possible to reduce the size of the storage capacitive element while maintaining a high-sensitivity pixel, that is to say, the saturation level can be increased without sacrificing sensitivity.

With such a method, for example, by using a high-sensitivity pixel to perform low-illuminance capturing, the gain within the pixel may be increased to increase the voltage (pixel signal) that is dependent on the amount of light received, relative to noise generated by the pixel amplification transistor or analog circuits. In other words, for dark subjects, this enables the output of high-quality images with a high signal to noise ratio (SN).

On the other hand, by reducing the gain within the pixel by using a high-saturation pixel having a high saturation/sensitivity ratio to perform high-illuminance capturing, the dynamic range can be extended and a long exposure time can be used. In other words, for bright subjects, it is possible to output images which accurately reproduce gradients of a subject without blown out highlights and furthermore mitigate flicker.

In search for a technique for extending the dynamic range and mitigating flicker, the inventors arrived at a solid-state imaging apparatus and the like that achieves both high-image quality in low-illuminance capturing and dynamic range extension and flicker mitigation in high-illuminance capturing, by using a high-saturation pixel having a high saturation/sensitivity ratio.

With this, all flicker signals can be captured "completely" without failure to capture even slight flicker signals.

Furthermore, the three frames—the long exposure frame, the middle exposure frame, and the short exposure frame—that are combined to achieve a WDR are captured at exactly the same time using exactly the same pixels, which eliminates false colors, coloring, and blur.

Conventionally, the long exposure is used for low illuminance by extending the exposure time, the middle exposure is used for middle illuminance by using a medium exposure time, and the short exposure is used for high illuminance by shortening the exposure time, but in the embodiments of the present disclosure, fundamentally, all of the frames have the same exposure time. In other words, in the present specification, the terms long, middle, and short do not refer to differences in exposure time length. Accordingly, in the present specification, long exposure is defined as an exposure for low illuminance, middle exposure is defined as an exposure for middle illuminance, and short exposure is defined as an exposure for high illuminance.

Hereinafter, a solid-state imaging apparatus according to embodiments for implementing the present disclosure will be described with reference to the drawings.

Generally, use of a high-saturation pixel is extremely difficult, but the embodiments of the present disclosure make it possible to increase the saturation level using few storage capacitive elements. Accumulated charge is expressed as Q=CV=(εd/S)×(d/s). Increasing the accumulated charge requires a three-dimensional or multi-layer structure to increase the voltage swing across capacitor terminals or increase capacitor surface area in limited pixel cells.

Since the contact or plug parts for connecting wiring to the silicon substrate are sources of dark characteristics (dark current, noise, fixed pattern noise), measures to address these characteristics and measures to maintain reliability need to be taken.

Embodiment 1

First, an example of a configuration of the solid-state imaging apparatus according to the present embodiment will be given.

[1.1 Solid-state Imaging Apparatus 100 Configuration Example]

FIG. 1 is a block diagram illustrating an example of a configuration of solid-state imaging apparatus 100 according to Embodiment 1.

Solid-state Imaging apparatus 100 illustrated in the same figure includes pixel array 10, horizontal scanning circuit 12, vertical scanning circuit 14, a plurality of vertical signal lines 19, timing controller 20, column processor 26, reference signal generator 27, output circuit 28, and signal processor 70. Solid-state imaging apparatus 100 further includes a MCLK terminal that receives an input of a master clock signal from an external component, a DATA terminal for transmitting and receiving a command or data to and from an external component, and a D1 terminal for transmitting video data to an external component, and still further includes other sorts of terminals to which power supply voltage and ground voltage are supplied.

Pixel array 10 includes a plurality of pixel circuits 3 arranged in a matrix. In FIG. 1, the plurality of pixel circuits 3 are arranged in n rows and m columns. Each pixel circuit 3 includes a high-sensitivity pixel, a storage capacitive element, and an overflow element. Note than an overflow element is also referred to as an overflow gate.

Horizontal scanning circuit 12 outputs AD converted pixel signals to horizontal signal line 18 by sequentially scanning memories 256 in the plurality of column AD circuits 25. This scanning may be performed in the order of alignment of column AD circuits 25.

Vertical scanning circuit 14 scans, row by row, horizontal scan line groups (also referred to as a "row control line groups") 15 provided for each row of pixel circuits 3 in pixel array 10. With this, vertical scanning circuit 14 selects pixel circuits 3 row by row, and concurrently outputs pixel signals from pixel circuits 3 belonging to the selected row to m vertical signal lines 19. The number of horizontal scan line groups 15 provided is the same as the number of pixel circuits 3 provided. In FIG. 1, n horizontal scan line groups 15 (V1, V2, . . . , Vn in FIG. 1) are provided. Each horizontal scan line group 15 includes reset control line φRS, storage charge transfer control lines φTGC1, φTGC2, and φTGC3, gain control lines φGC1 and φGC2, selection control line φSEL, and overflow control lines φOF1, φOF2, and φOF3.

A vertical signal line 19 is provided for each column of pixel circuits 3 in pixel array 10, and transmits pixel signals from pixel circuits 3 belonging to the selected row to column AD circuit 25. In FIG. 1, the plurality of vertical signal lines 19 comprise m vertical signal lines H1 through Hm. In FIG. 1, the plurality of ADC input lines comprise m ADC input lines ADIN1 through ADINm.

Timing controller 20 controls the entire solid-state imaging apparatus 100 by generating various groups of control signals. The various groups of control signals include control signal groups CN1, CN2, CN4, CN5, and CN8, and counter clock signal CK0. For example, timing controller 20 receives master clock MCLK via a terminal, generates various internal clocks, and controls horizontal scanning circuit 12 and vertical scanning circuit 14 and the like.

Column processor 26 includes a column AD circuit 25 for each column. Each column AD circuit 25 AD converts pixel signals from vertical signal line 19.

Each column AD circuit 25 includes voltage comparator 252, counter 254, and memory 256.

Voltage comparator 252 compares an analog pixel signal from vertical signal line 19 and reference signal RAMP that is generated by reference signal generator 27 and includes a ramp waveform (i.e., a triangular wave), and, for example, when the former exceeds the latter, inverts an output signal indicating the comparison result.

Counter 254 counts time from a start of a change in the triangular wave of reference signal RAMP until the output signal from voltage comparator 252 is inverted. Since the time until the inversion is defined according to the value of an analog pixel signal, the count value is a value of a digitized pixel signal.

Memory 256 holds count values of counter 254, i.e., digital pixel signals.

Reference signal generator 27 generates reference signal RAMP including a triangular wave, and outputs reference signal RAMP to the positive input terminal of voltage comparator 252 in each column AD circuit 25.

Output circuit 28 outputs digital pixel signals to video data terminal D1.

Signal processor 70 includes WDR circuit 76, and combines a low-illuminance signal, a middle-illuminance signal, and a high-illuminance signal. With this, signal processor 70 both increases the dynamic range and mitigates flicker.

[1.2 Pixel Circuit Configuration Example]

Next, an example of a configuration of pixel circuit 3 will be described.

Figure 2:
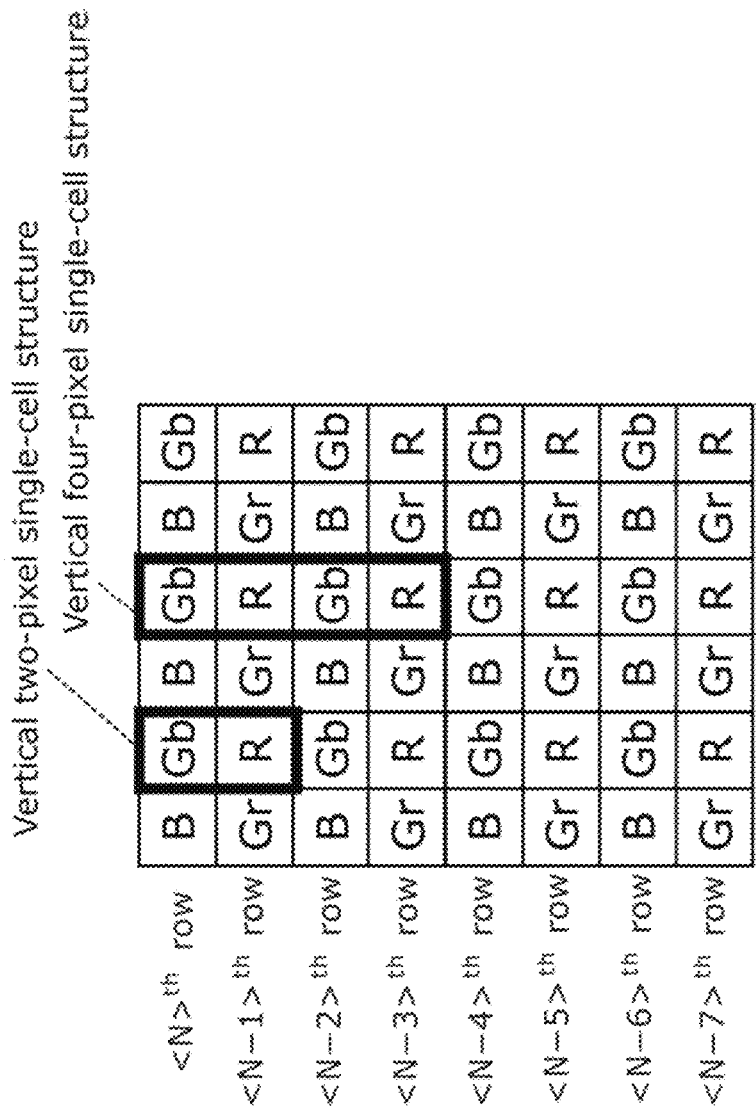
FIG. 2 is an explanatory diagram illustrating an example of multi-pixel single-cell structures in a Bayer matrix of RGB pixels according to Embodiment 1.
Figure 3A:
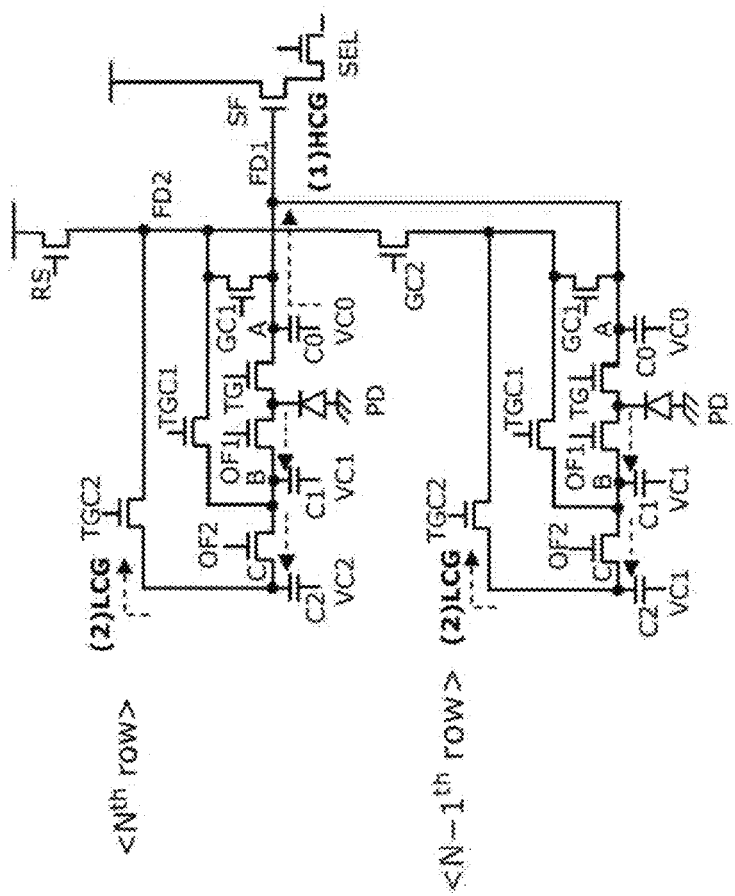
FIG. 3A illustrates an example of a circuit configuration of the vertical two-pixel single-cell structure illustrated in FIG. 2.
Figure 3B:
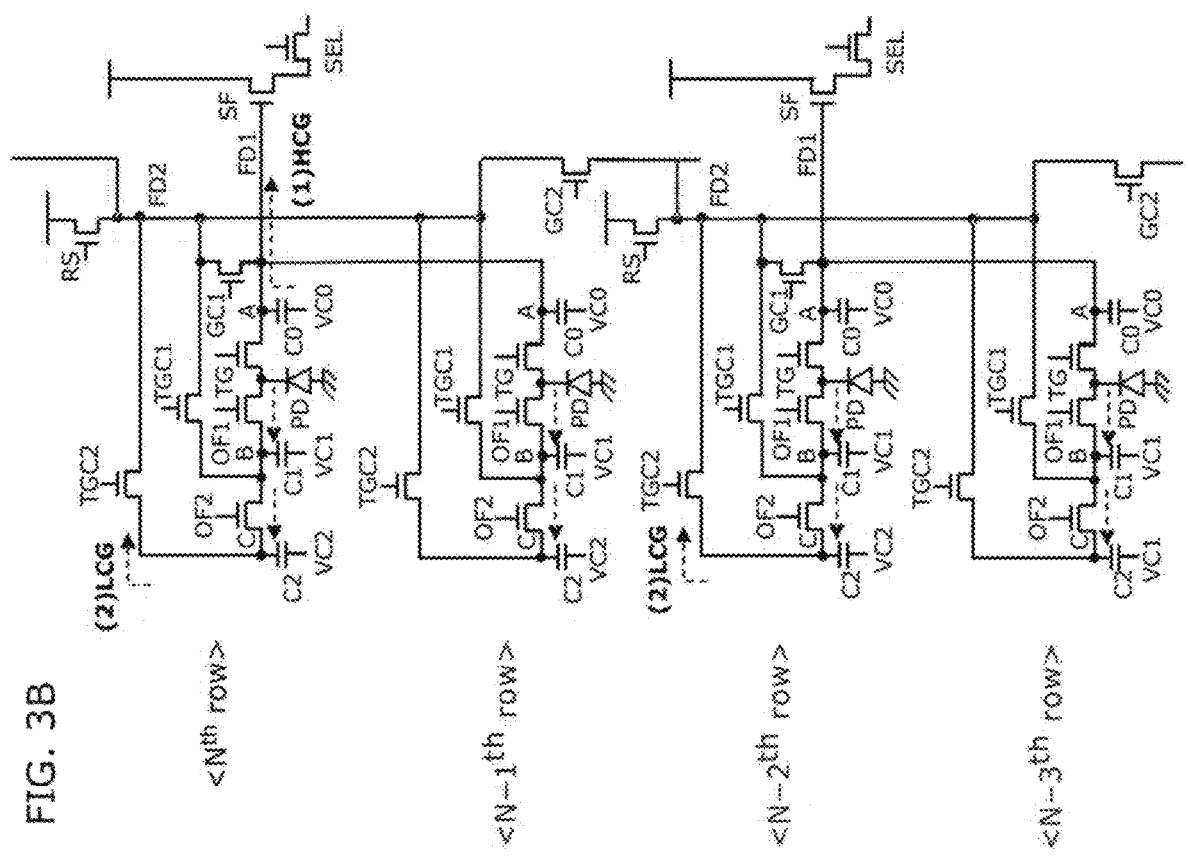
FIG. 3B illustrates an example of a circuit configuration of the vertical four-pixel single-cell structure illustrated in FIG. 2.

FIG. 2 is an explanatory diagram illustrating an example of multi-pixel single-cell structures in a Bayer matrix of RGB pixels according to Embodiment 1. FIG. 3A illustrates an example of a circuit configuration of the vertical two-pixel single-cell structure illustrated in FIG. 2. FIG. 3B illustrates an example of a circuit configuration of the vertical four-pixel single-cell structure illustrated in FIG. 2.

FIG. 3A and FIG. 3B illustrate circuit examples of pixel circuit 3 according to Embodiment 1. Pixel circuit 3 in the same figures includes photodiode PD, transfer transistor TG, overflow gate OF1, storage capacitive element C1, storage transfer transistor TGC1, overflow gate OF2, storage capacitive element C2, storage transfer transistor TGC2, floating diffusion layer FD1, parasitic capacitor C0, floating diffusion layer FD2, reset transistor RS, gain control transistor GC1, gain control transistor GC2, amplification transistor SF, and selection transistor SEL.

Horizontal scan line group 15 includes reset control line φRS, readout control lines φTG, φTGC1, and φTGC2, gain control lines φGC1 and φGC2, selection control line φSEL, overflow control line φOF1, and overflow control lines φOF2.

Photodiode PD is a photoelectric conversion element, such as photodiode, that performs photoelectric conversion at a given sensitivity, that is to say, generates a charge dependent on the amount of light received.

When the pixel cells are reduced in size or when the dynamic range is increased, the area of the aperture of photodiode PD can be increased by providing the MIM capacitor or MOS capacitor on the wiring layer of photodiode PD, which is on the opposite side of the light receiving side. It is also possible to provide the trench capacitor inside the cell.

Solid-state imaging apparatus 100 can also be configured as a stacked-structure back-side illumination image sensor.

Figure 4:
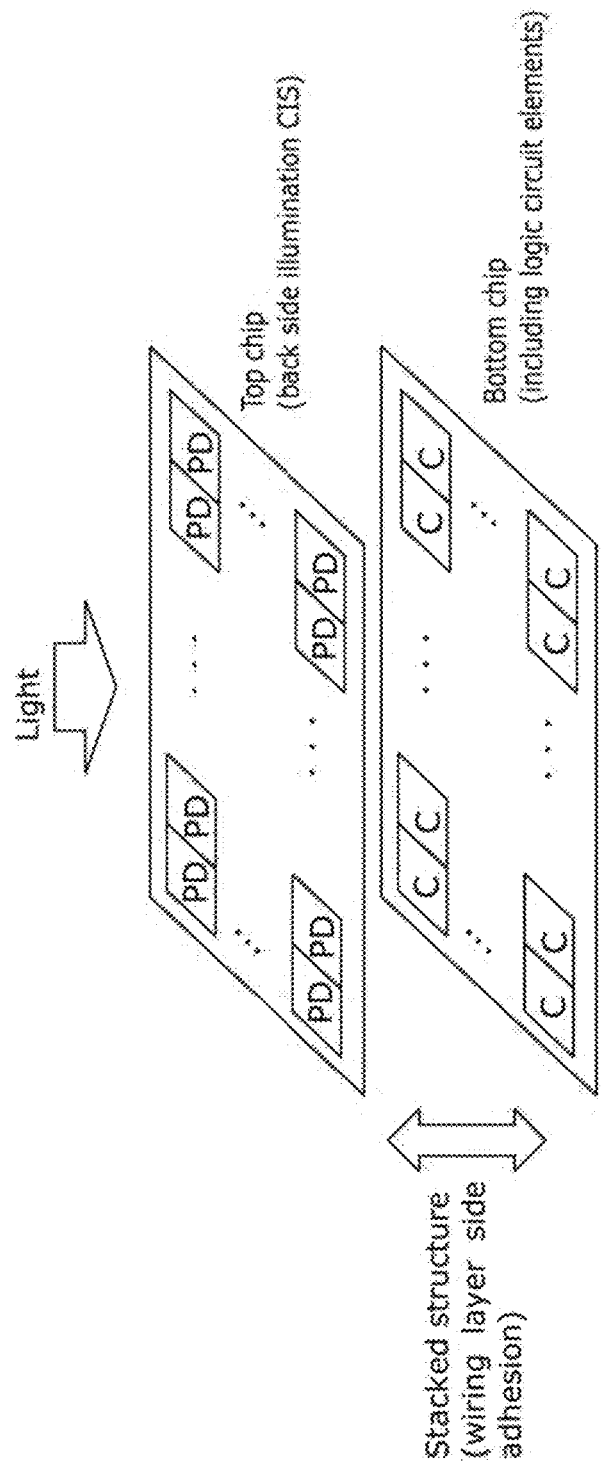
FIG. 4 illustrates an example of the solid-state imaging apparatus according to Embodiment 1 configured as a stacked-structure back-side illumination image sensor.

FIG. 4 illustrates an example of the solid-state imaging apparatus according to Embodiment 1 configured as a stacked-structure back-side illumination image sensor. As illustrated in FIG. 4, when the solid-state imaging apparatus according to Embodiment 1 is configured as a stacked-structure back-side illumination (BSI) CIS in which a storage capacitive element is mounted on the wiring layer side of the pixel chip (top chip) and a storage capacitive element is provided on the uppermost layer on the wiring layer of the logic chip (bottom chip), and the solid-state Imaging apparatus is put together in this state, the pixels are bonded pixel-to-pixel, but there is no need to increase pixel area, thereby inhibiting an increase in chip area.

Moreover, capacitor C0 connected to floating diffusion layer FD holds a signal charge (for example, electrons) transferred from photodiode PD, converts the held signal charge into voltage, and supplies the voltage resulting from the conversion to the gate of amplification transistor SF. Practically speaking, the capacitance of floating diffusion layer FD is not only the capacitance of floating diffusion layer FD itself, but also includes the gate capacitance of amplification transistor SF, the gate-drain capacitance of amplification transistor SF, and the floating capacitance of the drain wiring of gain control transistor GC1 when gain control transistor GC1 is on.

Transfer transistor TG is a switching transistor that turns on and off according to readout control signal φTG. When readout control signal φTG is high-level, transfer transistor TG transfers the signal charge resulting from photoelectric conversion by photodiode PD to floating diffusion layer FD.

Overflow gate OF1 is used both as an overflow gate and a switching transistor that turns on and off according to readout control signal φOF1. When readout control signal φOF1 is high-level, the signal charge resulting from photoelectric conversion by photodiode PD is transferred to storage capacitive element C1 via overflow gate OF1.

When the signal charge resulting from photoelectric conversion by photodiode PD overflows, the signal charge is transferred to storage capacitive element C1 by adjusting the control voltage of overflow gate OF1. Alternatively, the signal charge is transferred when the signal charge exceeds a preset potential.

Overflow gate OF2 can be designed to be used as both an overflow gate and a switching transistor capable of charge redistribution by switching readout control signal φOF2 on/off. When readout control signal φOF2 is high-level, the signal charge resulting from photoelectric conversion by photodiode PD is transferred to storage capacitive element C2 via overflow gate OF2.

The signal charge resulting from photoelectric conversion is transferred to storage capacitive element C2 by adjusting the control voltage of overflow gate OF2 when the signal charge overflows from storage capacitive element C1. Alternatively, storage capacitive element C2 transfers the signal charge when the signal charge exceeds a preset potential.

Note that the charge of C2 when charge redistribution is performed by switching readout control signal φOF2 on/off attenuates by a factor of 1/M. Attenuation ratio M is determined by (C1+C2)/C2.

Reset transistor RS is a switching transistor that turns on and off according to reset control signal φRS. When reset control signal φRS is high-level, reset transistor RS sets, via gain control transistor GC1, floating diffusion layer FD to the power supply voltage applied to the drain to floating diffusion layer FD as a reset level. In other words, when reset control signal φRS is high-level, reset transistor RS resets floating diffusion layer FD to the reset level.

Gain control transistor GC1 electrically disconnects or connects floating diffusion layer FD1 and floating diffusion layer FD2 according to gain control signal φGC1. This changes the conversion gain at which the signal charge in floating diffusion layer FD1 is converted into voltage. In other words, in the transferring of the signal charge from photodiode PD to floating diffusion layer FD1, the conversion gain of floating diffusion layer FD can be increased further if gain control transistor GC1 is turned off.

Gain control transistor GC2 electrically disconnects or connects floating diffusion layer FD2 in this vertical two-pixel single-cell structure according to gain control signal φGC2. This changes the conversion gain at which the signal charge in floating diffusion layer FD2 is converted into voltage. In other words, in the transferring of the signal charge from photodiode PD to floating diffusion layer FD2, the conversion gain of floating diffusion layer FD can be decreased further if gain control transistor GC2 is turned on.

With this, the transferring of the charge of an adjacent row, that is to say, the charge that passes through storage transfer transistor TGC1 and storage transfer transistor TGC2 can be switched on/off, thereby enabling charge redistribution.

Amplification transistor SF forms a source follower paired together with load current supply 30 connected to vertical signal line 19, and outputs the voltage of the gate, that is to say, the voltage of floating diffusion layer FD to vertical signal line 19 as an analog pixel signal.

Selection transistor SEL is a switching transistor that turns on and off according to selection control signal φSEL. Selection transistor SEL electrically connects the source of amplification transistor SF and vertical signal line 19 when selection control signal φSEL is high-level.

[1.3 Improvement of Characteristics by Use of a Poly Plug]

Next, an example of a cross sectional configuration of a pixel when solid-state imaging apparatus 100 is configured as a stacked-structure back-side illumination image sensor like in FIG. 4 will be described.

Figure 5A:
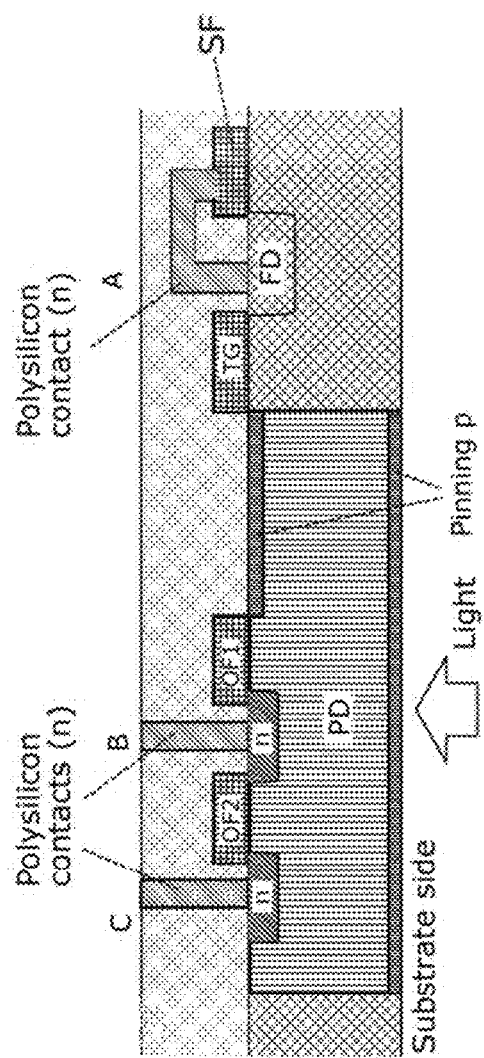
FIG. 5A illustrates an example of a cross sectional structure of a pixel in the stacked-structure back-side illumination image sensor according to Embodiment 1 that is illustrated in FIG. 4.
Figure 5B:
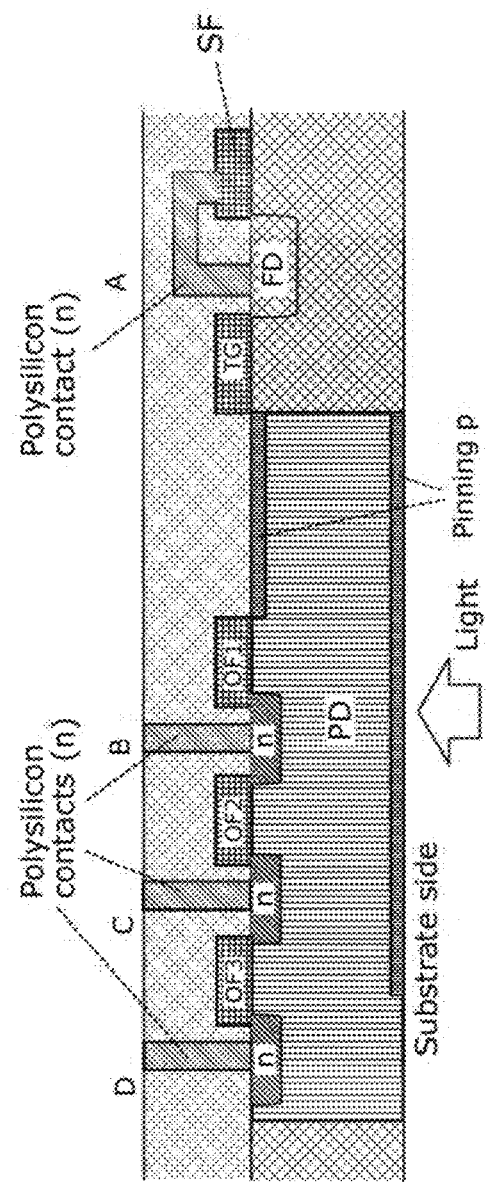
FIG. 5B illustrates an example of a cross sectional structure of a pixel in a stacked-structure back-side illumination image sensor implemented as the solid-state imaging apparatus according to Embodiment 2.

FIG. 5A illustrates an example of a cross sectional structure of a pixel in the stacked-structure back-side illumination image sensor according to Embodiment 1 that is illustrated in FIG. 4. FIG. 5B illustrates an example of a cross sectional structure of a pixel in a stacked-structure back-side illumination image sensor implemented as the solid-state imaging apparatus according to Embodiment 2 to be described later.

Typically, when a usual contact is used for the contact between wiring at one end of a metal insulator metal (MIM) capacitor or a metal oxide semiconductor (MOS) capacitor and the substrate, damage is incurred when forming the contact part, and dark characteristics (dark current, noise, fixed pattern noise) become problematic.

However, as illustrated in FIG. 5A and FIG. 5B, when a poly plug that employs polysilicon wiring rather than metal wiring is used for the wiring that connects one end of the MIM capacitor or the MOS capacitor to the substrate, damage to the connection part is reduced, and dark characteristics (dark current, noise, fixed pattern noise) can be inhibited.

Furthermore, when a poly plug (polysilicon contact (n)) that employs polysilicon wiring rather than metal wiring is used for the wiring that connects one end of the gate wiring of amplification transistor SF to the substrate, damage to the connection part is reduced, and dark characteristics (dark current, noise, fixed pattern noise) can be inhibited.

Moreover, when the potentials (A, B, C) of the plug parts that accumulate signal charge (negative charge) and form the capacitive element are high relative to GND, dark characteristics (dark current, noise, fixed pattern noise) increase. Accordingly, it is possible to improve dark characteristics by setting the potentials (VC1, VC2, VC3) on the reverse side of the storage capacitive element to an intermediate potential during exposure. Here, the intermediate potential is a potential between GND and the pixel potential.

Here, since characteristics differ on the positive and negative sides of the capacitive element, one needs to be adequately cautious of the influence this has on reliability (time dependent dielectric breakdown (TDDB)).

Figure 6A:
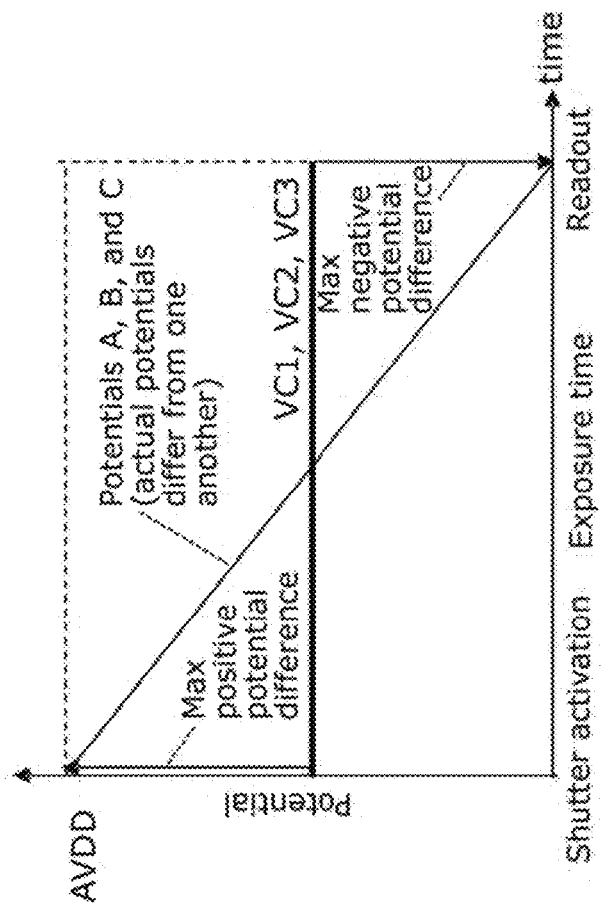
FIG. 6A illustrates an example of changes in potentials of a storage capacitive element according to exposure time.
Figure 6B:
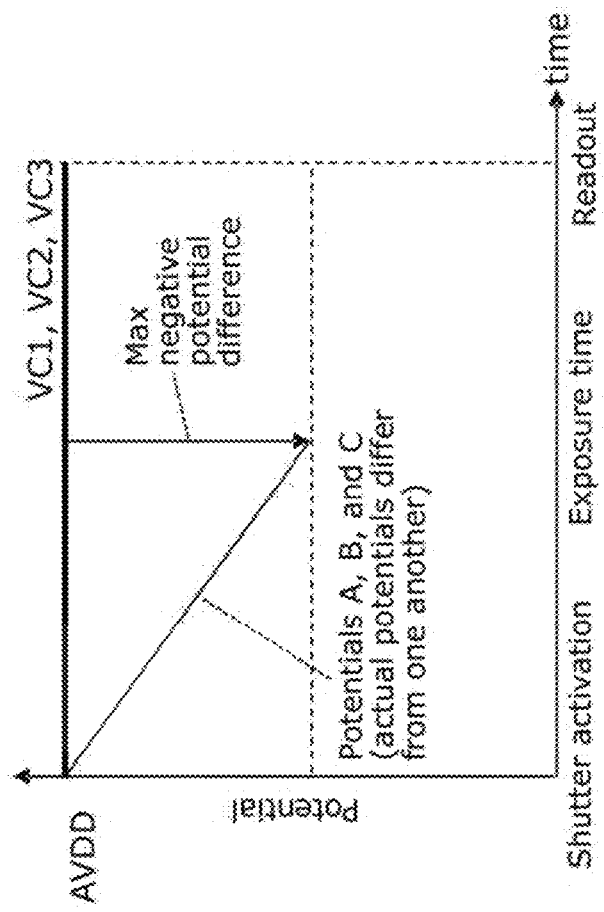
FIG. 6B illustrates another example of changes in potentials of the storage capacitive element according to exposure time.

FIG. 6A illustrates an example of changes in potentials of the storage capacitive element according to exposure time. FIG. 6B illustrates another example of changes in potentials of the storage capacitive element according to exposure time. Exposure time is represented on the horizontal axis. Potential is represented on the vertical axis.

FIG. 6B illustrates a case in which only the negative side of the storage capacitive element is used. Potentials VC1, VC2, and VC3 on one side of the storage capacitive element are pixel potentials upon activation of the shutter, potentials A, B, and C of the storage capacitive element are also pixel potentials upon activation of the shutter, and the potential differences between terminals (A-VC1, B-VC2, and C-VC3) become negative and widen with accumulation time.

In this case, since only one of the positive and the negative potential differences of the storage capacitive element can be used, amplitude decreases and dynamic range narrows. Moreover, since potentials A, B, and C are high, dark current tends to be unfavorable.

FIG. 6A illustrates a case in which the positive side and the negative side of the storage capacitive element are used. Potentials VC1, VC2, and VC3 on one side of the storage capacitive element are intermediate potentials upon activation of the shutter, potentials A, B, and C of the storage capacitive element are pixel potentials upon activation of the shutter, and potential differences between terminals (A-VC1, B-VC2, and C-VC3) start off positive and gradually become negative and increase.

In this case, since both the positive and negative potential differences of the storage capacitive element can be used, the amplitude and the dynamic range can be increased twice as much as in FIG. 6B. Moreover, since potentials A, B, and C are low, dark current is favorable.

With the method illustrated in FIG. 6B, since analog gain can be increased and the potentials of VC1, VC2, and VC3 on one side of the storage capacitive element can be further decreased, it is possible to inhibit the worsening of the dark characteristics of the potentials (A, B, and C) of the plug parts.

Figure 7A:
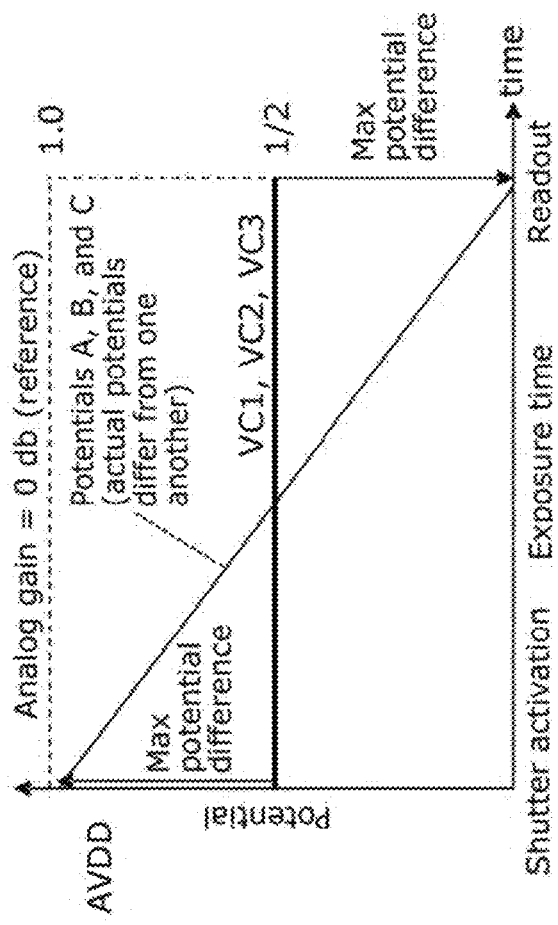
FIG. 7A illustrates changes in potentials of plug parts of the storage capacitive element according to exposure time when the analog gain is 0 dB.
Figure 7B:
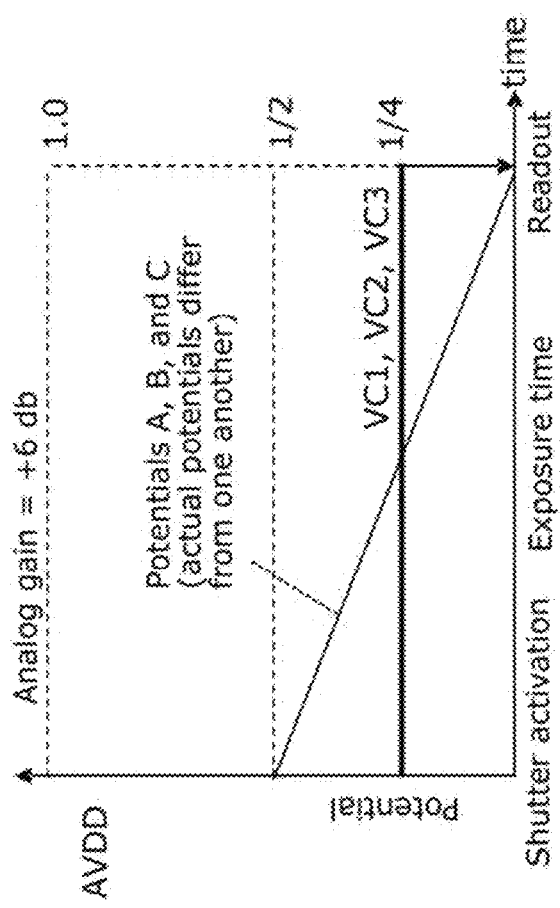
FIG. 7B illustrates changes in potentials of the plug parts of the storage capacitive element according to exposure time when the analog gain is 6 dB.
Figure 7C:
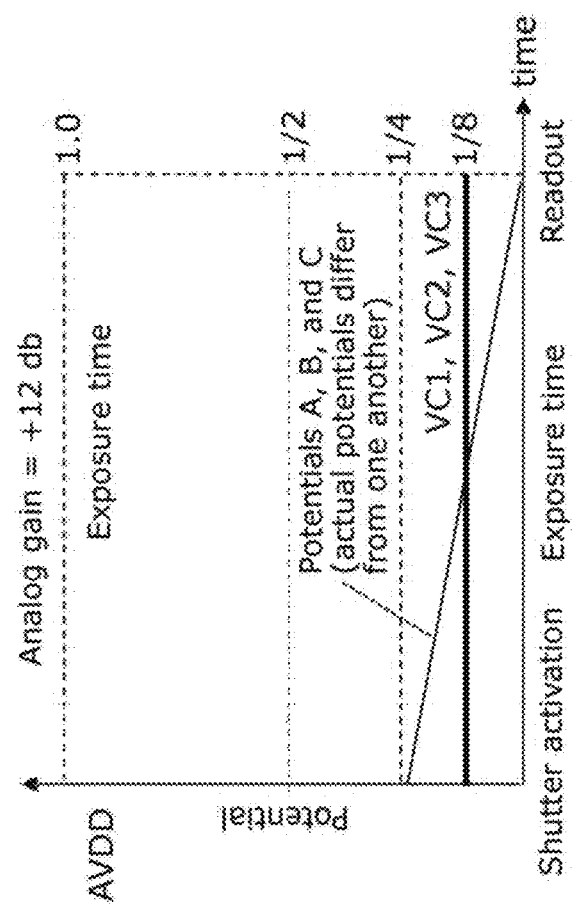
FIG. 7C illustrates changes in potentials of plug parts of the storage capacitive element according to exposure time when the analog gain is 12 dB.

FIG. 7A, FIG. 7B, and FIG. 7C illustrate changes in potentials of the plug parts of the storage capacitive element according to exposure time when the analog gain is 0 dB, 6 dB, and 12 dB, respectively.

For example, when the analog gain (representing potential differences of A, B, and C at RAMP signal amplitude) is 0 dB as in FIG. 7A, +6 dB as in FIG. 7B, and +12 dB as in FIG. 7C, the potentials (VC1, VC2, and VC3) of the plug parts of the storage capacitive element may be linked to the gain, and set to ½ V, ¼ V, and ⅛ V as illustrated in the respective figures.

In FIG. 7A, the potential of each of VC1, VC2, and VC3 upon activation of the shutter is ½ V, and by setting each of potentials A, B, and C to 0 dB (in comparison to a reference), dark current improves since the potentials of A, B, C decrease (in comparison with FIG. 7B).

In FIG. 7B, the potential of each of VC1, VC2, and VC3 upon activation of the shutter is ¼ V, and by setting each of potentials A, B, and C to −6 dB (in comparison to a reference), dark current improves since the potentials of A, B, C decrease.

In FIG. 7C, the potential of each of VC1, VC2, and VC3 upon activation of the shutter is ⅛ V, and by setting each of potentials A, B, and C to −12 dB (in comparison to a reference), dark current improves since the potentials of A, B, C decrease.

[1.4 Example of Readout Operation by Correlated Double Sampling Forming Basis of Embodiment]

Next, an operation of reading out and correlated-double sampling a reset level and a signal level of an analog pixel signal will be described.

FIG. 8 is a time chart of a few frames illustrating an example of signal readout operations that accompany n exposure operations of solid-state imaging apparatus 100, which form the basis of Embodiment 1.

Figure 9:
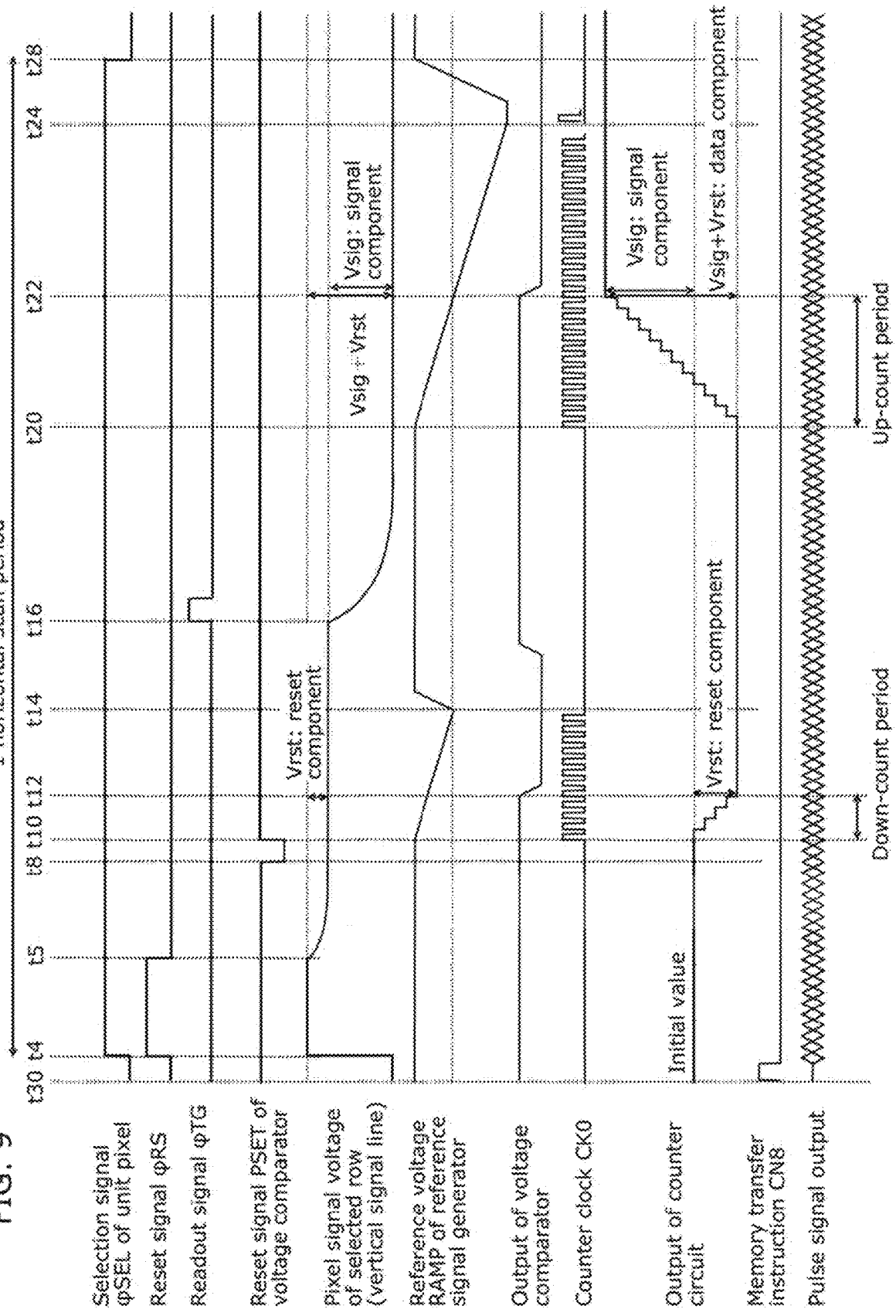
FIG. 9 is a time chart of 1 H (1 horizontal period) illustrating an example of signal readout operations that accompany one exposure operation of the solid-state imaging apparatus, which form the basis of Embodiment 1.

FIG. 9 is a time chart of 1 H (1 horizontal period) illustrating an example of signal readout operations that accompany one exposure operation of solid-state imaging apparatus 100, which form the basis of Embodiment 1.

Reference signal RAMP is a triangular wave in each of the down-count period (from t10 to t14) and the up-count period (from t20 to t24).

The down-count period is a period for AD converting the level of reset component Vrst among the analog pixel signal output from amplification transistor SF. The time from the start of the down-count period (start of the change in the triangular wave) until the output of voltage comparator 252 inverts is down-counted by counter 254. This count value is the result of the AD conversion of reset component Vrst of the analog pixel signal.

The up-count period is a period for AD converting the level of the data component (signal component Vsig+reset component Vrst) among the analog pixel signal output from amplification transistor SF. The time from the start of the up-count period (start of the change in the triangular wave) until the output of voltage comparator 252 inverts is up-counted by the counter. This up-counting converts the data component (Vsig+Vrst) among the analog pixel signal into a digital value.

Since this up-counting takes the down-count value indicating reset component Vrst as an initial value, the count value at the end of the up-count period represents the result of correlated double sampling (CDS) that subtracts the reset component from the data component. In other words, the count value at the end of the up-count period is the digital value representing signal component Vsig. In this way, column AD circuits 25 exclude variations which result in error, such as clock skew and counter delay between columns, and reads only the true signal component Vsig, that is, performs digital CDS.

[1.5 Example of Readout Operation by Correlated Double Sampling]

Figure 10:
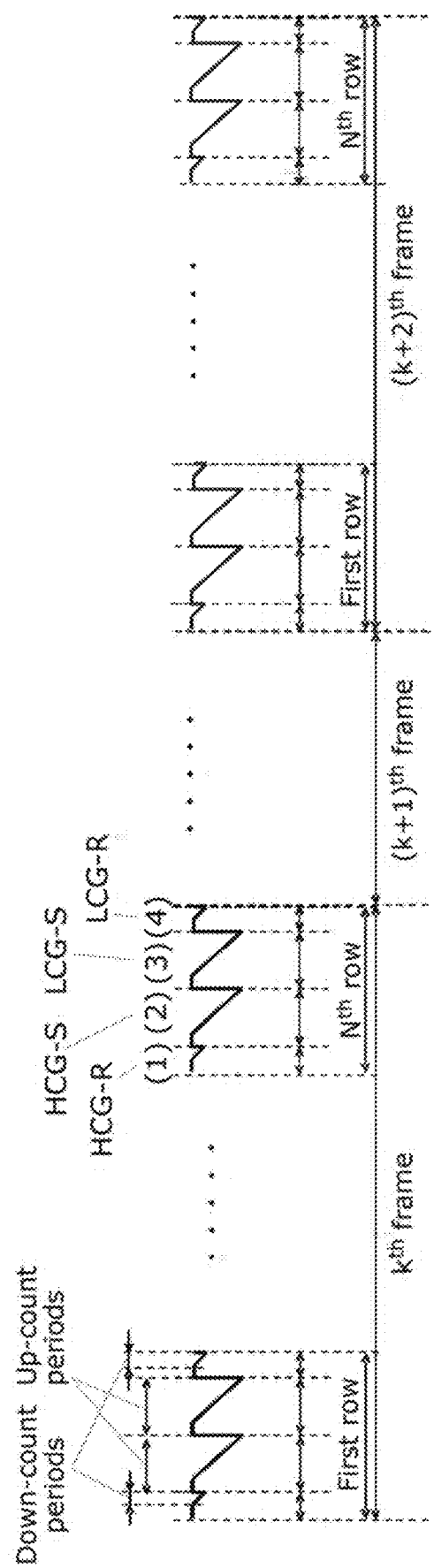
FIG. 10 illustrates the order in which a few frames are read out in Embodiment 1.
Figure 12:
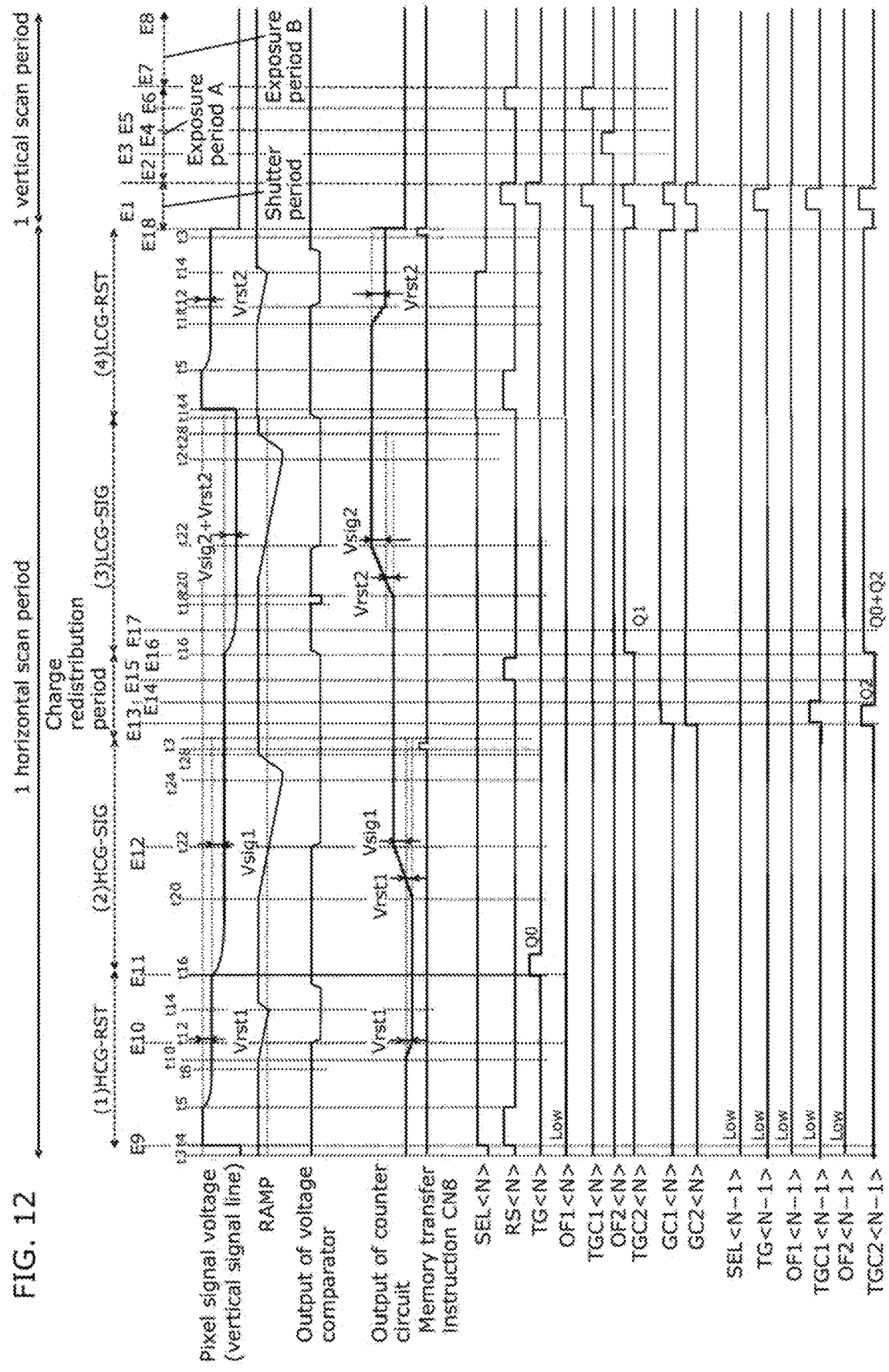
FIG. 12 is a time chart illustrating an example of pixel readout operations accompanied by gain control according to Embodiment 1.

FIG. 10 illustrates the order in which a few frames are read out in Embodiment 1. FIG. 11 illustrates CDS order in 1 H, which is from HCG (R: reset component) to HCG (S: signal component) to LCG (S: signal component) and to LCG (R: reset component). FIG. 12 illustrates FIG. 9 as a base modified to this CDS order. In the transition from HCG (R: reset component) to HCG (S: signal component), pixel reset noise is cancelled. However, in the transition from LCG (S: signal component) to LCG (R: reset component), the DC offset (reset coupling) can be removed, but the pixel reset noise cannot be cancelled, and remains as kTC noise.

Figure 13:
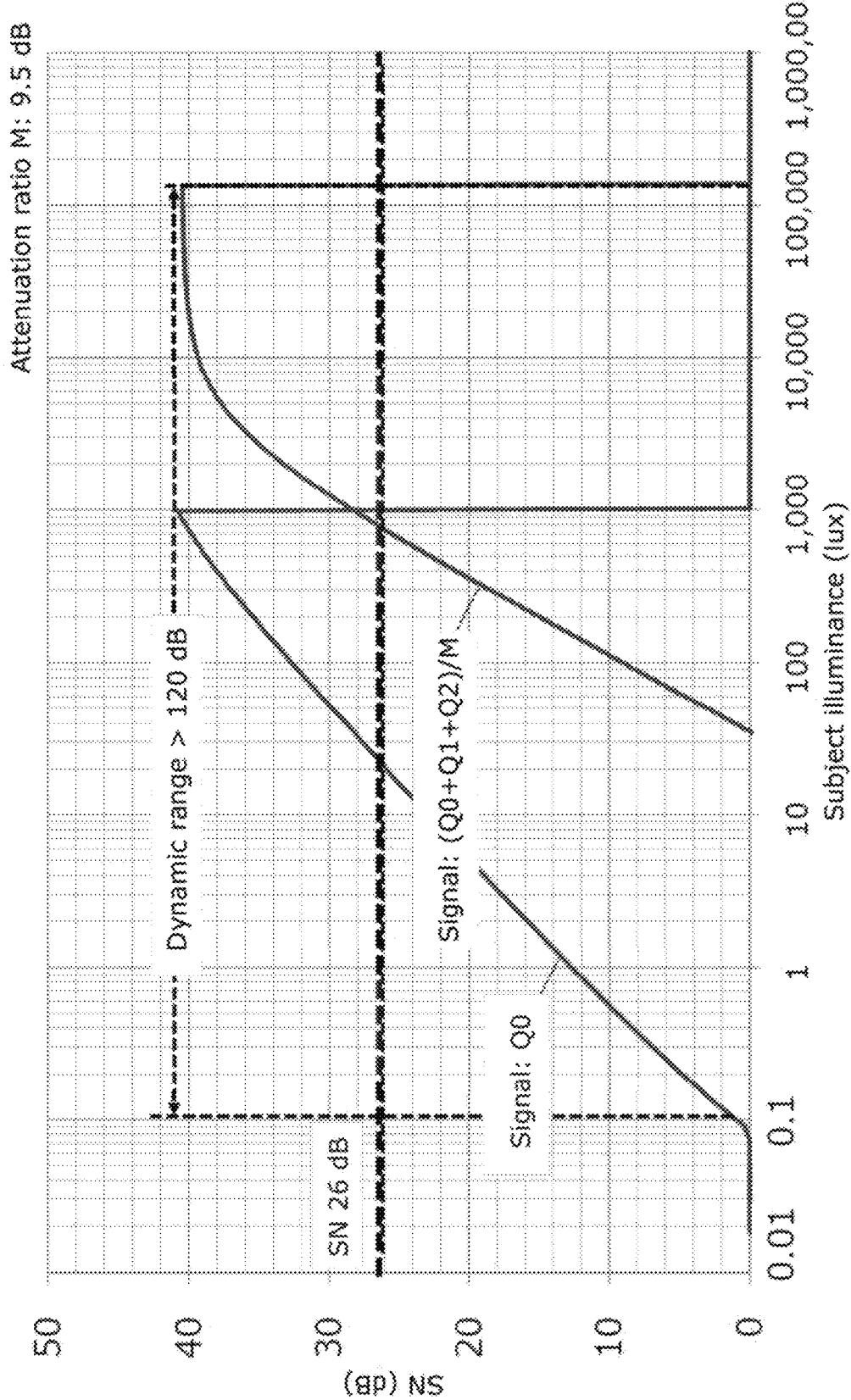
FIG. 13 illustrates the relationship between subject illuminance and gain (SN ratio) according to Embodiment 1.

The kTC noise in this short exposure (high illuminance) appears on the low signal side. For example, this is illustrated in FIG. 13. Here, kTC noise is expressed as $\sqrt{(kTC)}$ at charge amount. Settings must be configured so that this noise is sufficiently smaller than the signal level. Accordingly, at the boundary between the short exposure (high illuminance) and the long exposure (low illuminance), it is necessary to sufficiently improve the latter SN more than the former SN.

[1.6 Readout Operation Accompanied by Gain Control]

FIG. 12 is a time chart illustrating an example of pixel readout operations accompanied by gain control according to Embodiment 1.

In FIG. 12, t* (where * denotes a number) indicates the event number in FIG. 9. E* indicates the event number in FIG. 14A, FIG. 14B, and FIG. 14C.

Note that the content of FIG. 12 is non-limiting so long as the timing is a timing that achieves the same advantageous effects as the present embodiment.

The gain that converts the signal charge at floating diffusion layer FD1 into voltage can be switched between a high gain and a low gain according to the on/off state of gain control transistor GC1. The period from HCG (R: reset component) to HCG (S: signal component) indicates a readout operation of a signal charge from photodiode PD to floating diffusion layer FD1 in a state in which the conversion gain of floating diffusion layer FD1 is high. The period from LCG (S: signal component) to LCG (R: reset component) indicates a readout operation of a signal charge from storage capacitive element C1 and storage capacitive element C2 to floating diffusion layer FD2 in a state in which the conversion gain of floating diffusion layer FD2 is low.

In order to charge redistribute the <N> row pixel signal and the <N−1> row pixel signal, gain control transistor GC2 performs mixing/separating (explanation of the detailed potential figures will be given later).

[1.7 Concept of Pixel Mixing]

Figure 15A:
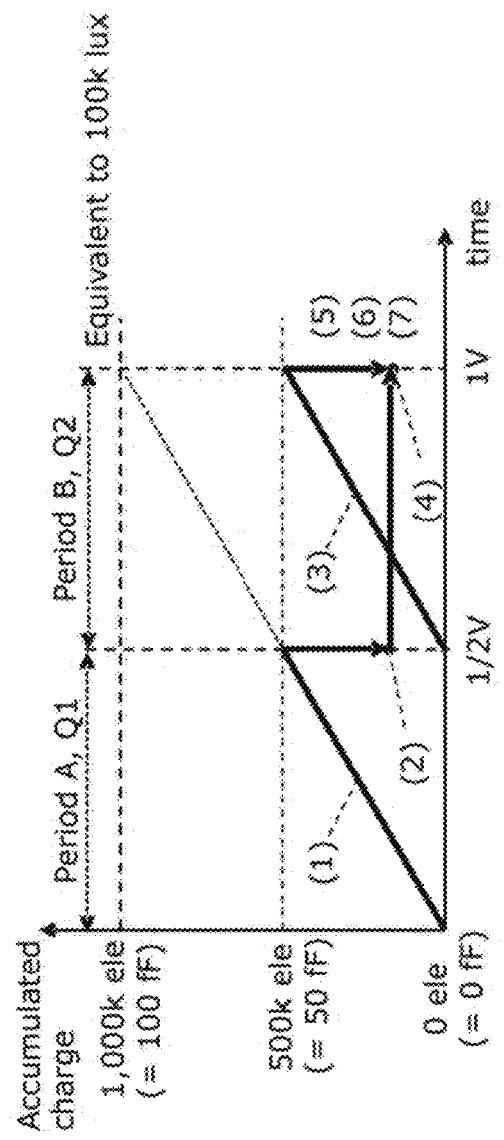
FIG. 15A is an explanatory diagram illustrating the concept of pixel mixing.
Figure 16:
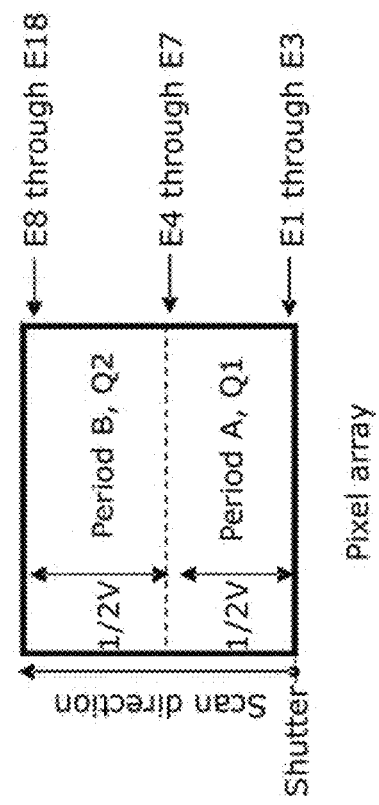
FIG. 16 is an explanatory diagram of the scan periods in FIG. 15A.

FIG. 15A, FIG. 15B, FIG. 15C, and FIG. 16 illustrate the concept of pixel mixing. FIG. 15A is an explanatory diagram illustrating the concept of pixel mixing. FIG. 15B is for explaining each point in FIG. 15A. FIG. 15C is for explaining each point in FIG. 15A. FIG. 16 is an explanatory diagram of the scan periods in FIG. 15A. Note that explanation of the detailed potential figures will be given later.

First, the charge that overflows from photodiode PD is accumulated only in storage capacitive element C1<N> ((1) in FIG. 15A through FIG. 15C), and the accumulated charge increases as the exposure time increases. If the capacitive element that accumulates the charge is insufficient, 100,000 lux cannot be received, whereby the dynamic range is insufficient.

However, in the present embodiment, in a ½ V period (½ vertical synchronization period) corresponding to half of a 1 V period (1 vertical synchronization period), the charge amount of C1<N> is Q1, and after charge redistribution with C2<N>, the charge is Q1/M ((2) in the figures), and is held until the end period of the 1 V period. Thereafter, the no longer necessary charge of C1<N> is discharged. Attenuation ratio M is defined by the capacitance ratio (C1+C2)/C2.

Moreover, from the time of ½ V (½ vertical synchronization period), once again, the charge that overflows from photodiode PD is accumulated in C1<N> ((3) in the figures), and the accumulated charge increases as the exposure time increases. Then, in the 1 V (1 vertical synchronization period) period, the charge amount of C1<N> becomes Q2 ((6) in the figures). Here, in advance, charge amount Q0 of photodiode PD and charge amount Q2 of C1<N> read out to the FD2 part are redistributed between C1<N> and C2<N−1> ((7) in the figures), and charge (Q0+Q2)/M of C2<N−1> ((4) in the figures) is held.

Then, finally, charge Q1/M of C2<N> and charge (Q0+Q2)/M of C2<N−1> are read out and FD mixed to obtain a signal charge of (Q0+Q1+Q2)/M ((5) in the figures).

A feature of the present embodiment is that a storage capacitive element is driven using the capacitance of an adjacent row whose charge has already been discharged to reduce capacitor surface area.

A feature of the exposure method according to the present embodiment is that LED light can be captured with certainty in a 1 V period (1 vertical synchronization period) exposure period since the exposure method employed is a continuous exposure method (PD and storage capacitive element), whereas LED light is failed to be captured if an intermittent exposure method via a chopper or the like is employed, which is one other exposure method.

Figure 17:
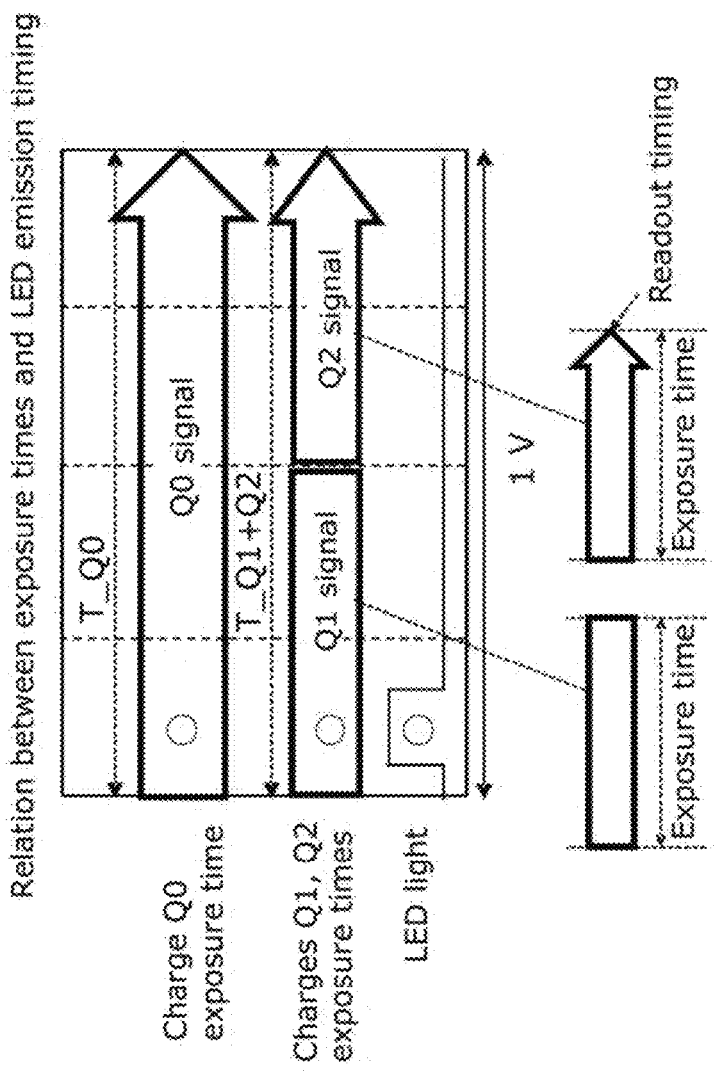
FIG. 17 illustrates timing related to the accumulating of charges of a photodiode and a storage capacitive element.
Figure 18:
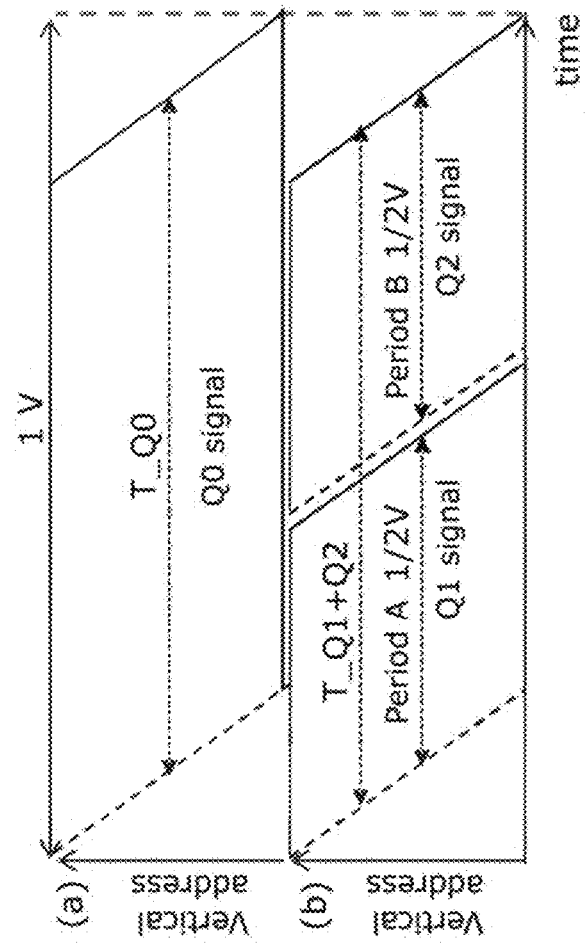
FIG. 18 illustrates timing related to the accumulating of charges of a photodiode and a storage capacitive element.

FIG. 17 and FIG. 18 illustrate timing related to the accumulating of charges of photodiode PD and storage capacitive element C1. Photodiode PD is continuously exposed during the 1 V period (1 vertical synchronization period) and the charge amount is Q0. The signal of storage capacitive element C1<N> that receives this charge that overflows from photodiode PD is Q1 up to the 0-½ V period, and Q2 up to the ½-1 V period. Moreover, since photodiode PD is completely exposed during the 1 V period, it is possible to capture LED light. Here, for the transition from 0-½ V to ½-1 V, the possibility that a non-exposure period may arise at a few H levels is to an extent that does not affect the image quality of the LED light.

[1.8 WDR]

A feature of the present embodiment is that the two frames—the long and short frames-combined to achieve a WDR are exposed at exactly the same timing and the exact same pixels are used, which inhibits false colors, coloring, and blur.

Figure 19A:
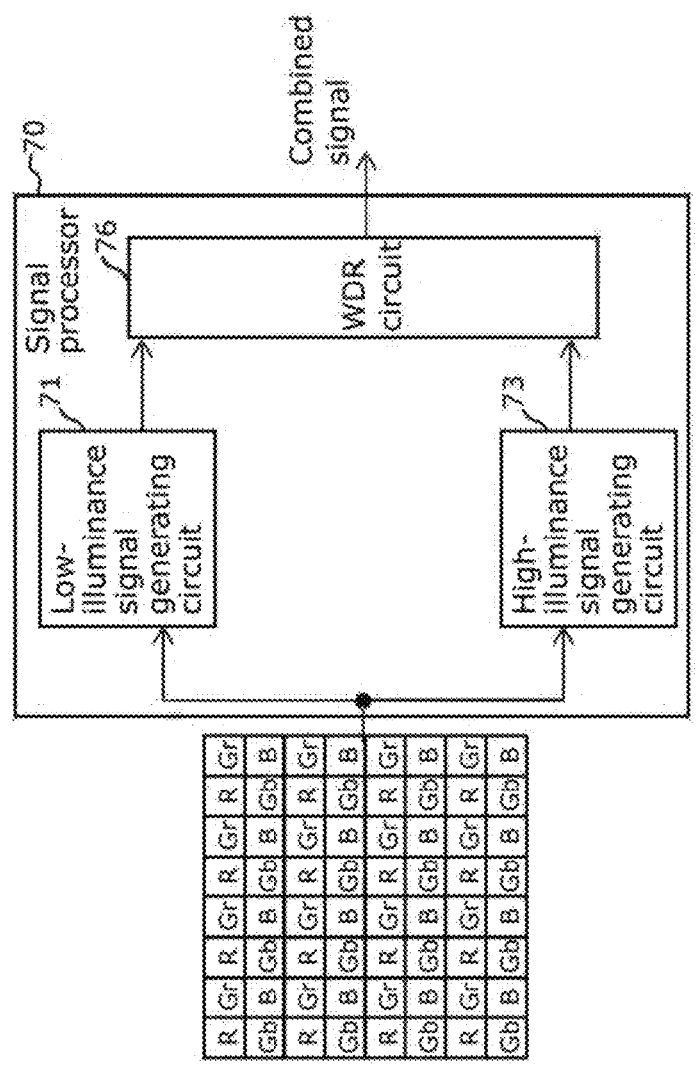
FIG. 19A illustrates an example of a configuration of a signal processor that combines two frames to achieve a WDR.
Figure 20:
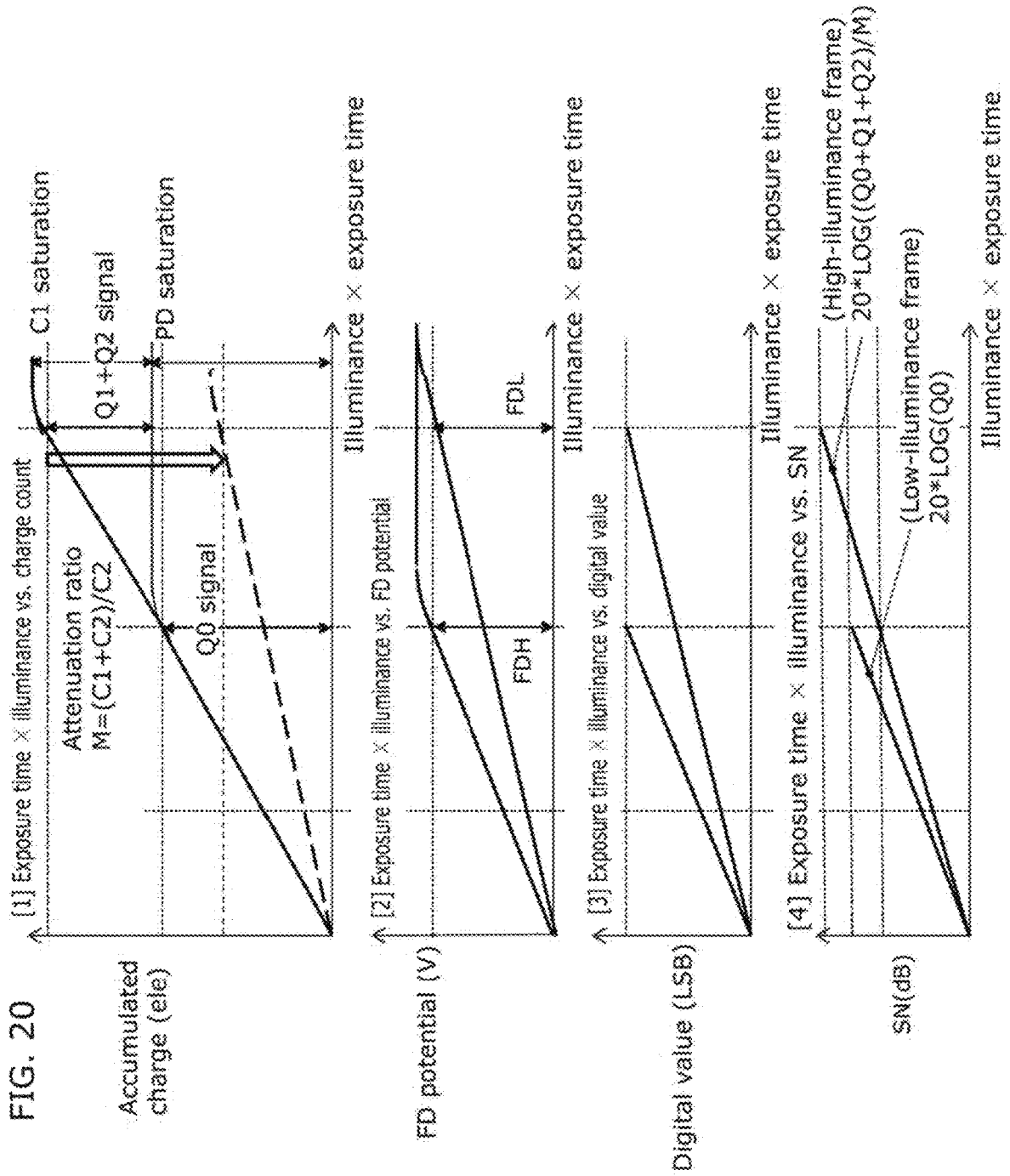
FIG. 20 illustrates [1] charge accumulation level, [2] FD potential, [3] value after AD conversion, and [4] SN relative to the product of illuminance and exposure time.

FIG. 19A and FIG. 20 illustrate an outline of a combining method to achieve a WDR. Signal processor 70 in FIG. 19A includes low-illuminance signal generating circuit 71, high-illuminance signal generating circuit 73, and WDR circuit 76. FIG. 19A illustrates an example of a configuration of a signal processor that combines two frames to achieve a WDR. The WDR is achieved using the signal charge of Q0 as the long exposure (low illuminance) and the signal charge of (Q0+Q1+Q2)/M as the short exposure (high illuminance).

The product of illuminance and exposure time, illuminance at a certain time, or exposure time at a certain illuminance is represented on the horizontal axes of [1], [2], [3], and [4] in FIG. 20. In [1], charge accumulation level is represented on the vertical axis. In [2], FD potential is represented on the vertical axis. In [3], the value after AD conversion is represented on the vertical axis. In [4], SN is represented on the vertical axis.

Figure 21:
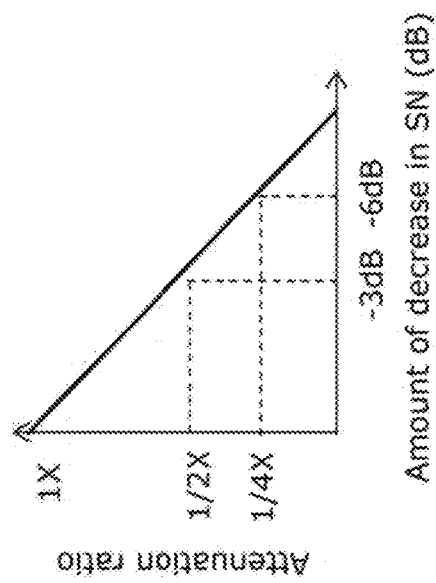
FIG. 21 illustrates SN degradation that accompanies an attenuation ratio of an exposure (high illuminance).

FIG. 21 illustrates SN degradation that accompanies attenuation ratio M of the short exposure (high illuminance). Since SN is determined by shot noise, for example, when attenuation ratio M is double, the SN at the boundary drops by 3 dB. Although the capacitance ratio of storage capacitive element (C1) and storage capacitive element (C2) can be set at an arbitrary attenuation ratio M, SN degradation observed in the WDR result at the boundary of the frames is the benchmark.

FIG. 22 illustrates the signal charge amount and FD potential at the first readout, Read1, of the low-illuminance frame, and the second readout, Read2, of the high-illuminance frame.

FIG. 13 illustrates the relationship between subject illuminance and gain (SN ratio) according to Embodiment 1. FIG. 13 is an actual result of the combination of the first Read1 as the long frame (low-illuminance frame) of the WDR and the second Read2 as the short frame (high-illuminance frame) of the WDR. The SN at the connecting part of the frames is greater than or equal to 26 dB and the dynamic range is greater than or equal to 120 dB. The dynamic range extends from an extremely dark illuminance (0.1 lux) to an extremely bright illuminance (100,000 lux (equivalent to sunlight)).

WDR circuit 76 included in signal processor 70 is illustrated in greater detail in FIG. 19A.

The pixel signal (long exposure) of the first low-illuminance frame and the pixel signal (short exposure) of the second high-illuminance frame are combined. This combining achieves a wide dynamic range function (WDR function), or stated differently, functions to extend the dynamic range.

Regarding the pixel signal (long exposure) of the first low-illuminance frame, the gain within the pixel is set high, and regarding the pixel signal (short exposure) of the second high-illuminance frame, the gain within the pixel is set low, whereby noise at low illuminances can be improved and the dynamic range can be extended at high illuminances.

FIG. 23 illustrates advantageous effects achieved by the present embodiment, namely storage capacitive element surface area reduction and dynamic range extension. In this way, with the present embodiment, it is possible to extend the dynamic range with smaller storage capacitive elements, and with respect to high-illuminance LED light as well, it is possible to avoid completely missing received signals. Note that Embodiment 1 is based on case number 1. Note that in FIG. 23, "same" means same with regard to case numbers marked with (*1) and with regard to case numbers marked with (*2).

[1.9 Pixel Potential Structure]

Figure 14A:
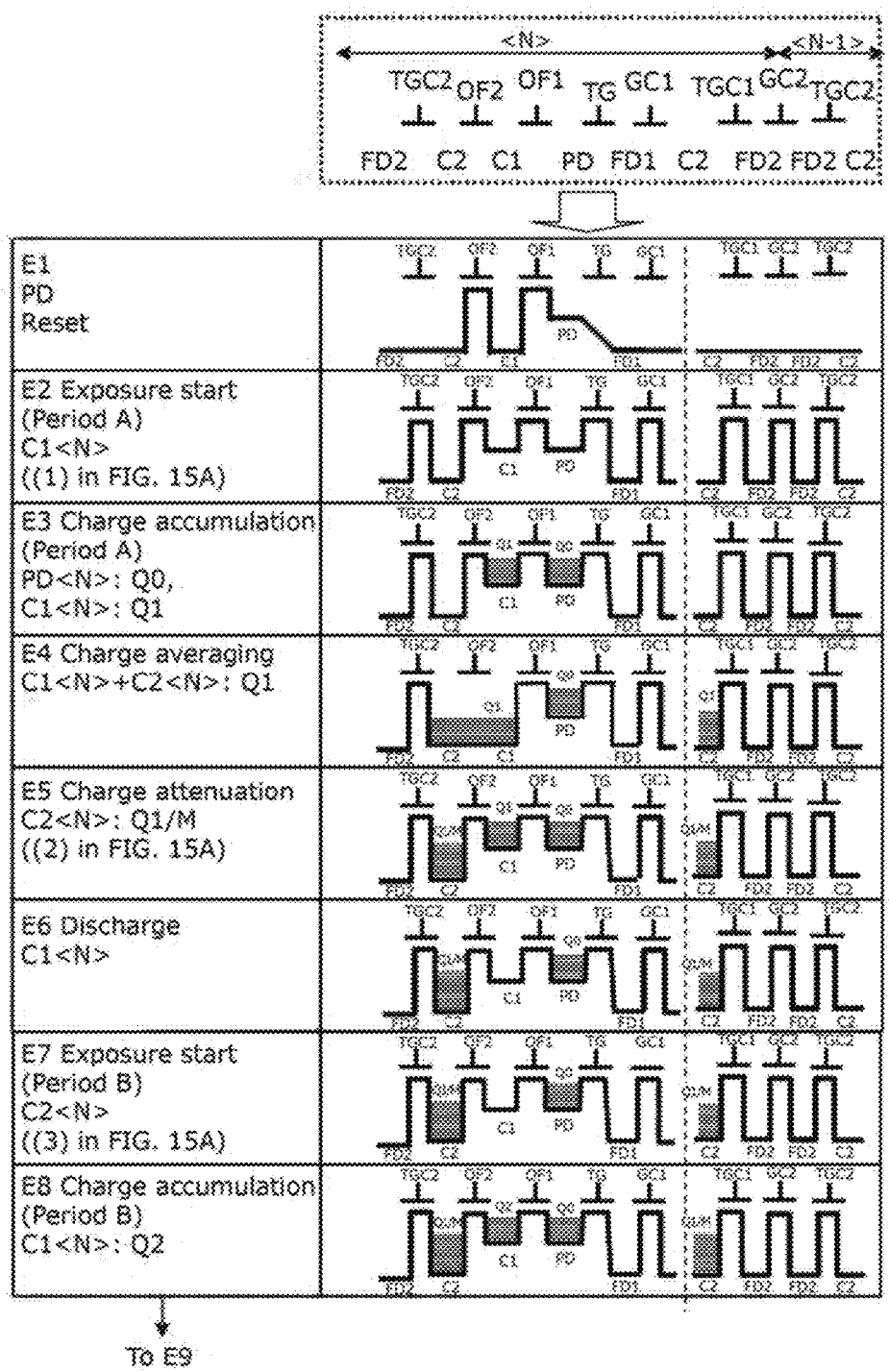
FIG. 14A illustrates potentials at main points in FIG. 12.
Figure 14B:
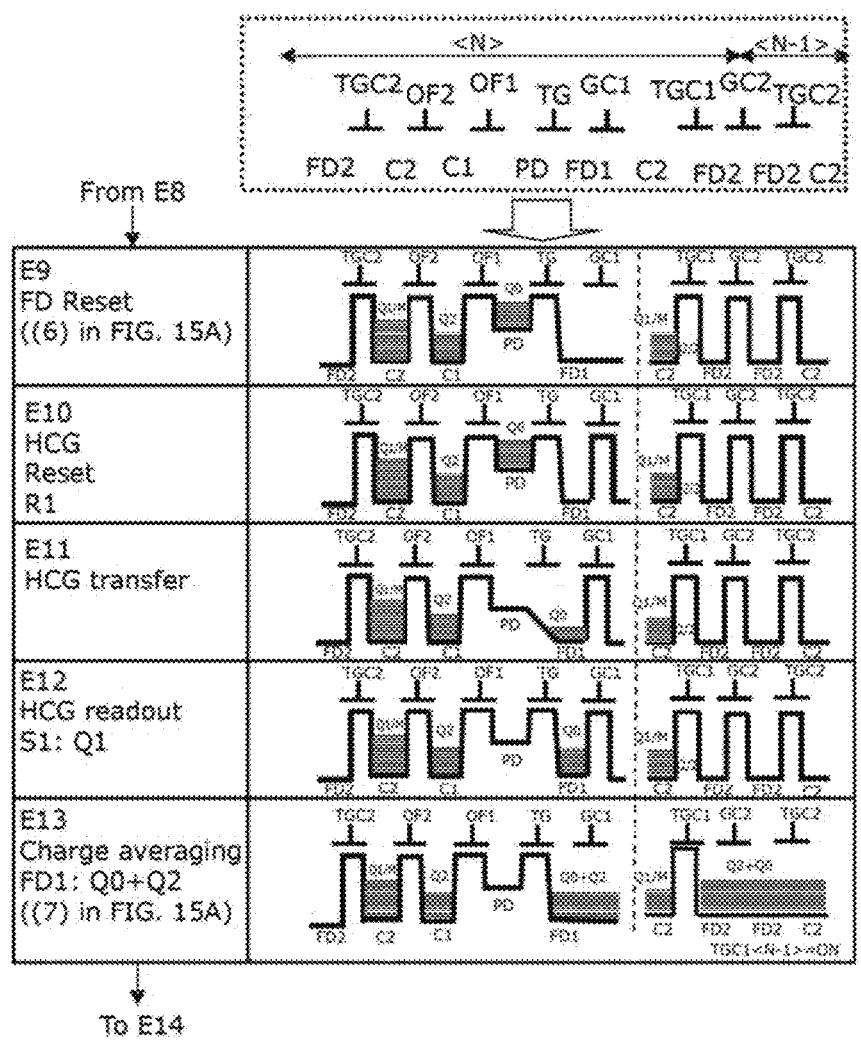
FIG. 14B illustrates potentials at main points in FIG. 12.
Figure 14C:
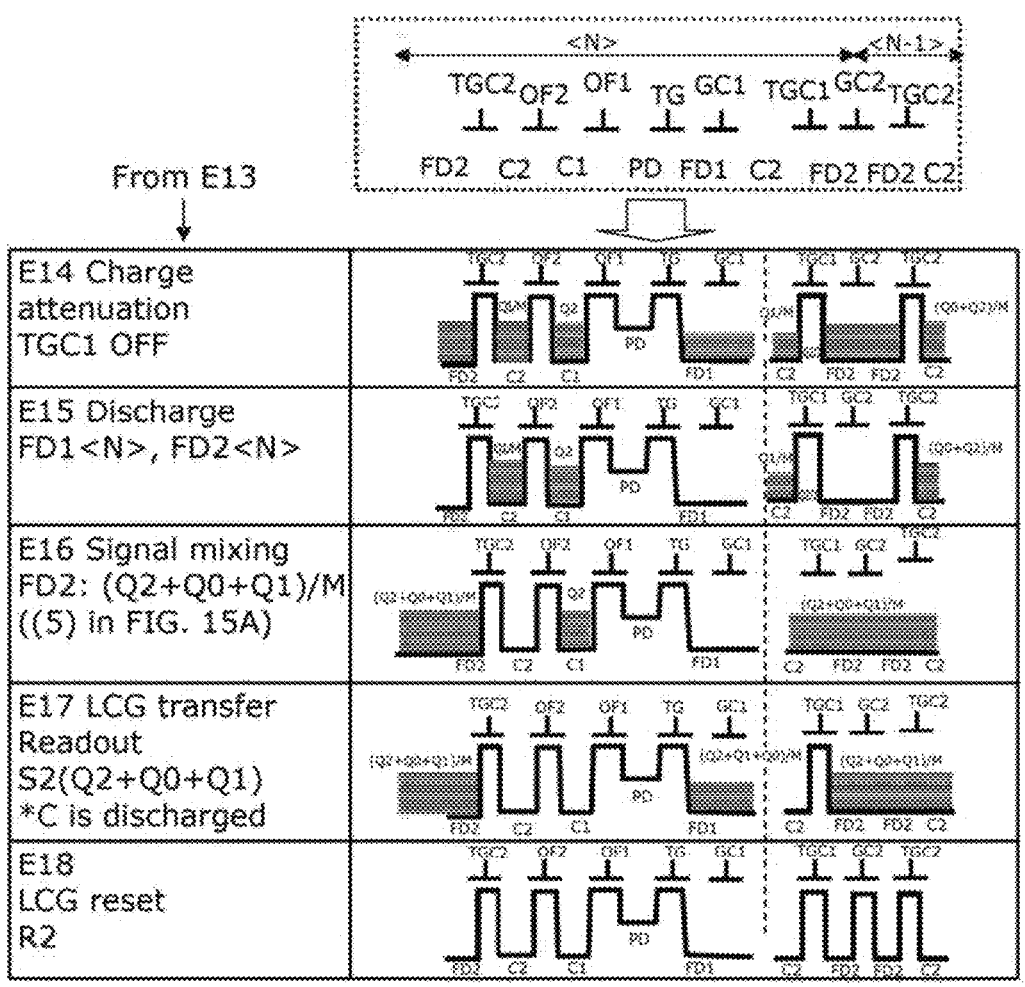
FIG. 14C illustrates potentials at main points in FIG. 12.

FIG. 14A through FIG. 14C illustrate potentials at main points in FIG. 12.

Events are denoted as E1 through E18, and will now be described in order.

E1 is the reset of FD1. The charge of the PD part is discharged by turning reset transistor RS<N>, transfer transistor TG<N>, and gain control transistor GC1<N> on.

E2 is the start of exposure in period A. Reset transistor RS<N>, transfer transistor TG<N>, and gain control transistor GC1<N> are turned off.

E3 is the accumulation of charge in period A. Signal charge Q0 is accumulated in photodiode PD, and the charge that overflows is accumulated as Q1 in storage capacitive element C1<N> via overflow gate OF1<N>.

In E4, the charge accumulated in C1<N> is first averaged for charge redistribution with C2<N>, by turning overflow gate OF2<N> on.

In E5, since the attenuation ratio is M=(C1<N>+C2<N>)/C2<N> as a result of turning overflow gate OF2<N> off, the charge amount of C2<N> becomes Q1/M.

In E6, the charge of C1<N> that is no longer necessary is discharged by turning storage transfer transistor TGC1<N> and reset transistor RS<N> on.

E7 is the start of exposure in period B. Storage transfer transistor TGC1<N> and reset transistor RS<N> are turned off.

E8 is the accumulation of charge in period B. Signal charge Q0 is accumulated in photodiode PD, and the charge that overflows is accumulated in storage capacitive element C1<N> via overflow gate OF1<N>.

E9 is the reset of FD1<N>. The charge of the FD1 part is discharged by turning reset transistor RS<N> and gain control transistor GC1<N> on.

E10 is the reset of HCG. The HCG state is achieved by turning reset transistor RS<N> and gain control transistor GC1<N> off.

E11 transfers charge Q0 of photodiode PD to the FD1 part by turning transfer transistor TG<N> on.

E12 reads out charge Q0 of photodiode PD accumulated in the FD1 part by turning transfer transistor TG<N> off (HCG signal).

E13 averages and redistributes charge Q2 of storage transfer transistor TGC1<N> with Q0 of the FD1 part. Accordingly, gain control transistor GC2<N>, storage transfer transistor TGC1<N>, and storage transfer transistor TGC2<N−1> are turned on, and the charges of Q0 and Q2 are averaged.

E14 turns storage transfer transistor TGC1<N> and storage transfer transistor TGC2<N−1> off and redistributes the charges of Q0 and Q2.

As a result of the charge redistribution, regarding attenuation ratio M, based on (C1<N>+C2<N−1>)/C2<N−1>, the charge amount of C2<N−1> becomes (Q0+Q2)/M.

In E15, the charge of C1<N> that is no longer necessary is discharged by turning storage transfer transistor TGC1<N> and reset transistor RS<N> on. Although E15 is not necessary, it may be implemented to increase the precision of reverse CDS (signal component to reset component).

In E16, by turning on storage transfer transistors TGC2<N> and TGC2<N−1>, charge amount Q1/M of C2<N> and charge amount (Q0+Q2)/M of C2<N−1> are mixed, whereby the total charge is (Q0+Q1+Q2)/M (LCG signal).

In E17, the signal of FD2 is read out.

In E18, FD1 and FD2 are reset and the readout operation ends.

Problems related to the overflow of the charge from photodiode PD are the mixing of colors and linearity deviation that accompany the leaking of charge to other elements. Accordingly, the following condition is necessary regarding potential barrier height at each overflow. The charge that overflows from photodiode PD flows in this order: overflow gates OF1, OF2<transfer transistor TG, storage transfer transistors TGC1, TGC2<separation layer.

Note that regarding the overflow gate voltage in particular, there tends to be variations in saturation levels caused by manufacturing variances. Accordingly, regarding the voltages of overflow gate OF1 and overflow gate OF2 in particular, before shipment, it is preferable that control is performed via trimming or the like to inhibit variations in saturation levels.

Embodiment 2

Solid-state imaging apparatus 100 according to Embodiment 2 will be described with a focus on the differences from Embodiment 1. In one example of a configuration of solid-state imaging apparatus 100, the number of controls for horizontal scan line groups 15 differ from Embodiment 1, but all other aspects are the same as Embodiment 1.

[2.1 Pixel Circuit Configuration Example]

An example of a configuration of pixel circuit 3 will be described.

Figure 24A:
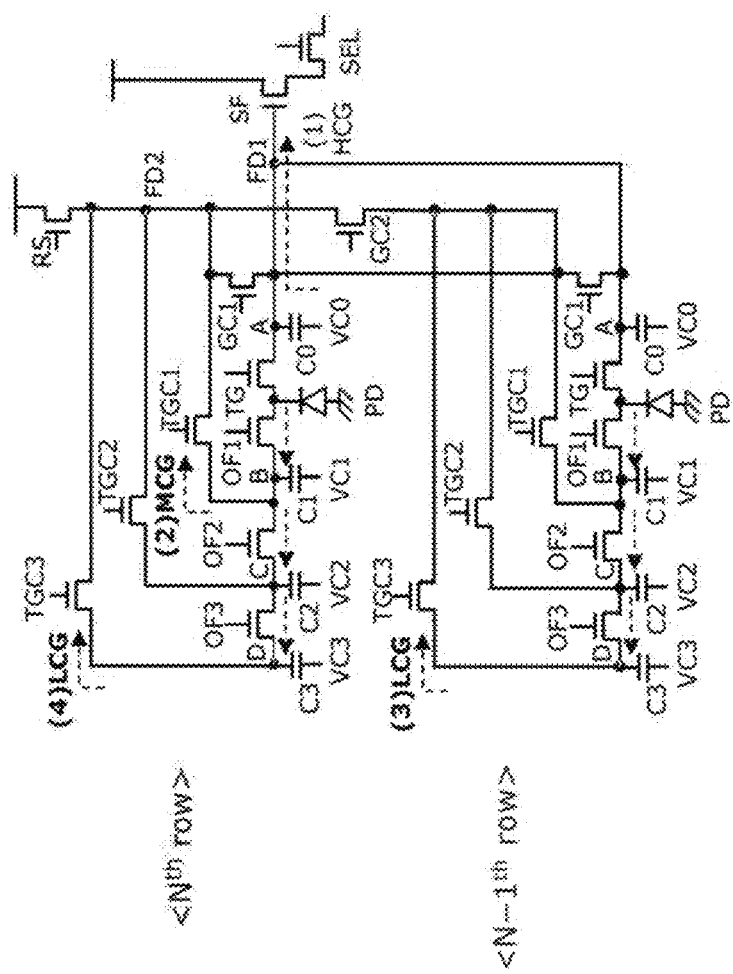
FIG. 24A illustrates an example of a circuit configuration of the vertical two-pixel single-cell structure according to Embodiment 2.
Figure 24B:
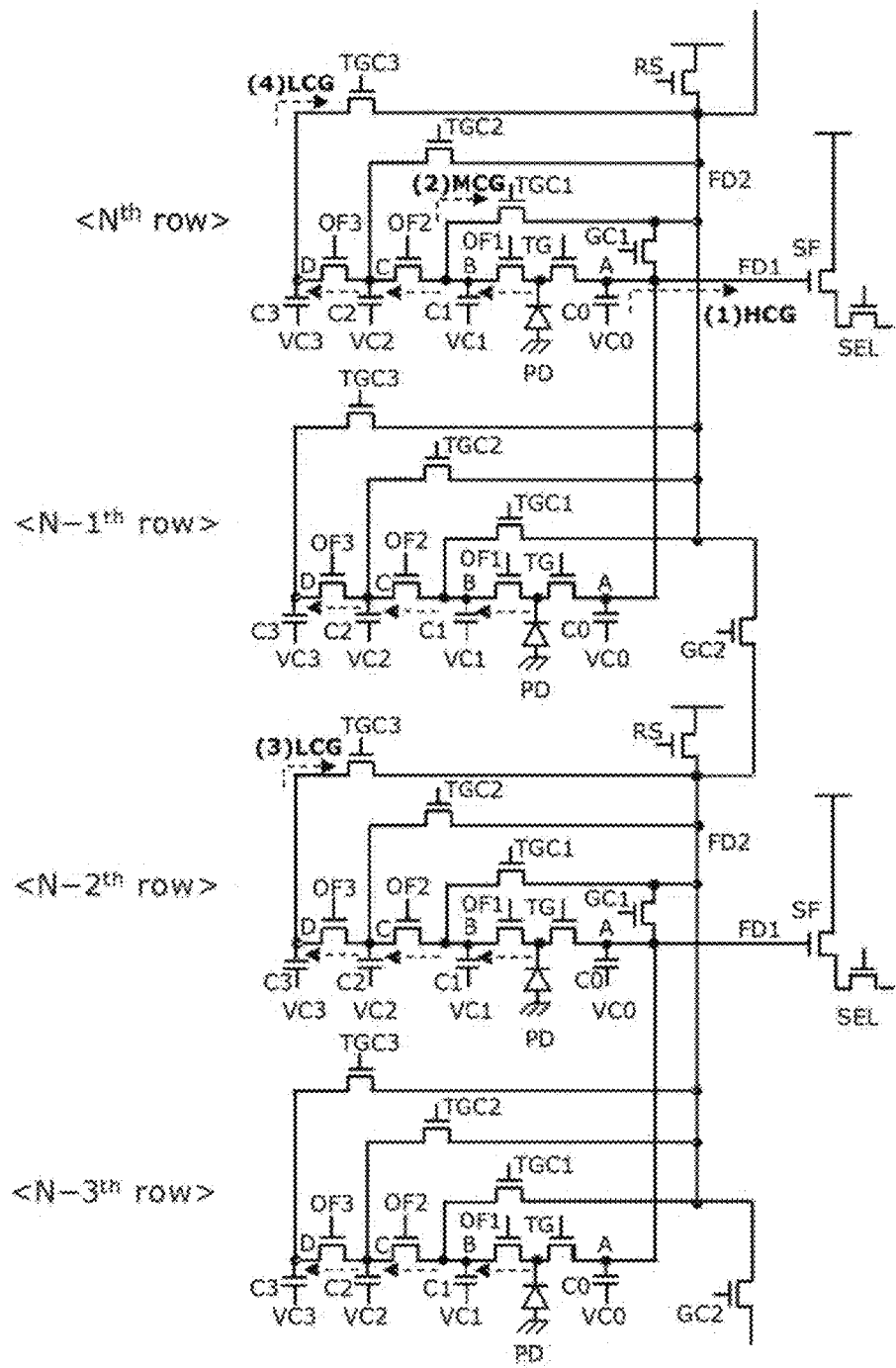
FIG. 24B illustrates an example of a circuit configuration of the vertical four-pixel single-cell structure according to Embodiment 2.

FIG. 2 illustrates an RGB Bayer configuration, FIG. 24A illustrates a vertical two-pixel single-cell circuit configuration of the RGB Bayer configuration, and FIG. 24B illustrates a vertical four-pixel single-cell circuit configuration of the RGB Bayer configuration. Control lines are the same in each of the configurations.

FIG. 24A and FIG. 24B illustrate circuit examples of pixel circuit 3 according to Embodiment 2. In addition to the configuration of Embodiment 1, charges of overflow gate OF2, storage capacitive element C2, storage transfer transistor TGC3, and storage capacitive element C3 are also included.

Horizontal scan line group 15 includes readout control line φTGC3 and overflow control line φOF2.

Overflow gate OF1 is used both as an overflow gate and a switching transistor that turns on and off according to readout control signal φOF1. When readout control signal φOF1 is high-level, the signal charge resulting from photoelectric conversion by photodiode PD to is transferred storage capacitive element C1 via overflow gate OF1.

When the signal charge resulting from photoelectric conversion by photodiode PD overflows, storage capacitive element C1 can pour the signal charge by adjusting the control voltage of overflow gate OF1. Alternatively, storage capacitive element C1 transfers the signal charge when the signal charge exceeds a preset potential.

Overflow gate OF2 is used both as an overflow gate and a switching transistor that turns on and off according to readout control signal φOF2. When readout control signal φOF2 is high-level, the signal charge resulting from photoelectric conversion by photodiode PD is transferred to storage capacitive element C2 via overflow gate OF2.

The signal charge resulting from photoelectric conversion can be poured into storage capacitive element C2 by adjusting the control voltage of overflow gate OF2 when the signal charge overflows from storage capacitive element C1. Alternatively, the signal charge is poured when the signal charge exceeds a preset potential.

Overflow gate OF2 can be designed to be used as both an overflow gate and a switching transistor capable of charge redistribution by switching readout control signal φOF2 on/off. When readout control signal φOF2 is high-level, the signal charge resulting from photoelectric conversion by photodiode PD is transferred to storage capacitive element C2 via overflow gate OF2.

The signal charge resulting from photoelectric is transferred to storage capacitive element C3 by adjusting the control voltage of overflow gate OF2 when the signal charge overflows from storage capacitive element C2. Alternatively, the signal charge is transferred when the signal charge exceeds a preset potential.

Overflow gate OF3 is used both as an overflow gate and a switching transistor that turns on and off according to readout control signal φOF3. When readout control signal φOF3 is high-level, the signal charge resulting from photoelectric conversion by photodiode PD is transferred to storage capacitive element C3 via overflow gate OF3.

Note that attenuation ratio M after charge redistribution by turning readout control signal φOF3 on/off is determined by (C1+C2)/C2.

Gain control transistor GC2 electrically disconnects or connects floating diffusion layer FD2 in this vertical two-pixel single-cell structure according to gain control signal φGC2. This changes the conversion gain at which the signal charge in floating diffusion layer FD2 is converted into voltage. In other words, in the transferring of the signal charge from photodiode PD to floating diffusion layer FD2, the conversion gain of floating diffusion layer FD can be decreased further if gain control transistor GC2 is turned on.

With this, the transferring of the charge of an adjacent row, that is to say, the charge that passes through storage transfer transistor TGC1 and storage transfer transistor TGC3 can be switched on/off, thereby enabling charge redistribution.

[2.2 Example of Readout Operation by Correlated Double Sampling]

Figure 25:
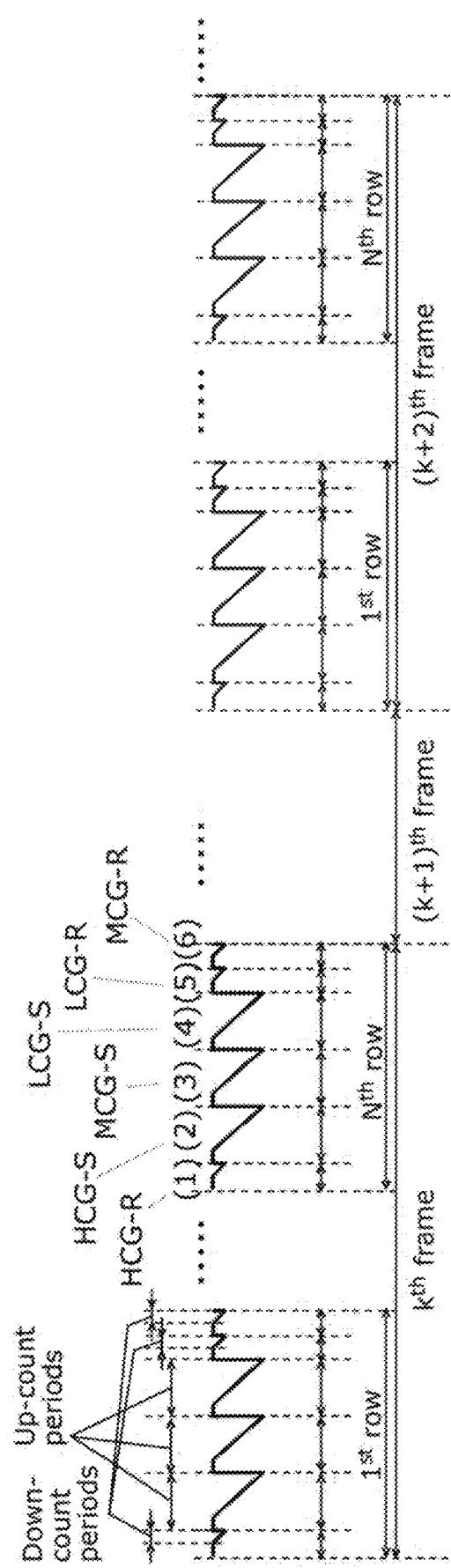
FIG. 25 illustrates the order in which a few frames are read out in Embodiment 2.
Figure 27:
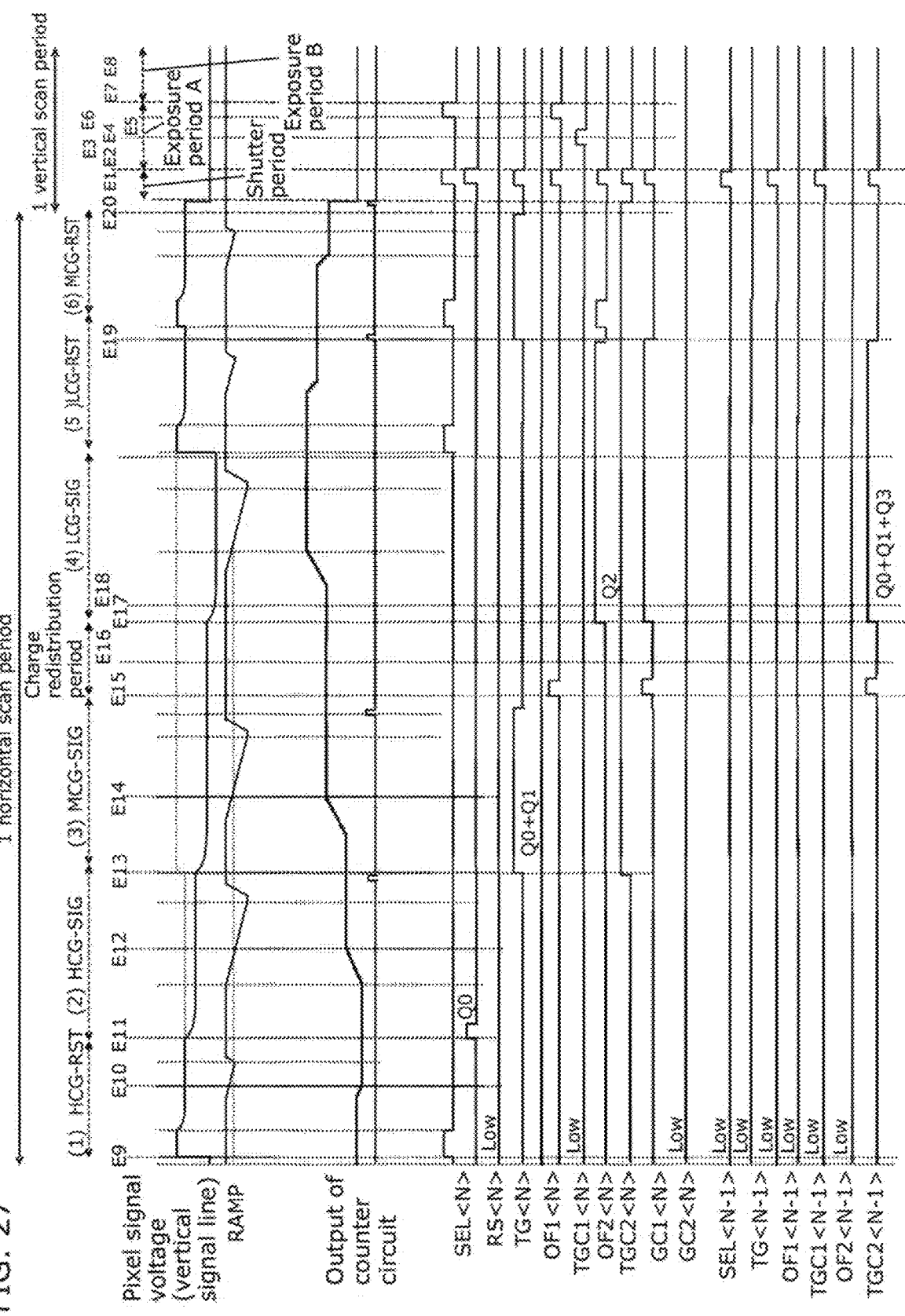
FIG. 27 is a time chart illustrating an example of pixel readout operations accompanied by gain control according to Embodiment 2.

FIG. 25 illustrates the order in which a few frames are read out in Embodiment 2. FIG. 26 illustrates CDS order in 1 H, which is from HCG (R: reset component) to HCG (S: signal component) to MCG (S: signal component) to LCG (S: signal component) to LCG (R: reset component) and to MCG (R: reset component). FIG. 27 illustrates FIG. 9 as a base modified to this CDS order. In the transition from HCG (R: reset component) to HCG (S: signal component), pixel reset noise is cancelled. However, in the transition from MCG (S: signal component) to LCG (S: signal component) to LCG (R: reset component) to MCG (R: reset component), the DC offset (reset coupling) can be removed, but the pixel reset noise cannot be cancelled, and remains as kTC noise.

Figure 36:
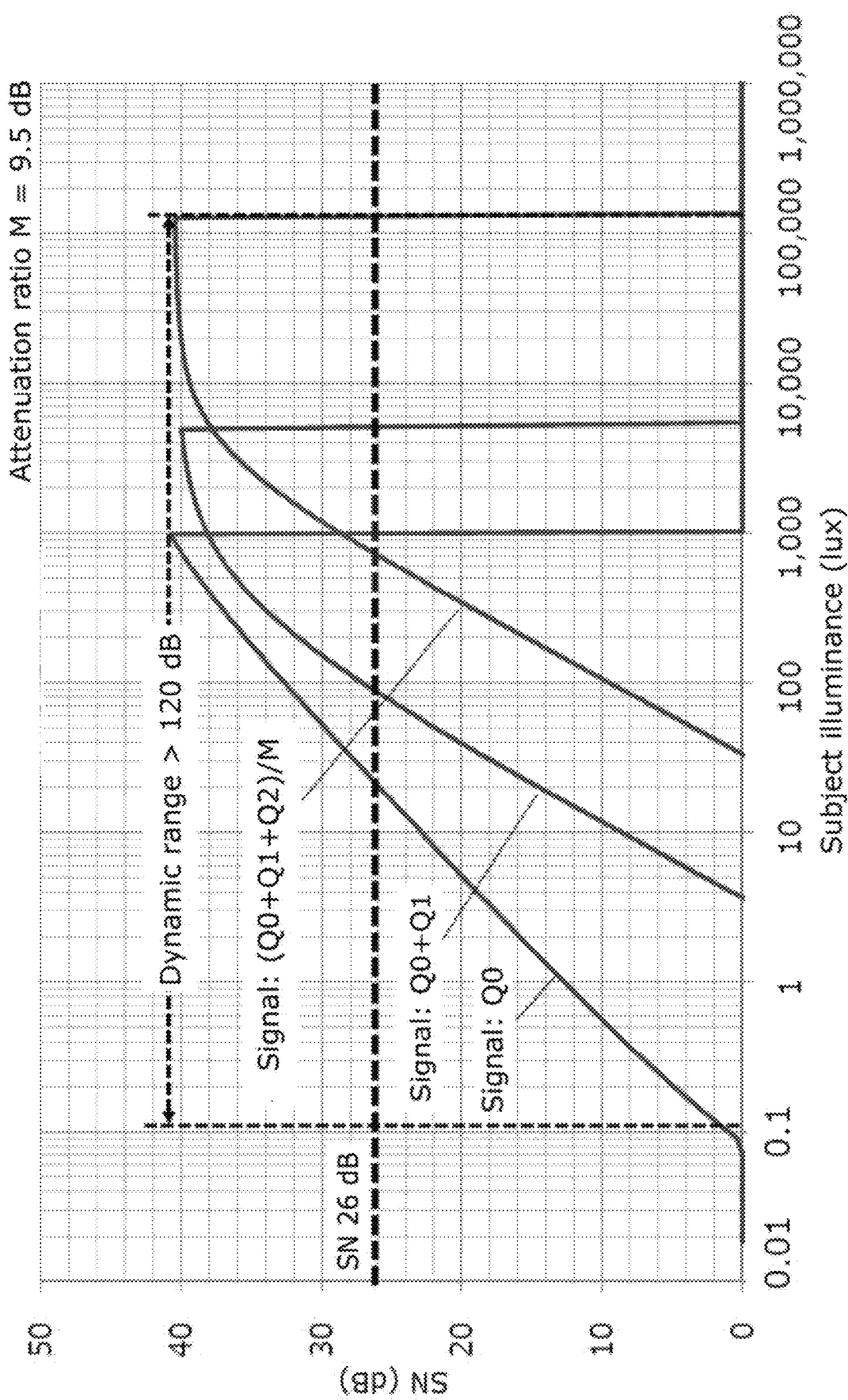
FIG. 36 illustrates the relationship between subject illuminance and gain (SN ratio) according to Embodiment 2.

The kTC noise in this short exposure (high illuminance) appears on the low signal side. For example, this is illustrated in FIG. 36. Here, kTC noise is expressed as √(kTC) at charge amount. Settings must be configured so that this noise is sufficiently smaller than the signal level. Accordingly, at the boundary between the short exposure (high illuminance) and the long exposure (low illuminance), it is necessary to sufficiently improve the latter SN more than the former SN.

[2.3 Readout Operation Accompanied by Gain Control]

FIG. 27 is a time chart illustrating an example of pixel readout operations accompanied by gain control according to Embodiment 2, with the main part at 1 V (1 vertical synchronization period) enlarged. In FIG. 27, t* indicates the event number in FIG. 9. E* Indicates the event number in FIG. 28A, FIG. 28B, and FIG. 28C.

Note that the content of FIG. 27 is non-limiting so long as the timing is a timing that achieves the same advantageous effects as the present embodiment.

Gain GC1 that converts the signal charge at floating diffusion layer FD1 into voltage can be switched between a high gain and a low gain according to the on/off state of gain control transistor GC1. The period from HCG (R: reset component) to HCG (S: signal component) indicates a readout operation of a signal charge from photodiode PD to floating diffusion layer FD1 in a state in which the conversion gain of floating diffusion layer FD1 is high. The period from MCG (S: signal component) to LCG (S: signal component) to LCG (R: reset component) and to MCG (R: reset component) indicates a readout operation of a signal charge from storage capacitive element C1 and storage capacitive element C2 to floating diffusion layer FD2 in a state in which the conversion gain of floating diffusion layer FD2 is low.

In order to charge redistribute the <N> row pixel signal and the <N−1> row pixel signal, gain control transistor GC2 performs mixing/separating (explanation of the detailed potential figures will be given later).

[2.4 Concept of Pixel Mixing]

Figure 29A:
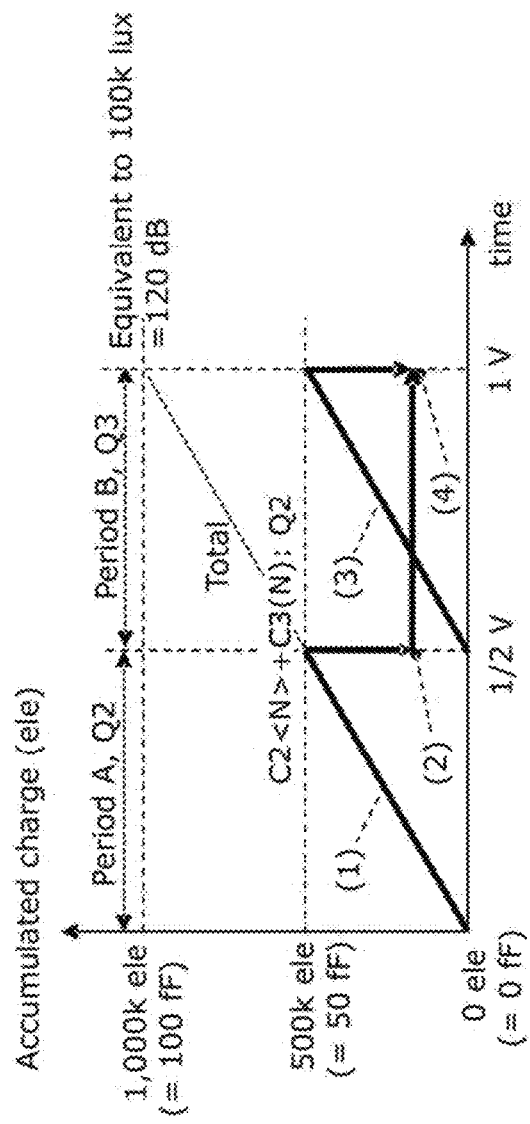
FIG. 29A is an explanatory diagram illustrating the concept of pixel mixing.
Figure 30:
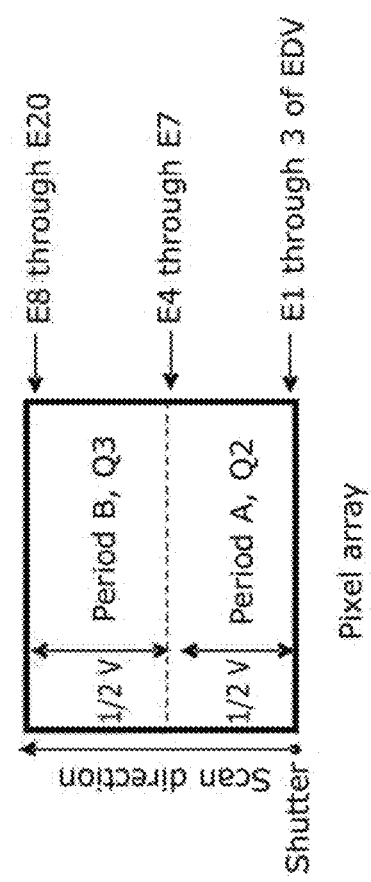
FIG. 30 is an explanatory diagram of the scan periods in FIG. 29A.

FIG. 29A, FIG. 29B, and FIG. 30 illustrate the concept of pixel mixing. FIG. 29A is an explanatory diagram illustrating the concept of pixel mixing. FIG. 29B is for explaining each point in FIG. 29A. FIG. 30 is an explanatory diagram of the scan periods in FIG. 29A. Note that explanation of the detailed potential figures will be given later.

First, the charge that overflows from photodiode PD is accumulated in storage capacitive element C2<N>, and the charge in storage capacitive element C2 increases as the exposure time increases ((1) in FIG. 29A). If the capacitive element that accumulates the charge is insufficient, 100,000 lux cannot be received, whereby the dynamic range is insufficient.

However, in the present embodiment, in a ½ V period corresponding to half of a 1 V (1 vertical synchronization period) period, the charge amount of C1<N> is Q1. After charge amount Q2 of C2<N> is redistributed with C3<N>, the charge amount of C3<N> is Q2/M ((2) in the figures), and is held until the end period of 1 V. Thereafter, the no longer necessary charge of C2<N> is discharged.

From the time of ½ V, the accumulation of the charge is started once again ((3) in the figures). Then, in the 1 V period (1 vertical synchronization period), the charge amount of C2<N> becomes Q3 ((6) in the figures). Here, in advance, charge amount Q0 of photodiode PD, charge amount Q1 of C1<N>, and charge amount Q3 of C2<N> read out to the FD2 part ((7) in the figures) are redistributed between C2<N> and C3<N−1> and attenuated, and charge (Q0+Q1+Q3)/M of C3<N−1> ((4) in the figures) is held.

Then, finally, charge Q2/M of C3<N> and charge (Q0+Q1+Q3)/M of C3<N−1> are read out and FD mixed to obtain a signal charge of (Q0+Q1+Q2+Q3)/M ((5) in the figures).

A feature of the present embodiment is that a storage capacitive element is driven using the capacitance of an adjacent row whose charge has already been discharged to reduce capacitor surface area.

A feature of the exposure method according to the present embodiment is that LED light can be captured with certainty in a 1 V period (1 vertical synchronization period) exposure period since a continuous exposure method (PD and storage capacitive element) is employed, whereas LED light is failed to be captured if an intermittent exposure method via a chopper or the like is employed.

Figure 31:
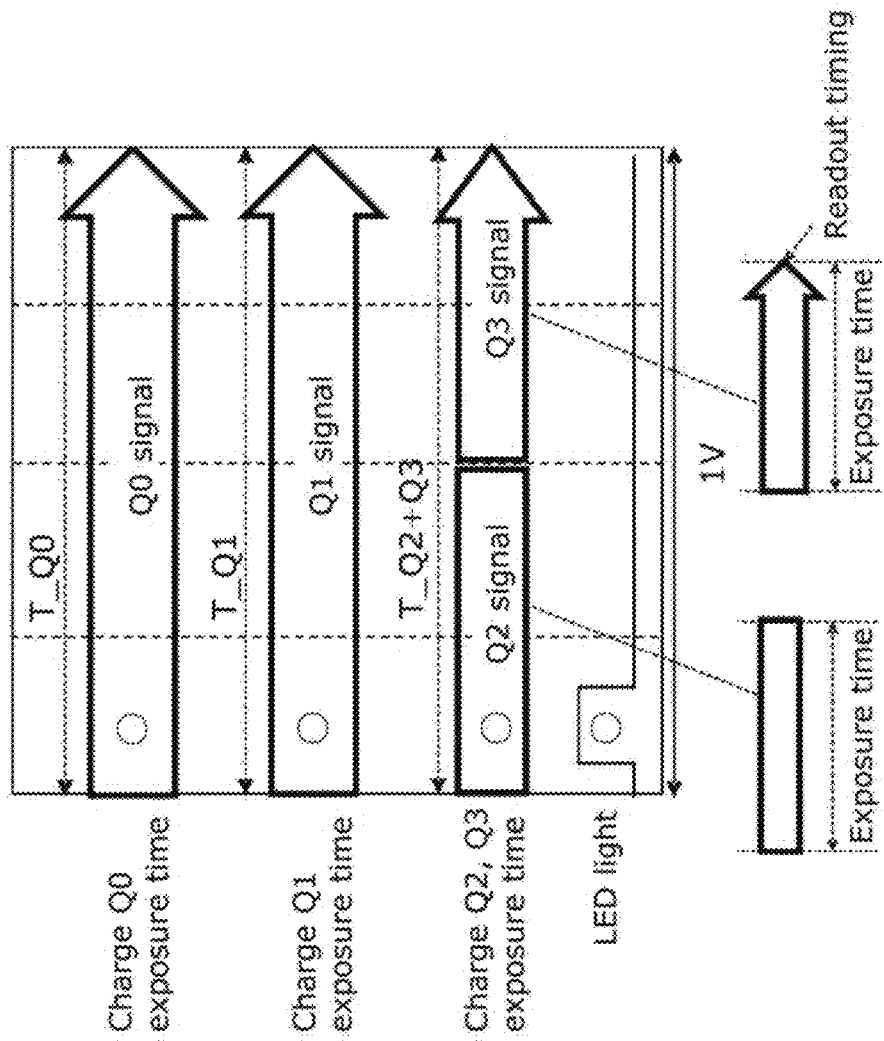
FIG. 31 illustrates timing related to the accumulating of charges of a photodiode and a storage capacitive element.
Figure 32:
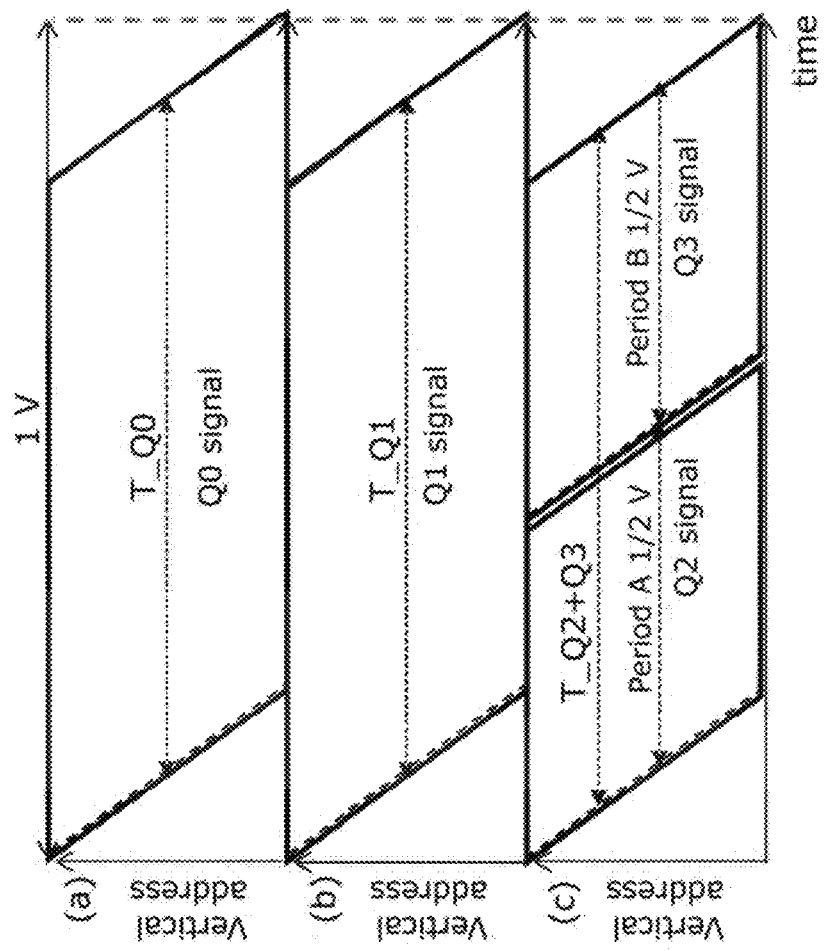
FIG. 32 illustrates timing related to the accumulating of charges of a photodiode and a storage capacitive element.

FIG. 31 and FIG. 32 illustrate timing related to the accumulating of charges of photodiode PD, storage capacitive element C1, and storage capacitive element C2. Photodiode PD is continuously exposed during the 1 V period (1 vertical synchronization period) and the charge amount is Q0. Storage capacitive element C1<N> that receives the charge that overflows from this photodiode PD is continuously exposed during the 1 V period (1 vertical synchronization period) and the charge amount is Q1. The signal of storage capacitive element C2<N> that receives this charge that overflows from storage capacitive element C1<N> is Q2 up to the 0-½ V period, and Q3 up to the ½-1 V period. Moreover, since photodiode PD is completely exposed during the 1 V period, it is possible to capture LED light. Here, for the transition from 0-½ V to ½-1 V, there is a possibility that a non-exposure period may arise at a few H levels, but it is to an extent that does not affect the image quality of the LED light.

[2.5 WDR]

A feature of the present embodiment is that the three frames—the long, middle, and short frames-combined to achieve a WDR are exposed at exactly the same timing and the exact same pixels are used, which inhibits false colors, coloring, and blur.

Figure 19B:
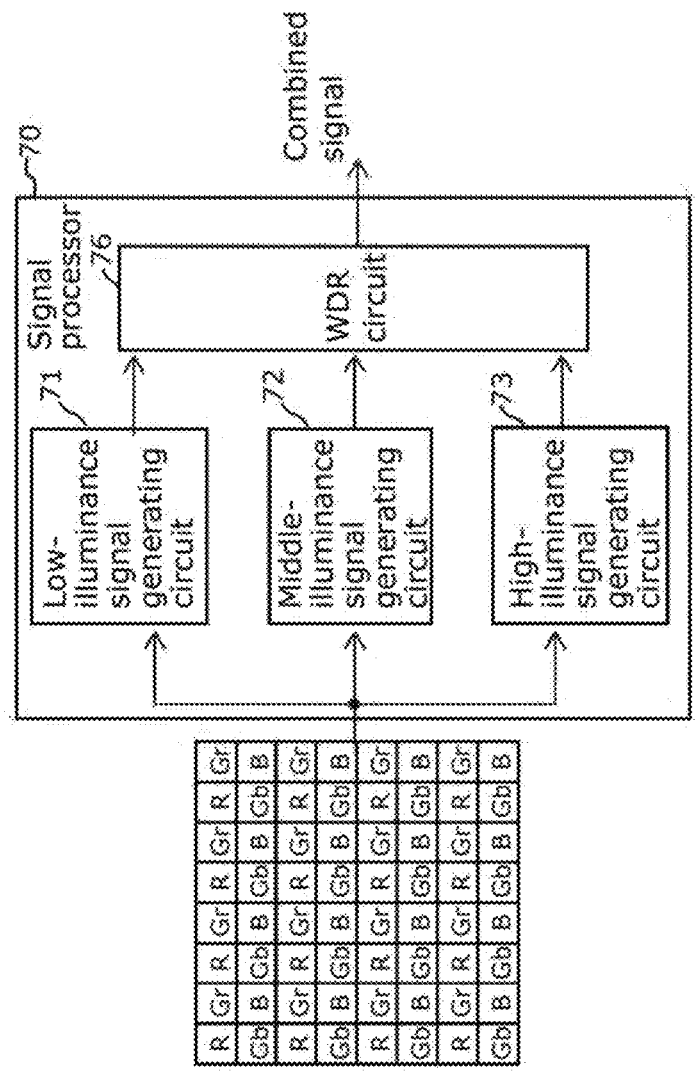
FIG. 19B illustrates an example of a configuration of a signal processor that combines two frames to achieve a WDR.
Figure 33:
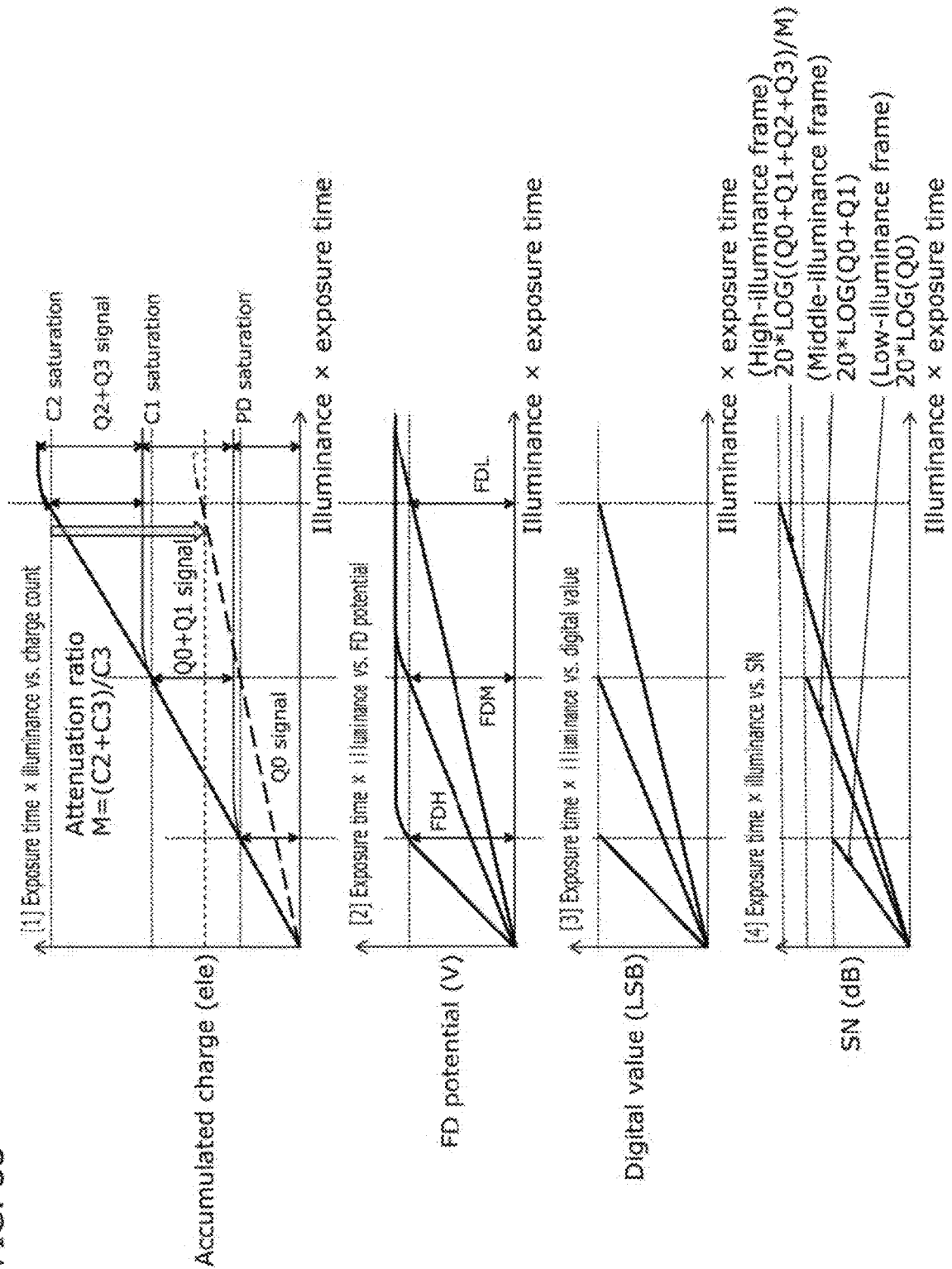
FIG. 33 illustrates [1] charge accumulation level, [2] FD potential, [3] value after AD conversion, and [4] SN relative to the product of illuminance and exposure time.

FIG. 19B and FIG. 33 illustrate an outline of a combining method to achieve a WDR. Signal processor 70 in FIG. 19B includes low-illuminance signal generating circuit 71, middle-Illuminance signal generating circuit 72, high-illuminance signal generating circuit 73, and WDR circuit 76. The WDR is achieved using the signal charge of Q0 as the long exposure (low illuminance), the signal charge of Q0+Q1 as the middle exposure (middle illuminance), and the signal charge of (Q0+Q1+Q2+Q3)/M as the short exposure (high illuminance).

The product of illuminance and exposure time, illuminance at a certain time, or exposure time at a certain illuminance is represented on the horizontal axes of [1], [2], [3], and [4] in FIG. 33. In [1], charge accumulation level is represented on the vertical axis. In [2], FD potential is represented on the vertical axis. In [3], the value after AD conversion is represented on the vertical axis. In [4], SN is represented on the vertical axis.

Figure 34:
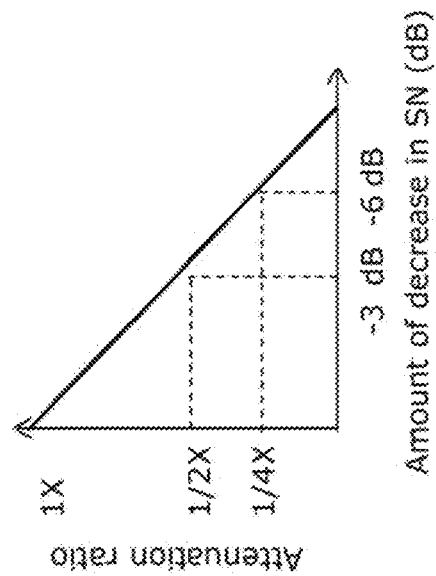
FIG. 34 Illustrates SN degradation that accompanies an attenuation ratio of an exposure (high illuminance).

FIG. 34 illustrates SN degradation that accompanies attenuation ratio M of the short exposure (high illuminance). Since SN is determined by shot noise, for example, when attenuation ratio M is double, the SN at the boundary drops by 3 dB. Although the capacitance ratio of storage capacitive element (C1) and storage capacitive element (C2) can be set at an arbitrary attenuation ratio M, SN degradation observed in the WDR result at the boundary of the frames is the benchmark.

In Embodiment 2, since the WDR is achieved by combining three frames, compared to Embodiment 1, the SN at the connecting part is improved.

FIG. 35 illustrates the signal charge amount and FD potential at the first readout, Read1, of the low-illuminance frame, the second readout, Read2, of the middle-illuminance frame, and the third readout, Read3, of the high-illuminance frame.

FIG. 36 illustrates the relationship between subject illuminance and gain (SN ratio) according to Embodiment 2. FIG. 36 is an actual result of combining wherein the first Read1 is the long frame (low-illuminance frame) of the WDR, the second Read2 is the middle frame (middle-illuminance frame) of the WDR, and the third Read3 is the short frame (high-illuminance frame) of the WDR. The SN at the connecting part of the frames is at least 26 dB and the dynamic range is at least 120 dB.

WDR circuit 76 included in signal processor 70 is illustrated in greater detail in FIG. 19B.

The pixel signal (long) of the first low-illuminance frame, the pixel signal (middle) of the second middle-illuminance frame, and the pixel signal (short) of the third high-illuminance frame are combined. This combining achieves a wide dynamic range function (WDR function), or stated differently, functions to extend the dynamic range.

Regarding the pixel signal (long) of the first low-illuminance frame, the gain within the pixel is set high, and regarding the pixel signal (middle) of the second middle-illuminance frame and the pixel signal (short) of the third high-illuminance frame, the gain within the pixel is set low, whereby noise at low illuminances can be improved and the dynamic range can be extended at high illuminances.

FIG. 37 illustrates advantageous effects achieved by the present embodiment, namely storage capacitive element surface area reduction and dynamic range extension. In this way, with the present embodiment, it is possible to extend the dynamic range with smaller storage capacitive elements, and with respect to high-illuminance LED light as well, it is possible to avoid completely missing received signals. Note that Embodiment 2 is based on case number 1.

[2.6 Pixel Potential Structure]

Figure 28A:
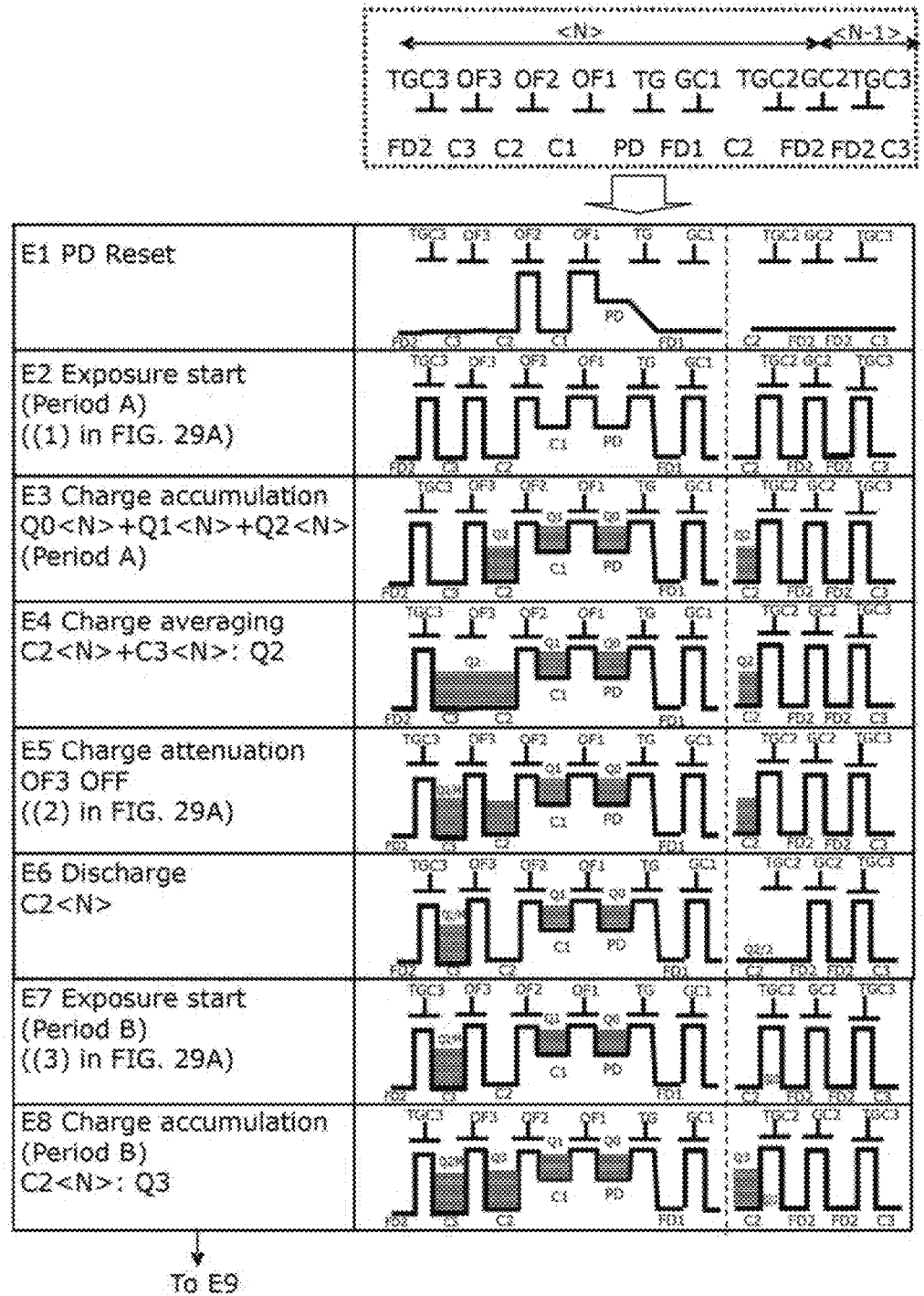
FIG. 28A illustrates potentials at main points in FIG. 27.
Figure 28B:
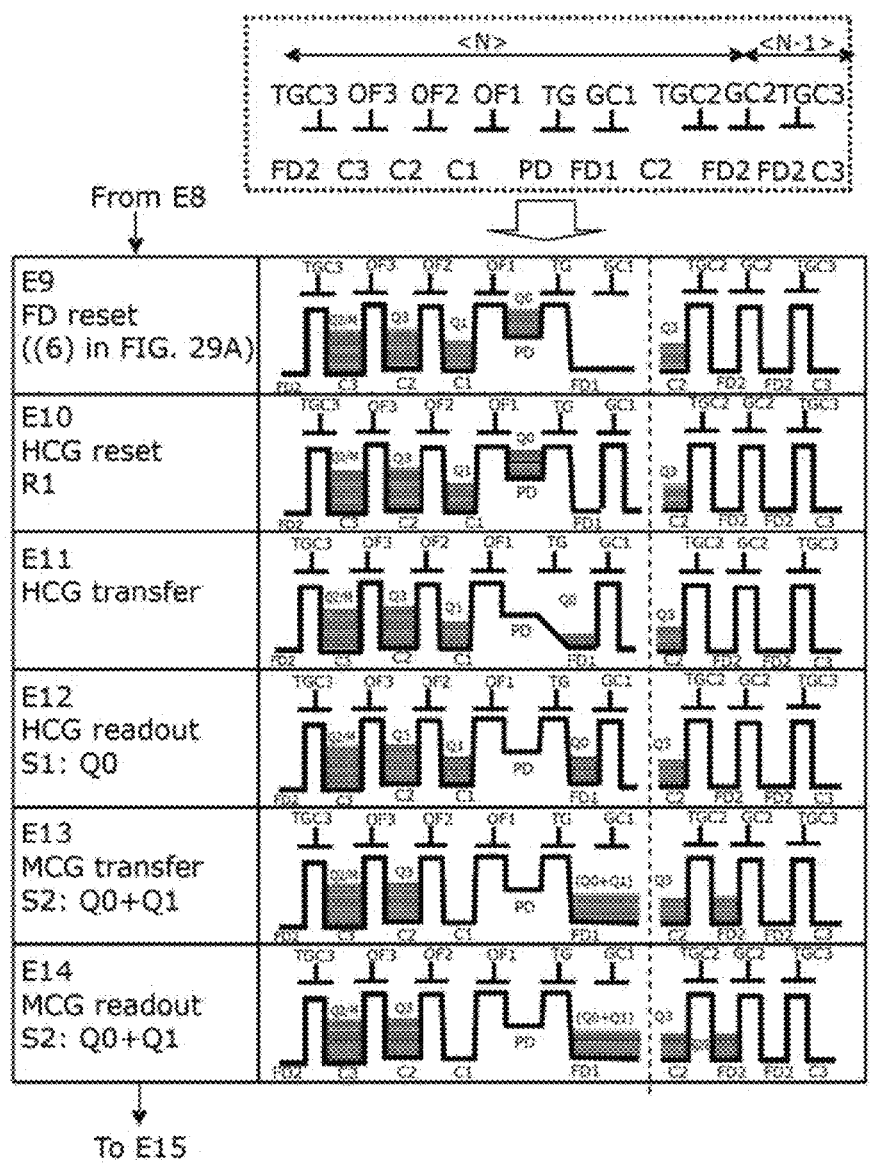
FIG. 28B is a continuation from FIG. 28A illustrating potentials at main points in FIG. 27.
Figure 28C:
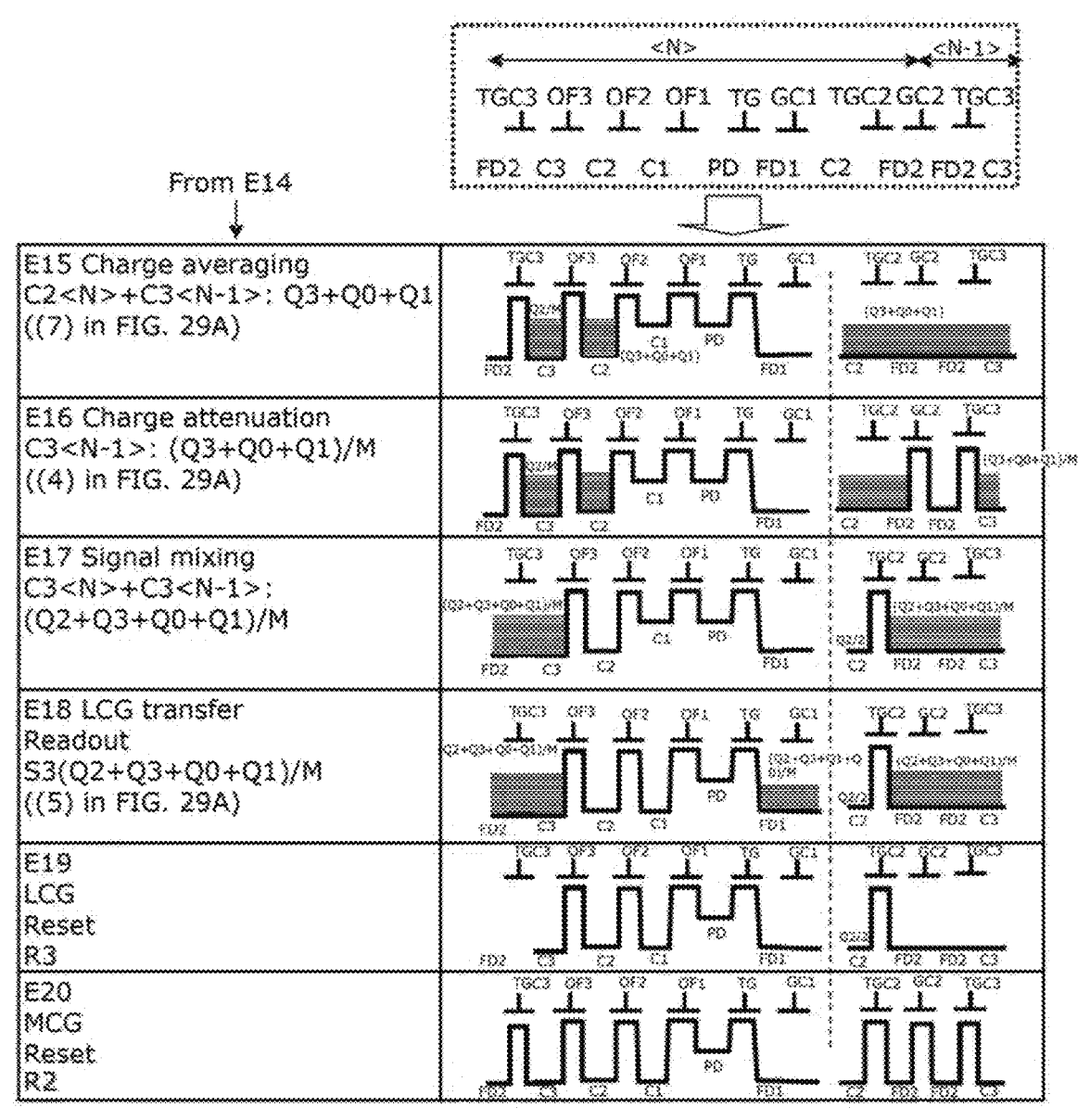

FIG. 28A through FIG. 28C illustrate potentials at main points in FIG. 27.

Events are denoted as E1 through E20, and will now be described in order.

E1 is the reset of FD1. The charge of the PD part is discharged by turning reset transistor RS<N>, transfer transistor TG<N>, and gain control transistor GC1<N> on.

E2 is the start of exposure in period A. Reset transistor RS<N>, transfer transistor TG<N>, and gain control transistor GC1<N> are turned off.

E3 is the accumulation of charge in period A. Signal charge Q0 is accumulated in photodiode PD, and further, Q1 is accumulated in storage capacitive element C1<N>. The charge that overflows is accumulated in storage capacitive element C2<N> via overflow gate OF2.

In E4, charge Q2 accumulated in C2<N> is first averaged for charge redistribution with C3<N>. Overflow gate OF3<N> is turned on.

In E5, attenuation ratio M becomes (C2<N>+C3<N>)/C3<N> as a result of turning overflow gate OF3 off. In other words, the charge of C3<N> becomes Q2/M.

In E6, the charge of C2<N> that is no longer necessary is discharged by turning storage transfer transistor TGC2<N> and reset transistor RS<N> on.

E7 is the start of exposure in period B. Storage transfer transistor TGC2<N> and reset transistor RS are turned off.

E8 is the accumulation of charge in period B. Signal charge Q0 is accumulated in photodiode PD, and Q1 is accumulated in storage capacitive element C1<N>. The charge that overflows, Q3, is accumulated in storage capacitive element C2<N> via overflow gate OF2.

E9 is the reset of FD1. The charge of the FD1 part is discharged by turning reset transistor RS<N> and gain control transistor GC1<N> on.

E10 is the reset of HCG. The HCG state is achieved by turning reset transistor RS<N> and gain control transistor GC1<N> off.

E11 transfers the charge of photodiode PD to the FD1 part by turning transfer transistor TG<N> on.

E12 reads out charge Q0 of photodiode PD accumulated in the FD1 part by turning transfer transistor TG<N> off (HCG signal).

E13 reads out charge Q1 of storage capacitive element C1<N> and averages and redistributes it with Q0 of the FD1 part.

In E14, a signal for MCG is read out as Q0+Q1 (MCG signal).

E15 turns on storage transfer transistors TGC2<N> and TGC3<N-1>, and averages Q0+Q1, charge Q3 of C2<N>, and charge zero of C3<N-1>.

In E16, storage transfer transistors TGC2<N> and TGC3<N-1> are turned off to perform charge redistribution. The charge of C3<N-1> becomes (Q3+Q0+Q1)/M.

In E17 through E18, charge amount Q2/M of storage capacitive element C3<N> and charge amount (Q0+Q1+Q3)/M of C3<N-1> are mixed, whereby the total charge becomes (Q0+Q1+Q2+Q3)/M (LCG signal). Here, attenuation ratio M=(C2<N>+C3<N-1>)/C3<N-1>.

In E19, the signal of FD1 is read out.

In E20, FD1 and FD2 are reset and the readout operation ends.

Problems related to the overflow of the charge from photodiode PD are the mixing of colors and linearity deviation that accompany the leaking of charge to other elements. Accordingly, the following condition is necessary regarding potential barrier height at each overflow. The charge that overflows from photodiode PD flows in this order: overflow gates OF1, 2<transfer transistor TG, storage transfer transistors TGC1, 2<separation layer.

Note that regarding the overflow gate voltage in particular, there tends to be variations in saturation levels caused by manufacturing variances. Accordingly, regarding the voltages of overflow gate OF1 and overflow gate OF2 in particular, before shipment, it is preferable that trimming is performed to inhibit variations in saturation levels.

Embodiment 3

Solid-state imaging apparatus 100 according to Embodiment 3 will be described with a focus on the differences from Embodiment 1. In one example of a configuration of solid-state imaging apparatus 100, the number of controls for horizontal scan line groups 15 differ from Embodiment 1, but all other aspects are the same as Embodiment 1.

[3.1 Pixel Circuit Configuration Example]

An example of a configuration of pixel circuit 3 will be described.

Figure 38A:
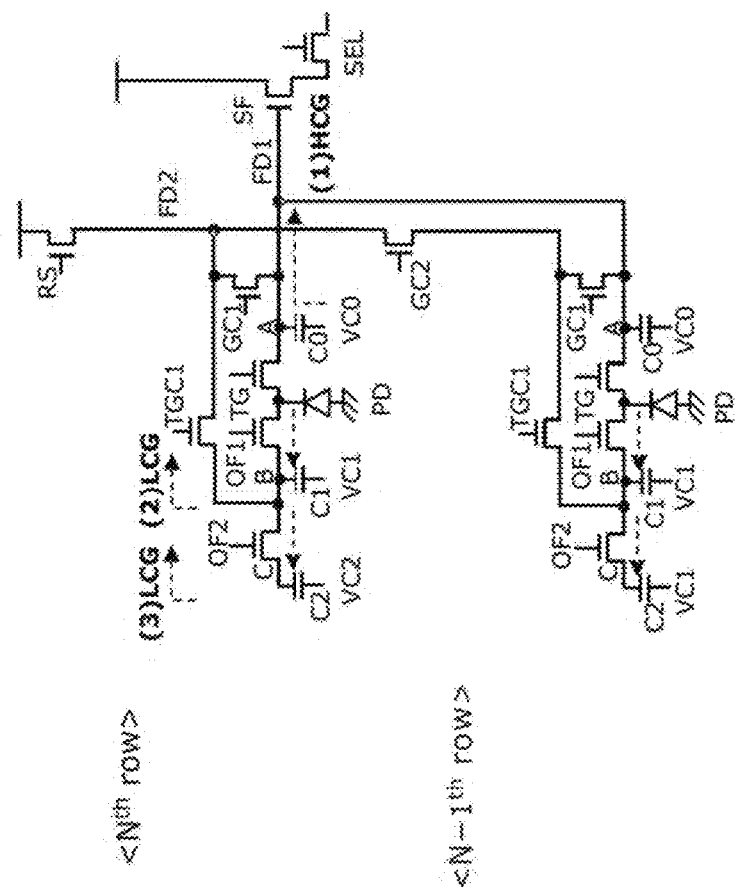
FIG. 38A illustrates an example of a circuit configuration of the vertical two-pixel single-cell structure according to Embodiment 3.
Figure 38B:
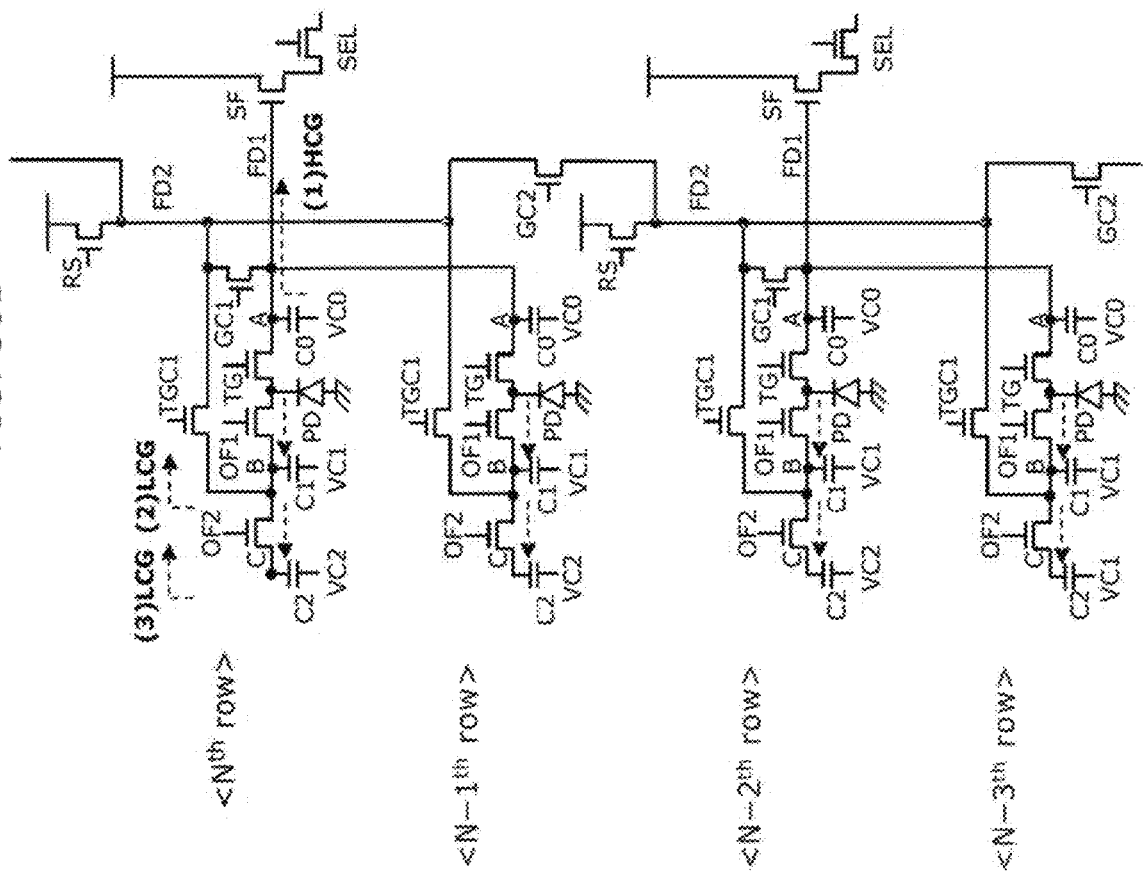
FIG. 38B illustrates an example of a circuit configuration of the vertical four-pixel single-cell structure according to Embodiment 3.

FIG. 2 illustrates an RGB Bayer configuration, FIG. 38A illustrates a vertical two-pixel single-cell circuit configuration of the RGB Bayer configuration, and FIG. 38B illustrates a vertical four-pixel single-cell circuit configuration of the RGB Bayer configuration. Control lines are the same in each of the configurations.

In FIG. 38A and FIG. 38B, with respect to the configuration of Embodiment 3, storage capacitive element C2 is included, but storage transfer transistor TGC2 is not included.

As a substitute for storage transfer transistor TGC2, overflow gate OF2 is given a device structure that allows for charge to flow both ways, and the charge of storage capacitive element C2 can achieve equivalent advantageous effects by turning overflow gate OF2 and storage transfer transistor TGC1 on.

Readout control line φTGC2 is omitted from horizontal scan line group 15.

Overflow gate OF1 is used both as an overflow gate and a switching transistor that turns on and off according to readout control signal φOF1. When readout control signal φOF1 is high-level, the signal charge resulting from photoelectric conversion by photodiode PD is transferred to storage capacitive element C1 via overflow gate OF1.

When the signal charge resulting from photoelectric conversion by photodiode PD overflows, the signal charge is transferred to storage capacitive element C1 by adjusting the control voltage of overflow gate OF1. Alternatively, the signal charge is transferred when the signal charge exceeds a preset potential.

Overflow gate OF2 is used both as an overflow gate and a switching transistor that turns on and off according to readout control signal φOF2. When readout control signal φOF2 is high-level, the signal charge resulting from photoelectric conversion by photodiode PD is transferred to storage capacitive element C2 via overflow gate OF2.

The signal charge resulting from photoelectric conversion is transferred to storage capacitive element C2 by adjusting the preset control voltage of overflow gate OF2 when the signal charge overflows from storage capacitive element C1. Alternatively, charge redistribution can be performed by turning the control voltage of overflow gate OF2 on/off. Note that the attenuation ratio in this case is M=(C1+C2)/C2.

The signal charge of storage capacitive element C1<N> resulting from photoelectric conversion can be redistributed to capacitive element C1<N-1> whose charge has already been discharged by turning the control voltage of gain control transistor GC2 on/off. Note that attenuation ratio M in this case is (C1<N>+C1<N-1>)/C1<N>.

[3.2 Example of Readout Operation by Correlated Double Sampling]

Figure 40B:
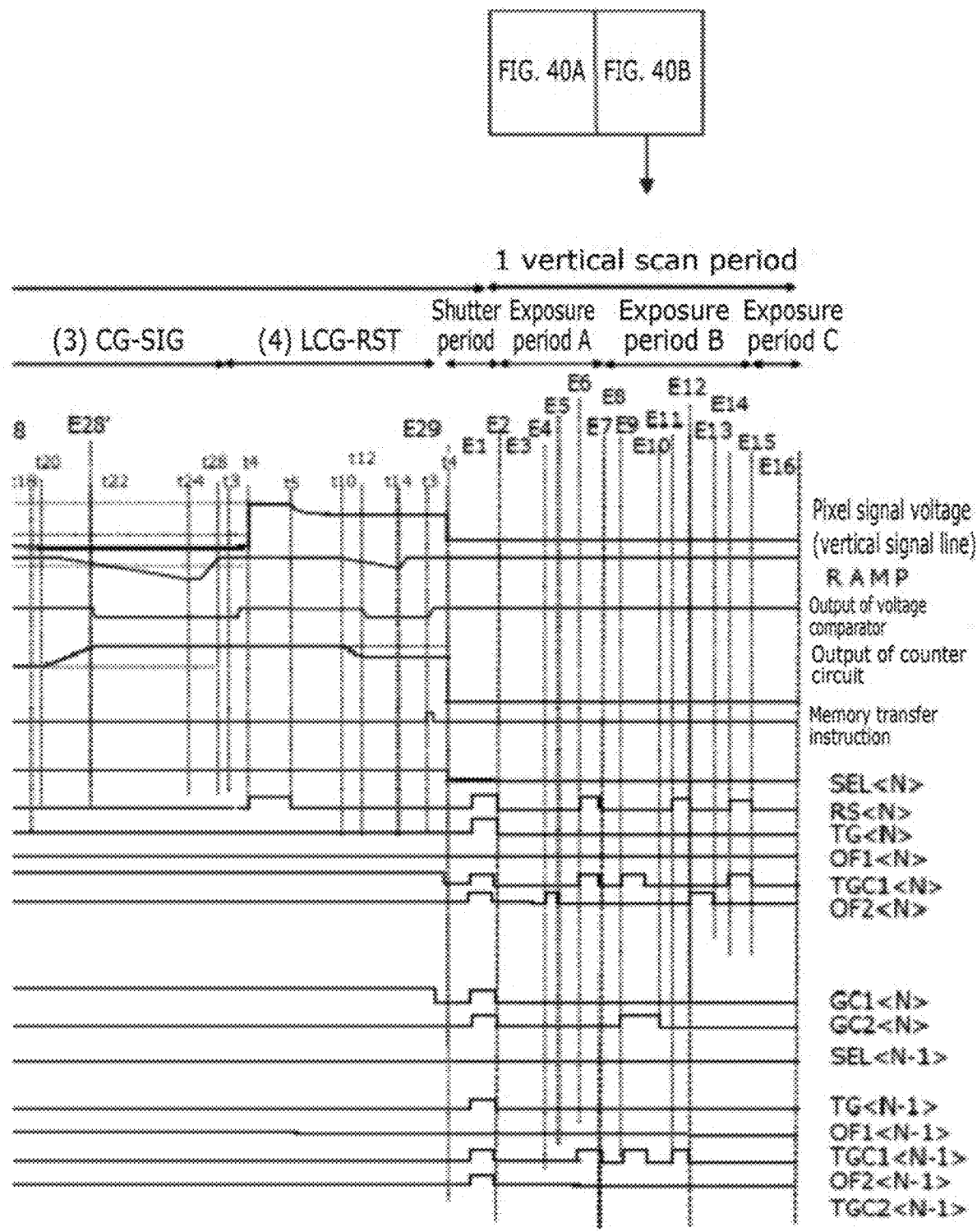
FIG. 40B is a continuation of the time chart of FIG. 40A illustrating an example of pixel readout operations accompanied by gain control according to Embodiment 3.

FIG. 39 illustrates pixel signal readout order in CDS in 1 H period according to Embodiment 3. FIG. 39 illustrates CDS order in 1 H, which is from HCG (R: reset component) to HCG (S: signal component) to LCG (S: signal component) and to LCG (R: reset component). FIG. 40A and FIG. 40B illustrate FIG. 9 as a base modified to this CDS order. In the transition from HCG (R: reset component) to HCG (S: signal component), pixel reset noise is cancelled. However, in the transition from LCG (S: signal component) to LCG (R: reset component), the DC offset (reset coupling) can be removed, but the pixel reset noise cannot be cancelled, and remains as kTC noise.

Figure 49:
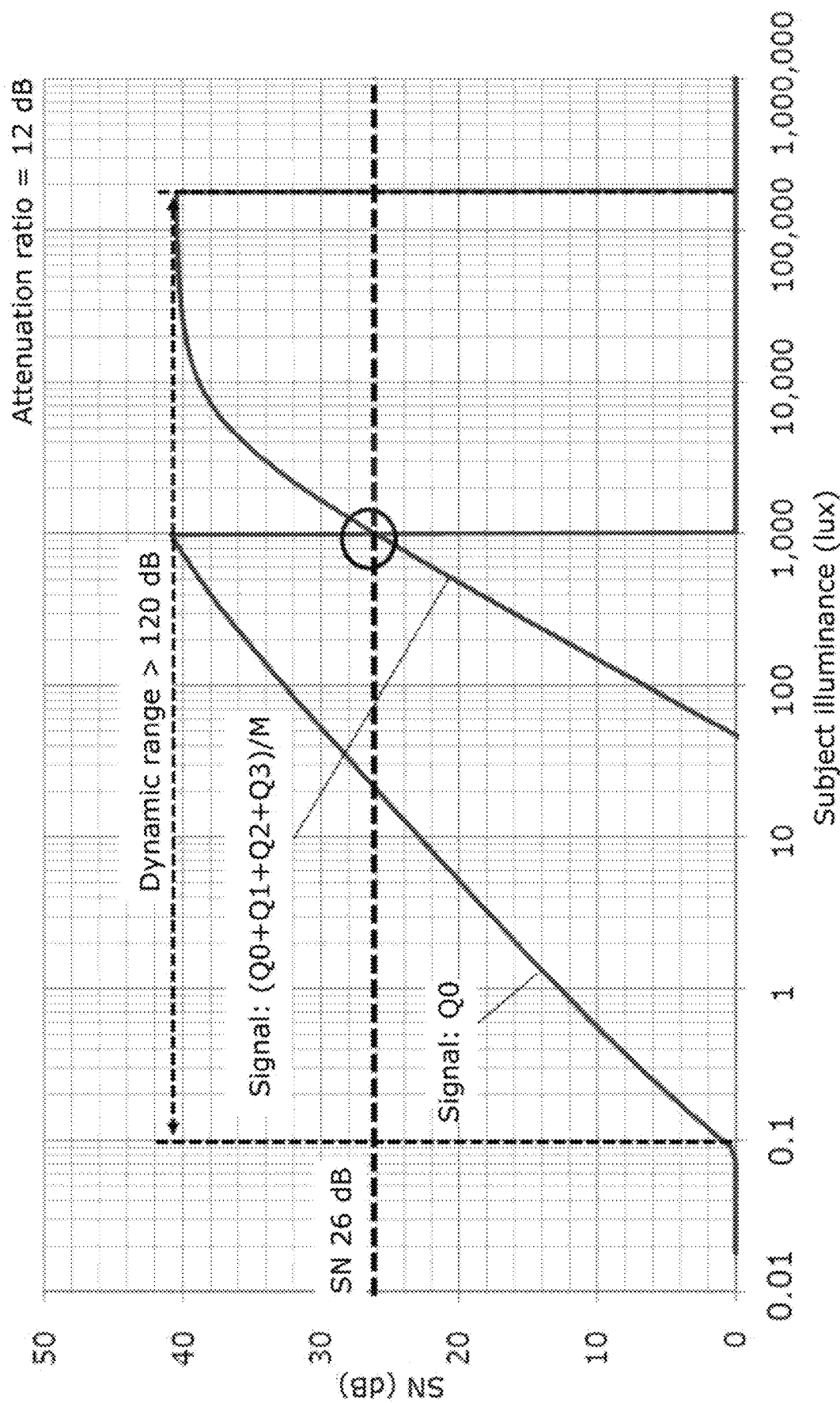
FIG. 49 illustrates the relationship between subject illuminance and gain (SN ratio) according to Embodiment 3.

The kTC noise in this short exposure (high illuminance) appears on the low signal side. For example, this is illustrated in FIG. 49. Here, kTC noise is expressed as √(kTC) at charge amount.

Settings must be configured so that this noise is sufficiently smaller than the signal level. Accordingly, at the boundary between the short exposure (high illuminance) and the long exposure (low illuminance), it is necessary to sufficiently improve the latter SN more than the former SN.

[3.3 Readout Operation Accompanied by Gain Control]

Figure 42A:
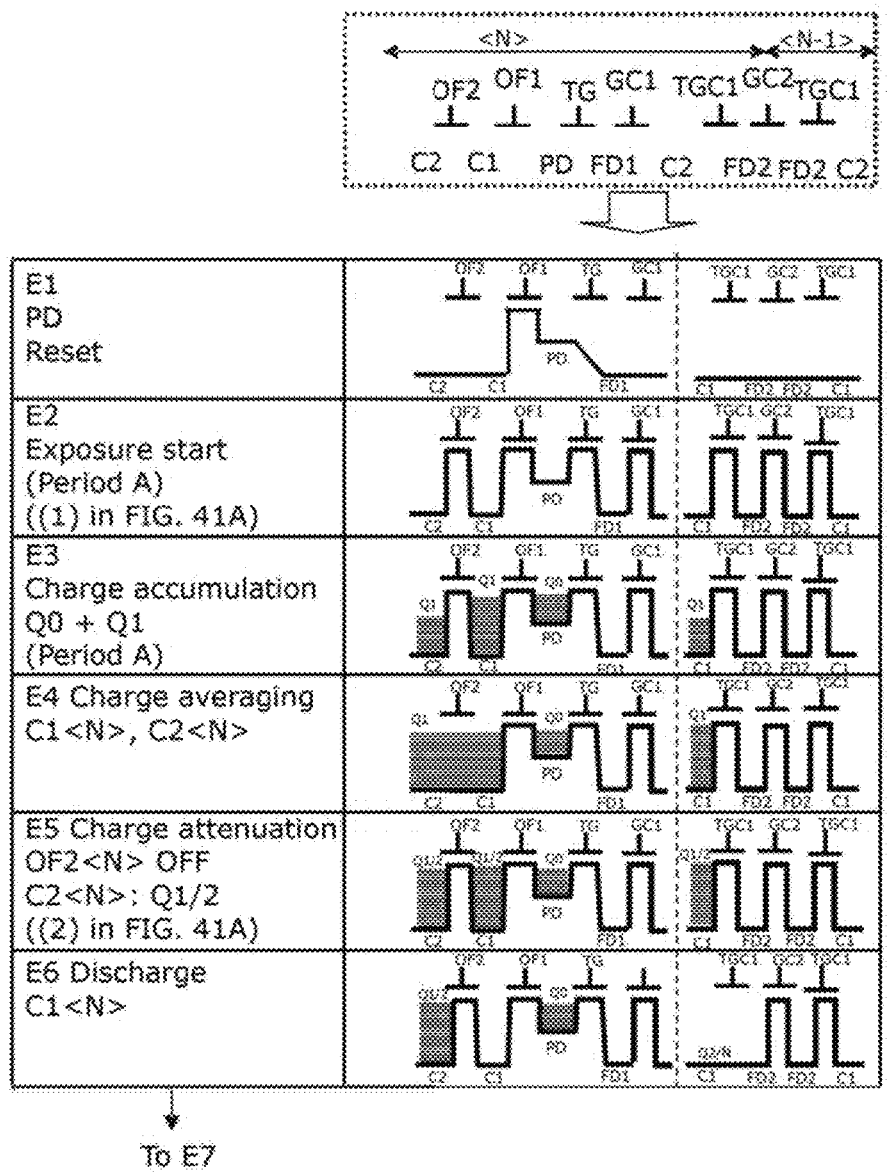
FIG. 42A illustrates potentials at main points in FIG. 40A and FIG. 40B.
Figure 42B:
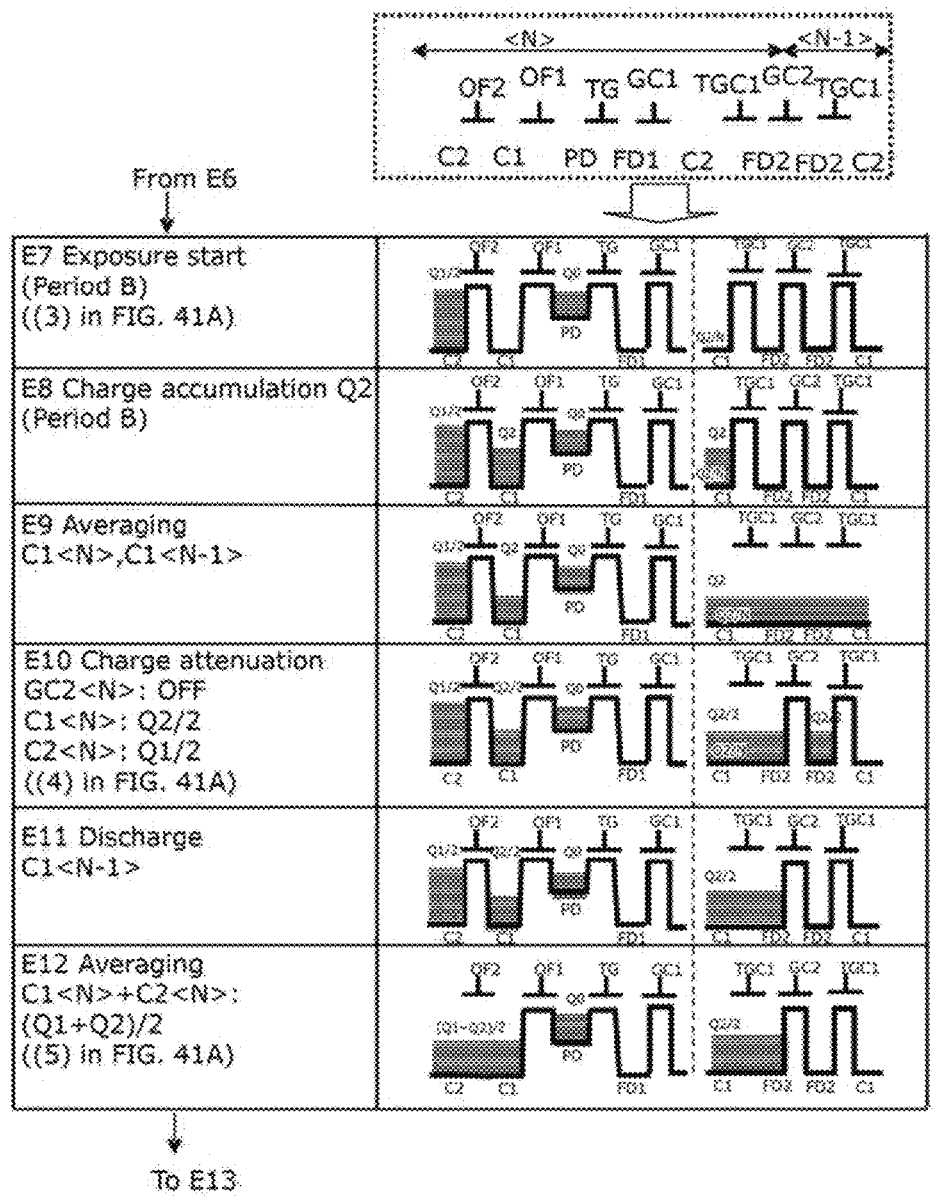
FIG. 42B is a continuation from FIG. 42A illustrating potentials at main points in FIG. 40A and FIG. 40B.
Figure 42C:
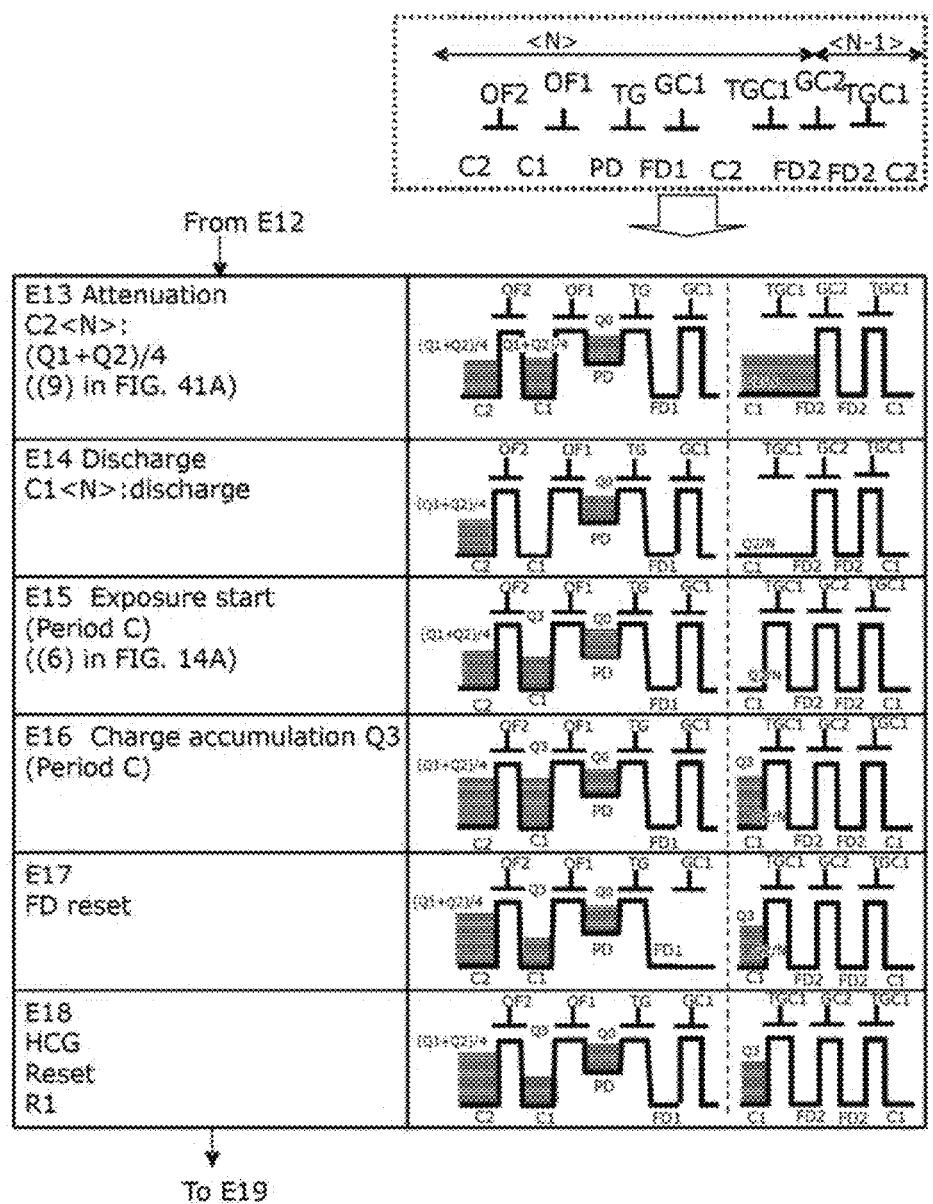
FIG. 42C is a continuation from FIG. 42B illustrating potentials at main points in FIG. 40A and FIG. 40B.
Figure 42D:
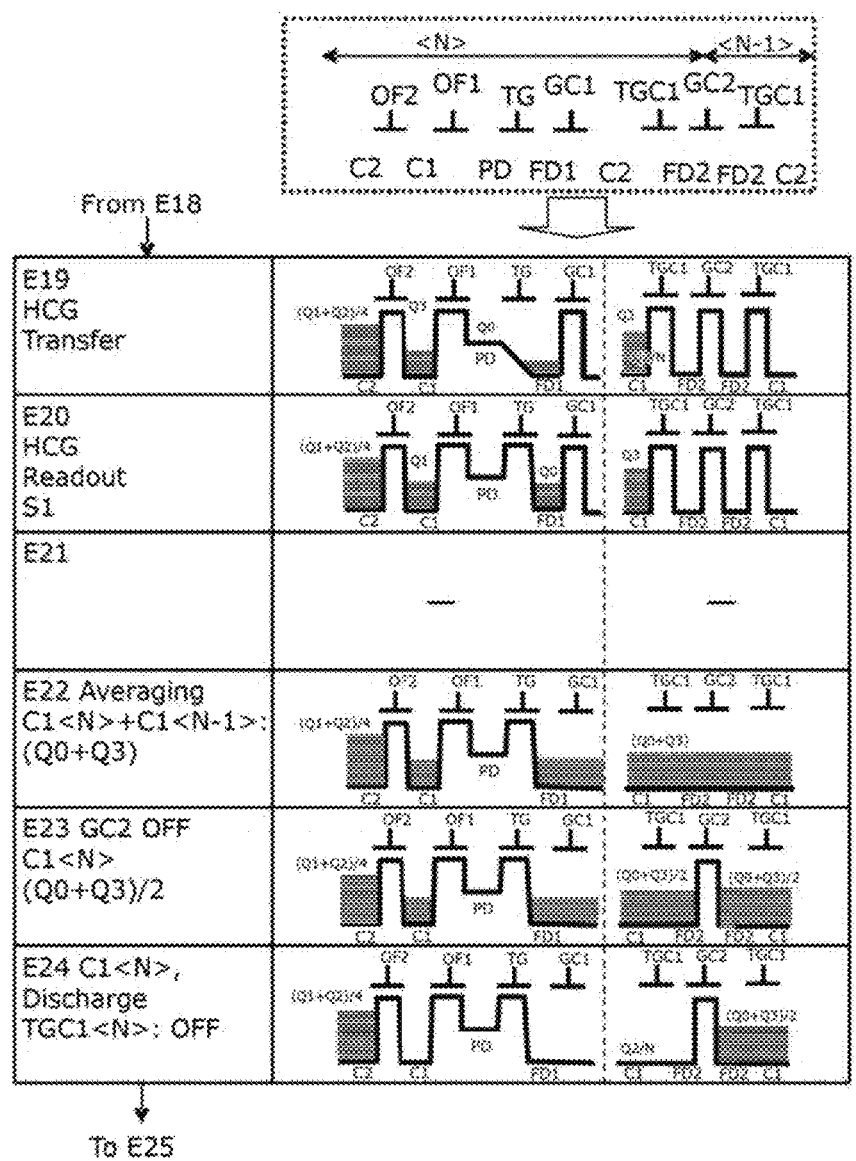
FIG. 42D is a continuation from FIG. 42C illustrating potentials at main points in FIG. 40A and FIG. 40B.
Figure 42E:
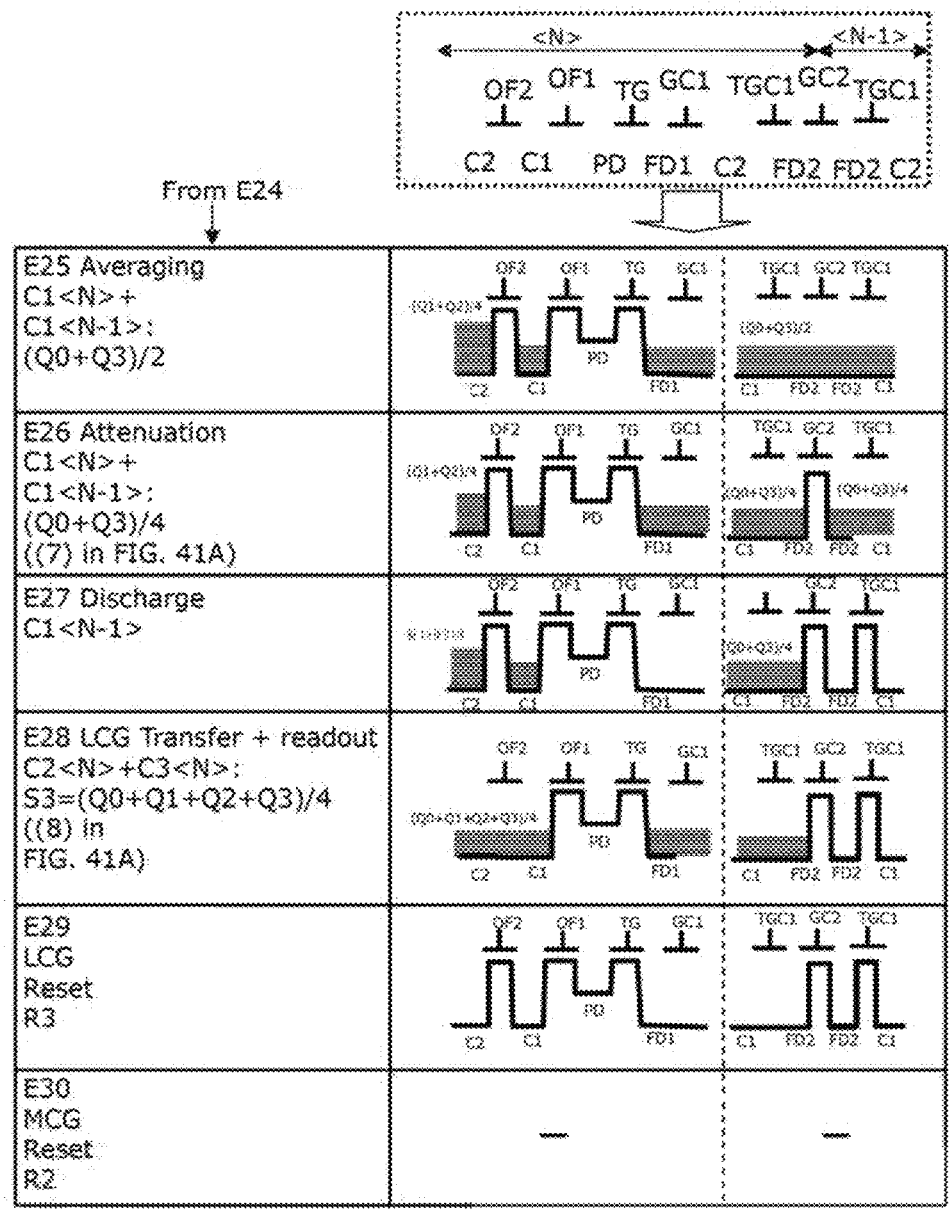
FIG. 42E is a continuation from FIG. 42D illustrating potentials at main points in FIG. 40A and FIG. 40B.
Figure 43:
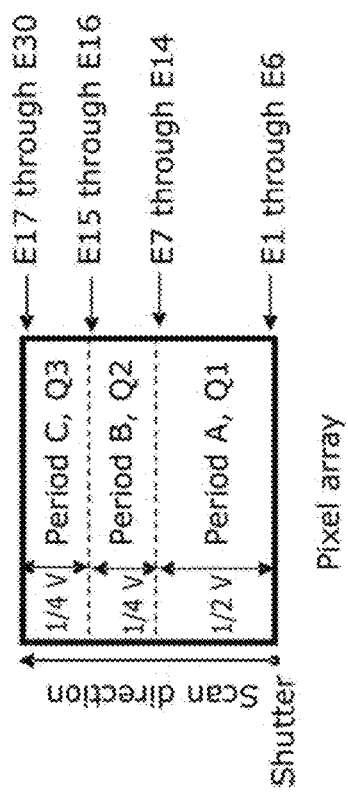
FIG. 43 is an explanatory diagram of the scan periods in FIG. 41A.

FIG. 40A and FIG. 40B are time charts illustrating examples of pixel readout operations accompanied by gain control according to Embodiment 3, with the main part at 1 V period (1 vertical synchronization period) enlarged. In FIG. 40A and FIG. 40B, t* indicates the event number in FIG. 9. E* indicates the event number in FIG. 42A, FIG. 42B, and FIG. 42C.

Note that the content of FIG. 40A and FIG. 40B is non-limiting so long as the timing is a timing that achieves the same advantageous effects as the present embodiment.

Gain GC1 that converts the signal charge at floating diffusion layer FD1 into voltage can be switched between a high gain and a low gain according to the on/off state of gain control transistor GC1. The period from HCG (R: reset component) to HCG (S: signal component) indicates a readout operation of a signal charge from photodiode PD to floating diffusion layer FD1 in a state in which the conversion gain of floating diffusion layer FD1 is high. The period from LCG (S: signal component) to LCG (R: reset component) indicates a readout operation of a signal charge from storage capacitive element C1 and storage capacitive element C2 to floating diffusion layer FD2 in a state in which the conversion gain of floating diffusion layer FD2 is low.

In order to charge redistribute the <N> row pixel signal and the <N−1> row pixel signal, gain control transistor GC2 performs mixing/separating (explanation of the detailed potential figures will be given later).

[3.4 Concept of Pixel Mixing]

FIG. 41A, FIG. 41B, FIG. 41C, and FIG. 43 illustrate the concept of pixel mixing. FIG. 41A is an explanatory diagram illustrating the concept of pixel mixing. FIG. 41B is for explaining each point in FIG. 41A. FIG. 41C is for explaining each point in FIG. 41A. Note that explanation of the detailed potential figures will be given later.

First, the charge that overflows from photodiode PD is simultaneously accumulated in C1<N> and C2<N> ((1) in the figures), and the accumulated charge increases as the exposure time increases. If the capacitive element that accumulates the charge is insufficient, 100,000 lux cannot be received, whereby the dynamic range is insufficient.

However, in the present embodiment, charge amount Q1 of C1<N> in a ½ V period (½ vertical synchronization period) corresponding to half of a 1 V period (1 vertical synchronization period) is redistributed with C2<N>, whereby the charge amount of C2<N> becomes Q1/2 ((2) in the figures), and is then held. Thereafter, the no longer necessary charge of C1<N> is discharged.

Next, the accumulation into C1<N> is started once again from the ½ V period (½ vertical synchronization period) ((3) in the figures). Then, in the ¾ V period (¾ vertical synchronization period), the charge amount of C1<N> becomes Q2, the charge is redistributed with C1<N−1>, whereby the charge amount of C1<N> becomes Q2/2 ((4) in the figures). Thereafter, the no longer necessary charge of C1<N−1> is discharged.

Next, regarding the charge amount of C2<N>, the charge amount Q1/2 of C2<N> and the charge amount Q2/2 of C1<N> are combined, whereby the total charge becomes (Q1+Q2)/2 ((5) in the figures).

Then, as a result of turning overflow gate OF2 off, charge is redistributed between C2<N> and C1<N>, whereby the charge amount of C2<N> becomes (Q1+Q2)/4 ((9) in the figures), and is then held.

Furthermore, the accumulation into C1<N> is started once again from ¾ V (¾ vertical synchronization period) ((6) in the figures).

On the other hand, charge amount Q0 of photodiode PD read out to the FD2 part and charge amount Q3 of C1<N> are redistributed between C1<N> and C1<N−1>, whereby the charge amount of C1<N> becomes (Q0+Q3)/2. As a result of turning gain control transistor GC2 off, charge is further redistributed between C1<N> and C1<N−1>, whereby the charge amount of C1<N> becomes (Q0+Q3)/4 ((7) in the figures) and is then held.

Then, finally, charge (Q1+Q2)/4 of C2<N> and charge (Q0+Q3)/4 of C1<N> are read out and FD mixed, whereby a signal charge of (Q0+Q1+Q2+Q3)/4 ((8) in the figures) can be obtained.

A feature of the present embodiment is that a storage capacitive element is driven using the capacitance of an adjacent row whose charge has already been discharged to reduce capacitor surface area.

A feature of the exposure method according to the present embodiment is that LED light can be captured with certainty in a 1 V exposure period since a continuous exposure method (PD and storage capacitive element) is employed, whereas LED light is failed to be captured if an intermittent exposure method via a chopper or the like is employed.

Figure 44:
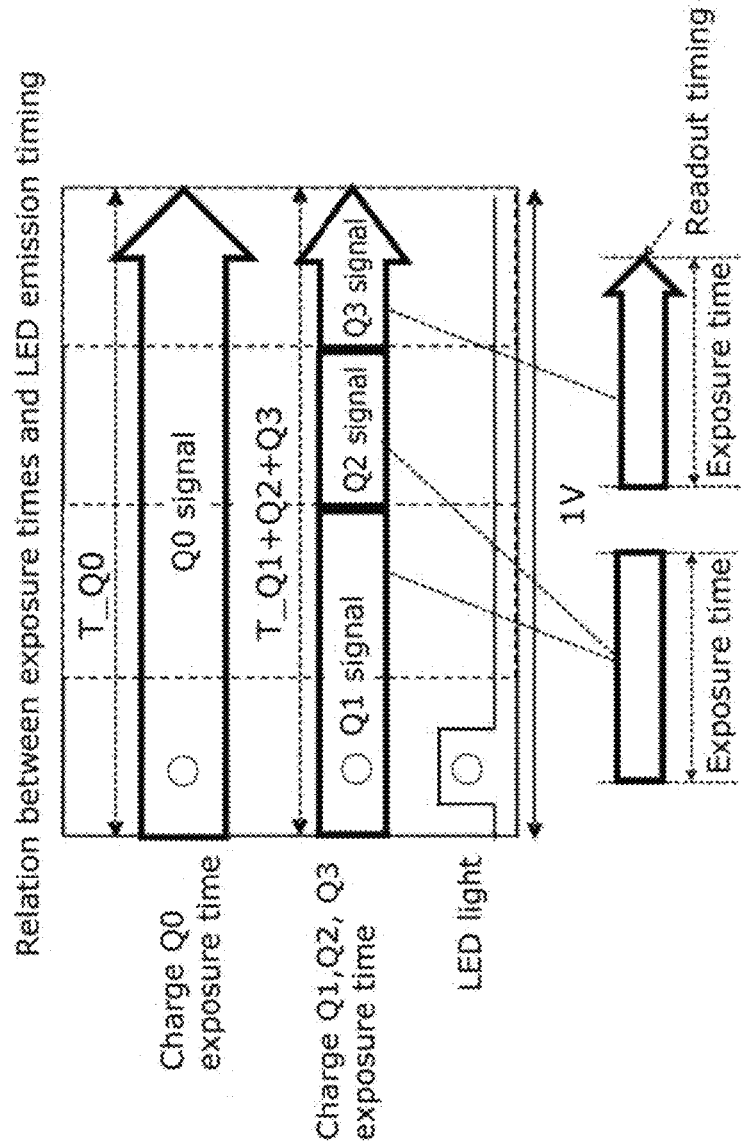
FIG. 44 illustrates timing related to the accumulating of charges of a photodiode and a storage capacitive element.
Figure 45:
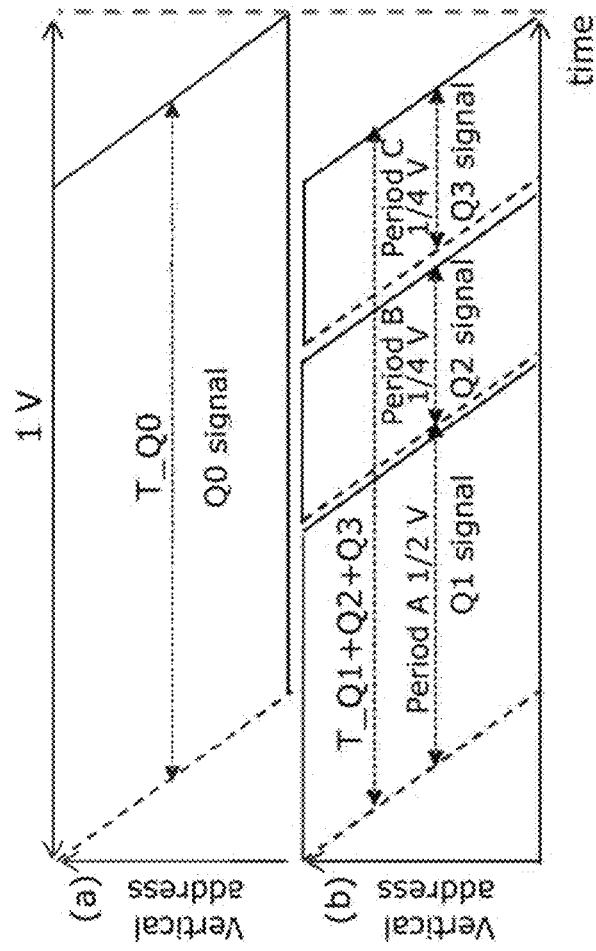
FIG. 45 illustrates timing related to the accumulating of charges of a photodiode and a storage capacitive element.

FIG. 44 and FIG. 45 illustrate timing related to the accumulating of charges of photodiode PD and storage capacitive element C1. Photodiode PD is continuously exposed during the 1 V period (1 vertical synchronization period) and the charge amount is Q0. The signal of storage capacitive element C1<N> that receives this charge that overflows from photodiode PD is Q1 up to 0-½ V, Q2 up to ½-¾ V, and Q3 up to ¾-4/4 V. Moreover, since photodiode PD is completely exposed during the 1 V period, it is possible to capture LED light. Here, for the transitions from 0-½ V to ½-¾ V and to ¾-4/4 V, there is a possibility that a non-exposure period may arise at a few H levels, but it is to an extent that does not affect the image quality of the LED light.

[3.5 WDR]

A feature of the present embodiment is that the two frames—the long frame (low-illuminance frame) and the short frame (high-illuminance frame)—combined to achieve a WDR are exposed at exactly the same timing and the exact same pixels are used, which inhibits false colors, coloring, and blur.

Figure 46:
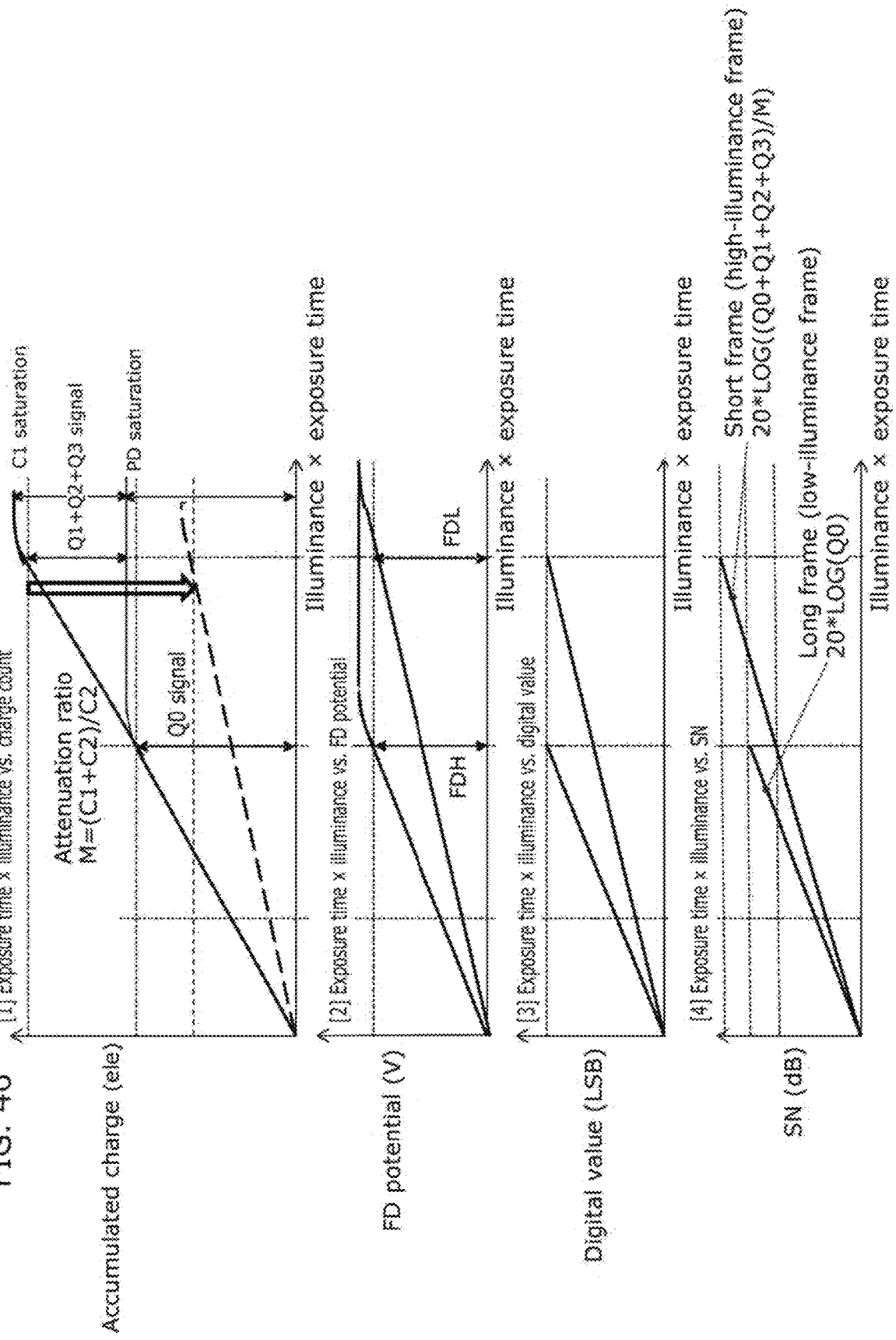
FIG. 46 illustrates [1] charge accumulation level, [2] FD potential, [3] value after AD conversion, and [4] SN relative to the product of illuminance and exposure time.

FIG. 19A and FIG. 46 illustrate an outline of a combining method to achieve a WDR. The WDR is achieved using the signal charge of Q0 as the long exposure (low illuminance) and the signal charge of (Q0+Q1+Q2+Q3)/M as the short exposure (high illuminance).

The product of illuminance and exposure time, illuminance at a certain time, or exposure time at a certain illuminance is represented on the horizontal axes of [1], [2], [3], and [4] in FIG. 46. In [1], charge accumulation level is represented on the vertical axis. In [2], FD potential is represented on the vertical axis. In [3], the value after AD conversion is represented on the vertical axis. In [4], SN is represented on the vertical axis.

Figure 47:
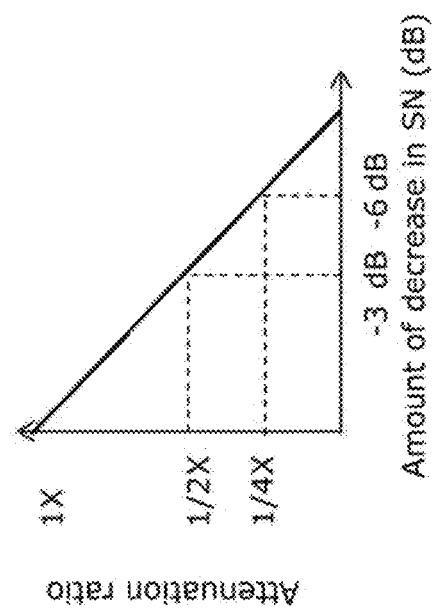
FIG. 47 illustrates SN degradation that accompanies an attenuation ratio of an exposure (high illuminance).

FIG. 47 illustrates SN degradation that accompanies attenuation ratio M of the short exposure (high illuminance).

Since SN is determined by shot noise, for example, when attenuation ratio M is double, the SN at the boundary drops by 3 dB. Although the capacitance ratio of storage capacitive element (C1) and storage capacitive element (C2) can be set at an arbitrary attenuation ratio M, SN degradation observed in the WDR result at the boundary of the frames is the benchmark.

FIG. 48 illustrates signal charge amount and FD potential at the first readout, Read1, and the second readout, Read2.

FIG. 49 is an actual result of combination wherein the first Read1 is the long frame (low-illuminance frame) of the WDR and the second Read2 is the short frame (high-illuminance frame) of the WDR. The SN at the connecting part of the frames is at least 26 dB and the dynamic range is at least 120 dB.

WDR circuit 76 included in signal processor 70 is illustrated in greater detail in FIG. 19A.

The pixel signal (long) of the first low-illuminance frame and the pixel signal (short) of the second high-illuminance frame are combined. This combining achieves a wide dynamic range function (WDR function), or stated differently, functions to extend the dynamic range.

Moreover, regarding the pixel signal (long frame) of the first low-illuminance frame, the gain within the pixel is set high, and regarding the pixel signal (short frame) of the second high-Illuminance frame, the gain within the pixel is set low, whereby noise at low illuminances is improved and the dynamic range is extended at high illuminances.

FIG. 50 illustrates advantageous effects achieved by the present embodiment, namely storage capacitive element surface area reduction and dynamic range extension. In this way, with the present embodiment, it is possible to extend the dynamic range with smaller storage capacitive elements, and with respect to high-illuminance LED light as well, it is possible to avoid completely missing received signals. Note that Embodiment 3 is based on case number 1.

Moreover, case number 0 is omitted since it is smaller in terms of area size than case number 1.

[3.6 Pixel Potential Structure]

FIG. 42A through FIG. 42E illustrate potentials at main points in FIG. 40A and FIG. 40B.

Events are denoted as E1 through E30, and will now be described in order. Moreover, here, for simplification, attenuation ratio M=2.

E1 is the reset of FD1. The charge of the PD part is discharged by turning reset transistor RS<N>, transfer transistor TG<N>, and gain control transistor GC1<N> on.

E2 is the start of exposure in period A. Reset transistor RS<N>, transfer transistor TG<N>, and gain control transistor GC1<N> are turned off.

E3 is the accumulation of charge in period A. Signal charge Q0 is accumulated in photodiode PD, and the charge that overflows is accumulated in storage capacitive element C1<N> via overflow gate OF1<N>.

E4 averages the charge accumulated in C1<N> with C2<N>.

In E5, the attenuation ratio is M=(C1<N>+C2<N>)/C2<N> due to charge redistribution as a result of turning overflow gate OF2<N> off. In other words, if C1<N> and C2<N> are equal, the charge amount of C2<N> becomes Q1/2.

In E6, the charge of C1<N> that is no longer necessary is discharged by turning storage transfer transistor TGC1<N> and reset transistor RS<N> on.

E7 is the start of exposure in period B. Storage transfer transistor TGC1<N> and reset transistor RS<N> are turned off.

E8 is the accumulation of charge in period B. Signal charge Q0 is accumulated in photodiode PD, and the charge that overflows is accumulated in storage capacitive element C1<N> via overflow gate OF1<N>.

E9 averages C1<N> and C1<N-1> by turning gain control transistor GC2<N> on.

E10 charge redistributes C1<N> and C1<N-1> by turning gain control transistor GC2<N> off. The accumulated charge of C1<N> becomes Q2/2.

E11 is the reset of FD2. The charge of C1<N-1> is discharged by turning reset transistor RS<N> and gain control transistor GC2<N> on.

E12 turns overflow gate OF2<N> on and averages Q2/2 of C1<N> and Q1/2 of C2<N>. In other words, as a result of the averaging, C1<N>+C2<N>=(Q1+Q2)/2.

E13 turns overflow gate OF2<N> off to perform charge redistribution between C1<N> and C2<N>, whereby C2<N> becomes (Q1+Q2)/4.

In E14, storage transfer transistor TGC1<N> and reset transistor RS<N> are turned on, which discharges the charge of C1<N>.

E15 is the start of exposure in period C. Storage transfer transistor TGC1<N> and reset transistor RS<N> are turned off.

E16 is the accumulation of charge in period C. Signal charge Q0 is accumulated in photodiode PD, and the charge that overflows is accumulated in storage capacitive element C1<N> via overflow gate OF1.

E17 is the reset of FD1. The charge of the FD1 part is discharged by turning reset transistor RS<N> and gain control transistor GC1<N> on.

E18 is the reset of HCG. The HCG state is achieved by turning reset transistor RS<N> and gain control transistor GC1<N> off.

E19 transfers the charge of photodiode PD to the FD1 part by turning transfer transistor TG<N> on.

E20 reads out the charge of photodiode PD accumulated in the FD1 part by turning transfer transistor TG<N> off (HCG signal).

In E22, averaging is performed by turning gain control transistor GC2, storage transfer transistor TGC1<N>, and storage transfer transistor TGC1<N-1> on, whereby C1<N>+C1<N-1>=Q0+Q3.

In E23, attenuation ratio M resulting from charge redistribution by turning gain control transistor GC2 off becomes (C1<N>+C2<N>)/C2<N>, and thus C1<N>=(Q0+Q3)/2.

In E24, the charge of C1<N> that is no longer necessary is discharged by turning storage transfer transistor TGC1<N> and reset transistor RS on.

In E25, averaging is performed once again by turning gain control transistor GC2, storage transfer transistor TGC1<N>, and storage transfer transistor TGC1<N-1> on.

In E26, charge is redistributed between C1<N> and C1<N-1> by turning gain control transistor GC2, storage transfer transistor TGC1<N>, and storage transfer transistor TGC1<N-1> off, whereby attenuation ratio M becomes (C1<N>+C1<N-1>)/C1<N>, and thus C1<N>=(Q0+Q3)/4.

In E27, the charge of C1<N-1> that is no longer necessary is discharged by turning storage transfer transistor TGC1<N-1> and reset transistor RS<N-1> on.

In E28, C2<N>=(Q1+Q2)/4 and C1<N>=(Q0+Q3)/4 are mixed by turning overflow gate OF2<N> and storage transfer transistor TGC1<N> on, and thus C1<N>+C2<N>=(Q0+Q1+Q2+Q3)/4 (for LCG).

In E29, FD1 and FD2 are reset and the readout operation ends.

Problems related to the overflow of the charge from photodiode PD are the mixing of colors and linearity deviation that accompany the leaking of charge to other elements. Accordingly, the following condition is necessary regarding potential barrier height at each overflow. The charge that overflows from photodiode PD flows in this order: overflow gates OF1, 2<transfer transistor TG, storage transfer transistors TGC1, 2<separation layer.

Note that regarding the overflow gate voltage in particular, there tends to be variations in saturation levels caused by manufacturing variances. Accordingly, regarding the voltages of overflow gate OF1 and overflow gate OF2 in particular, before shipment, it is preferable that trimming is performed to inhibit variations in saturation levels.

Embodiment 4

Solid-state imaging apparatus 100 according to Embodiment 4 will be described with a focus on the differences from Embodiment 2. In one example of a configuration of solid-state imaging apparatus 100, the number of controls for horizontal scan line groups 15 differ from Embodiment 2, but all other aspects are the same as Embodiment 2.

[4.1 Pixel Circuit Configuration Example]

An example of a configuration of pixel circuit 3 will be described.

Figure 51A:
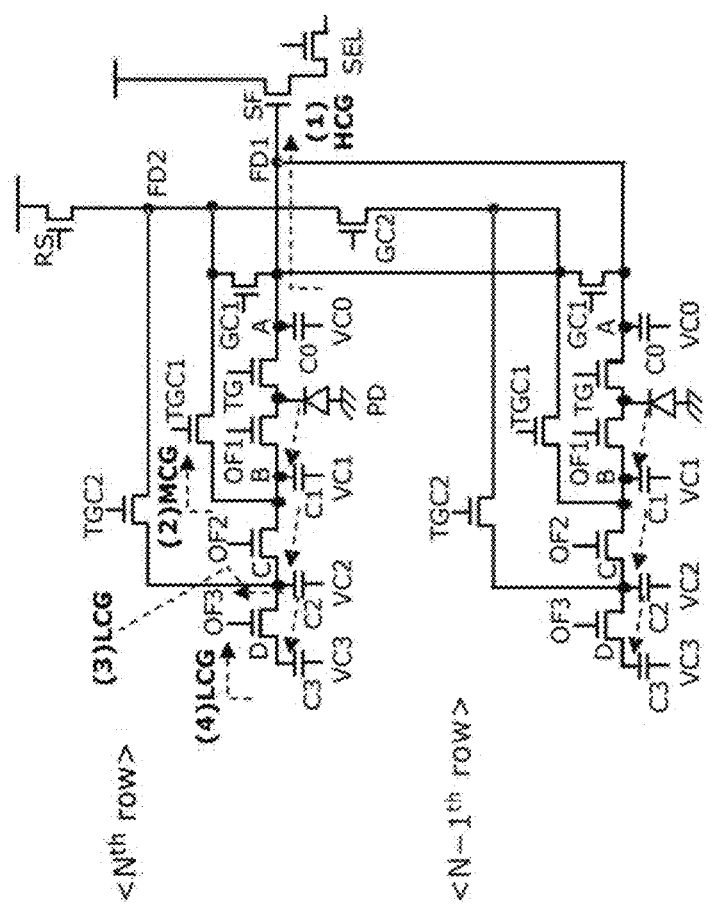
FIG. 51A illustrates an example of a circuit configuration of the vertical two-pixel single-cell structure according to Embodiment 4.
Figure 51B:
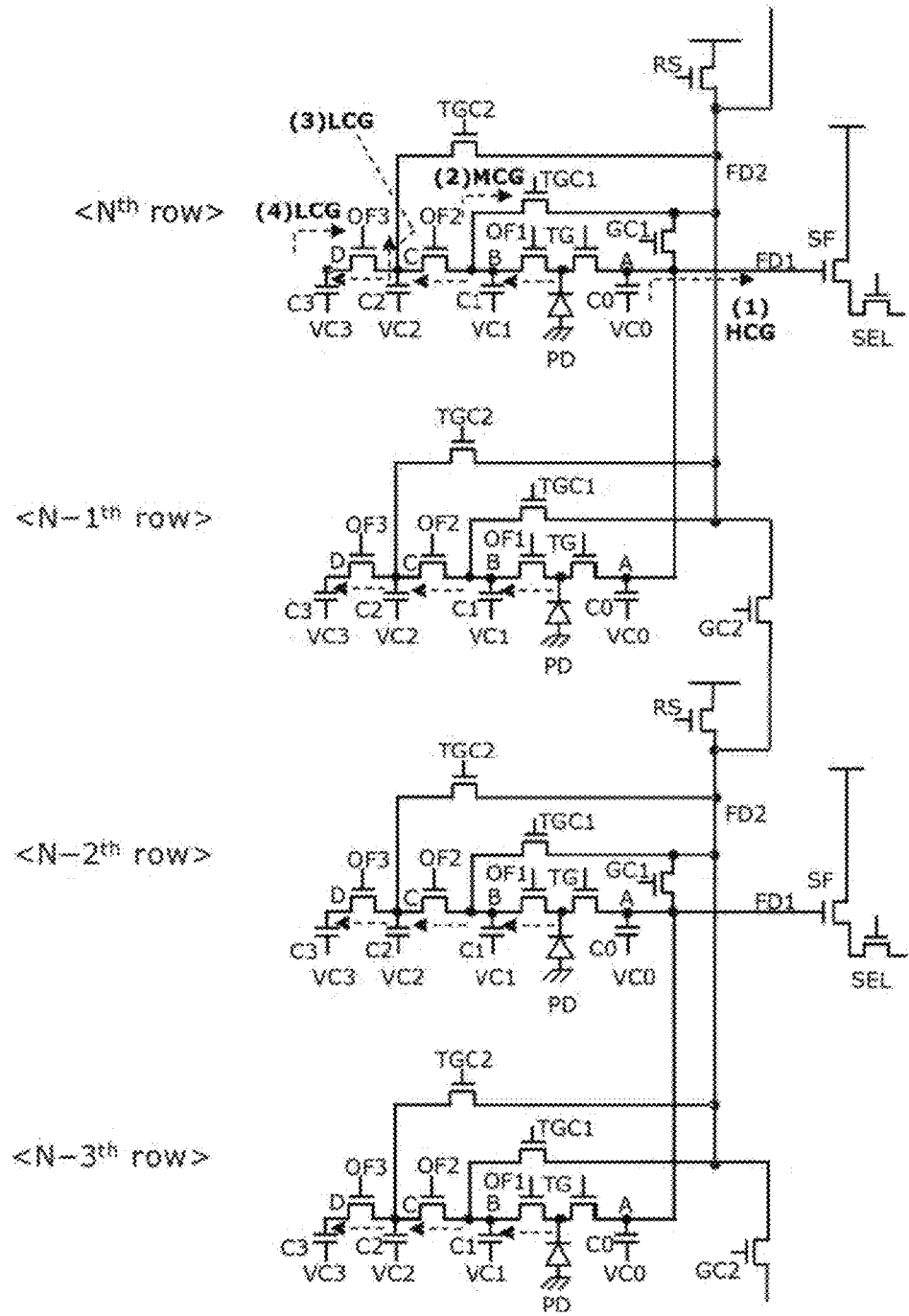
FIG. 51B illustrates an example of a circuit configuration of the vertical four-pixel single-cell structure according to Embodiment 4.

FIG. 2 illustrates an RGB Bayer configuration, FIG. 51A illustrates a vertical two-pixel single-cell circuit configuration of the RGB Bayer configuration, and FIG. 51B illustrates a vertical four-pixel single-cell circuit configuration of the RGB Bayer configuration. Control lines are the same in each of the configurations.

In Embodiment 4, FIG. 51A and FIG. 51B illustrate that there are no elements or paths along which the charge of a storage capacitive element (C3) is transferred to a floating region (FD2) via storage transfer transistor (TGC3) (however, C3 is provided).

As a substitute for storage transfer transistor TGC3, overflow gate OF3 is given a device structure that allows for charge to flow both ways, and the charge of storage capacitive element C3 can achieve equivalent advantageous effects by turning overflow gate OF3 and storage transfer transistor TGC2 on.

Readout control line φTGC3 is omitted from horizontal scan line group 15.

[4.2 Example of Readout Operation by Correlated Double Sampling]

Figure 52:
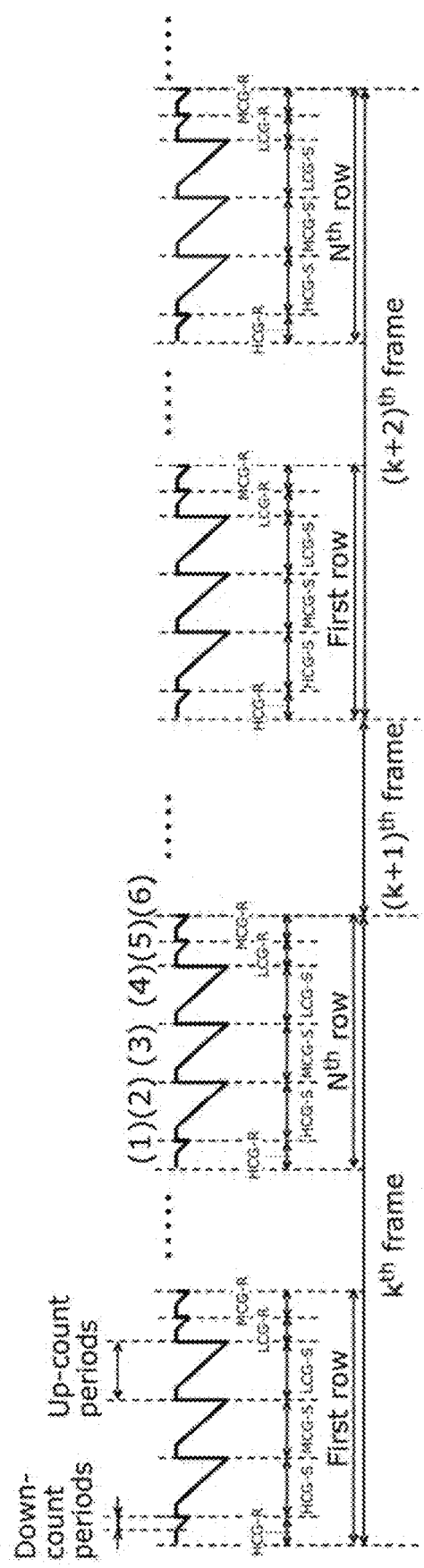
FIG. 52 illustrates the order in which a few frames are read out in Embodiment 4.
Figure 54A:
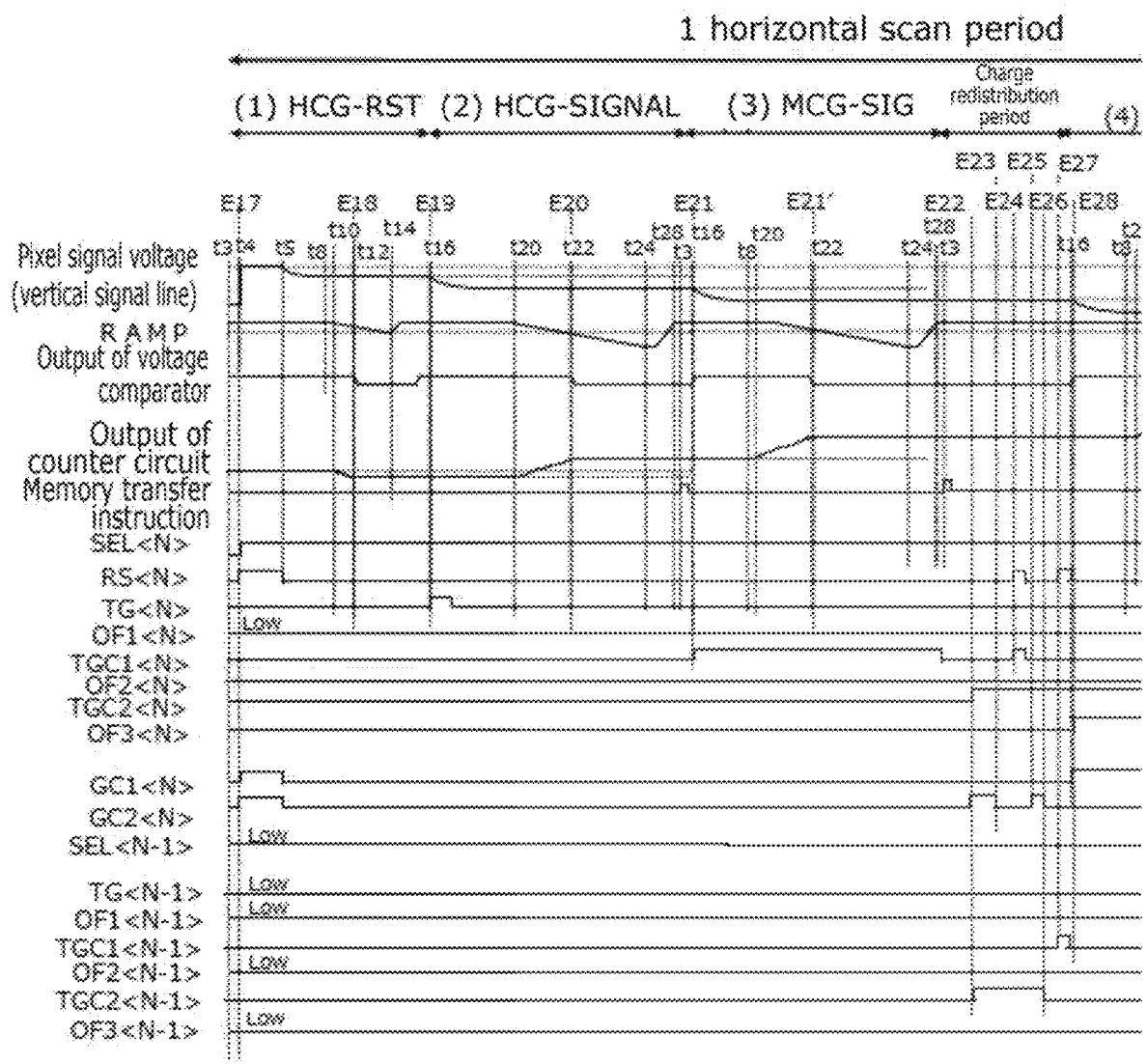
FIG. 54A is a time chart illustrating an example of pixel readout operations accompanied by gain control according to Embodiment 4.
Figure 54B:
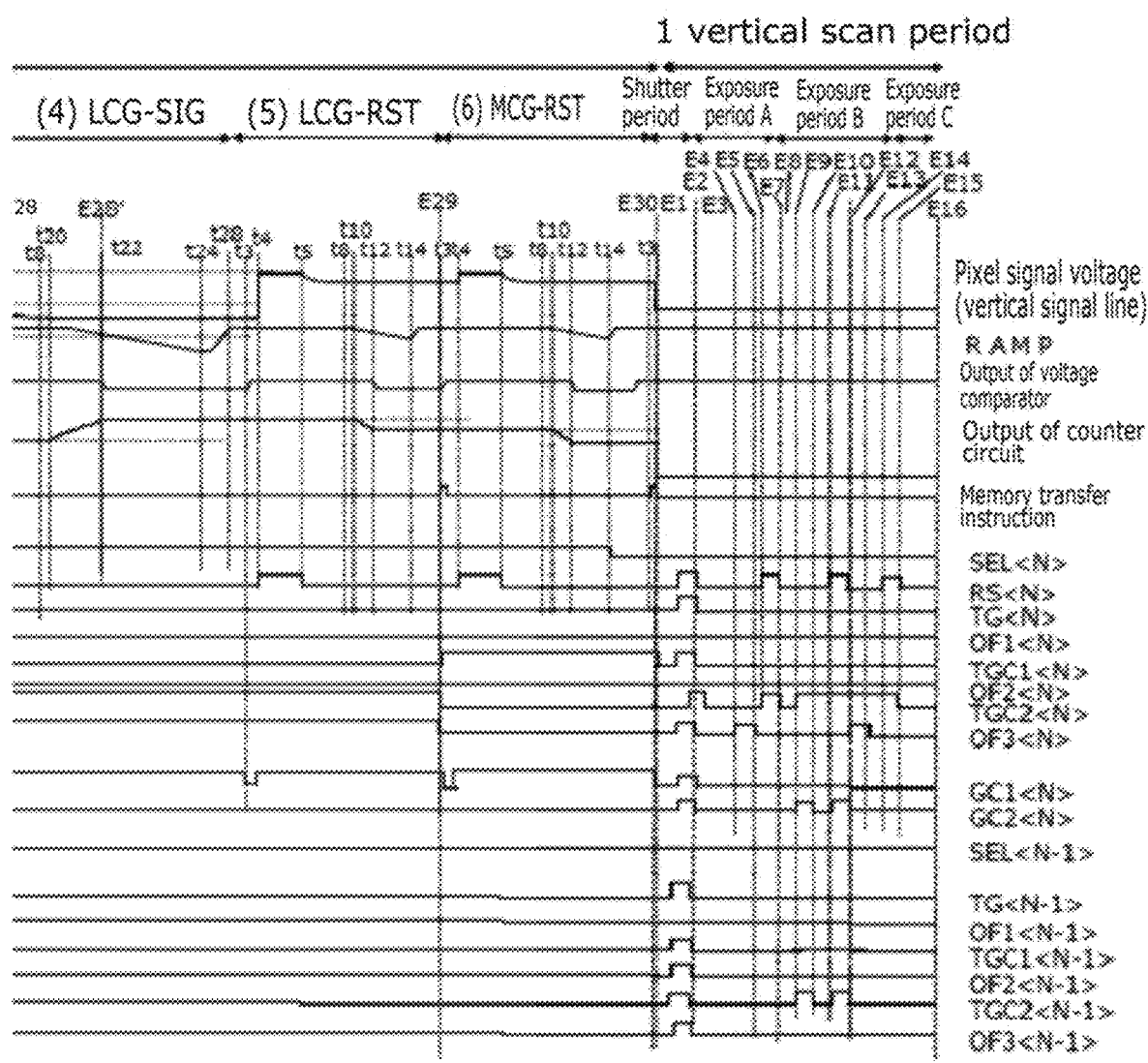
FIG. 54B is a continuation of the time chart of FIG. 54A illustrating an example of pixel readout operations accompanied by gain control according to Embodiment 4.

FIG. 52 illustrates the order in which a few frames are read out in Embodiment 4. FIG. 53 illustrates CDS order in 1 H, which is from HCG (R: reset component) to HCG (S: signal component) to MCG (S: signal component) to LCG (S: signal component) to LCG (R: reset component) and to MCG (R: reset component). FIG. 54A and FIG. 54B illustrate FIG. 9 as a base modified to this CDS order. In the transition from HCG (R: reset component) to HCG (S: signal component), pixel reset noise is cancelled. However, in the transition from MCG (S: signal component) to LCG (S: signal component) to LCG (R: reset component) to MCG (R: reset component), the DC offset (reset coupling) can be removed, but the pixel reset noise cannot be cancelled, and remains as kTC noise.

Figure 63:
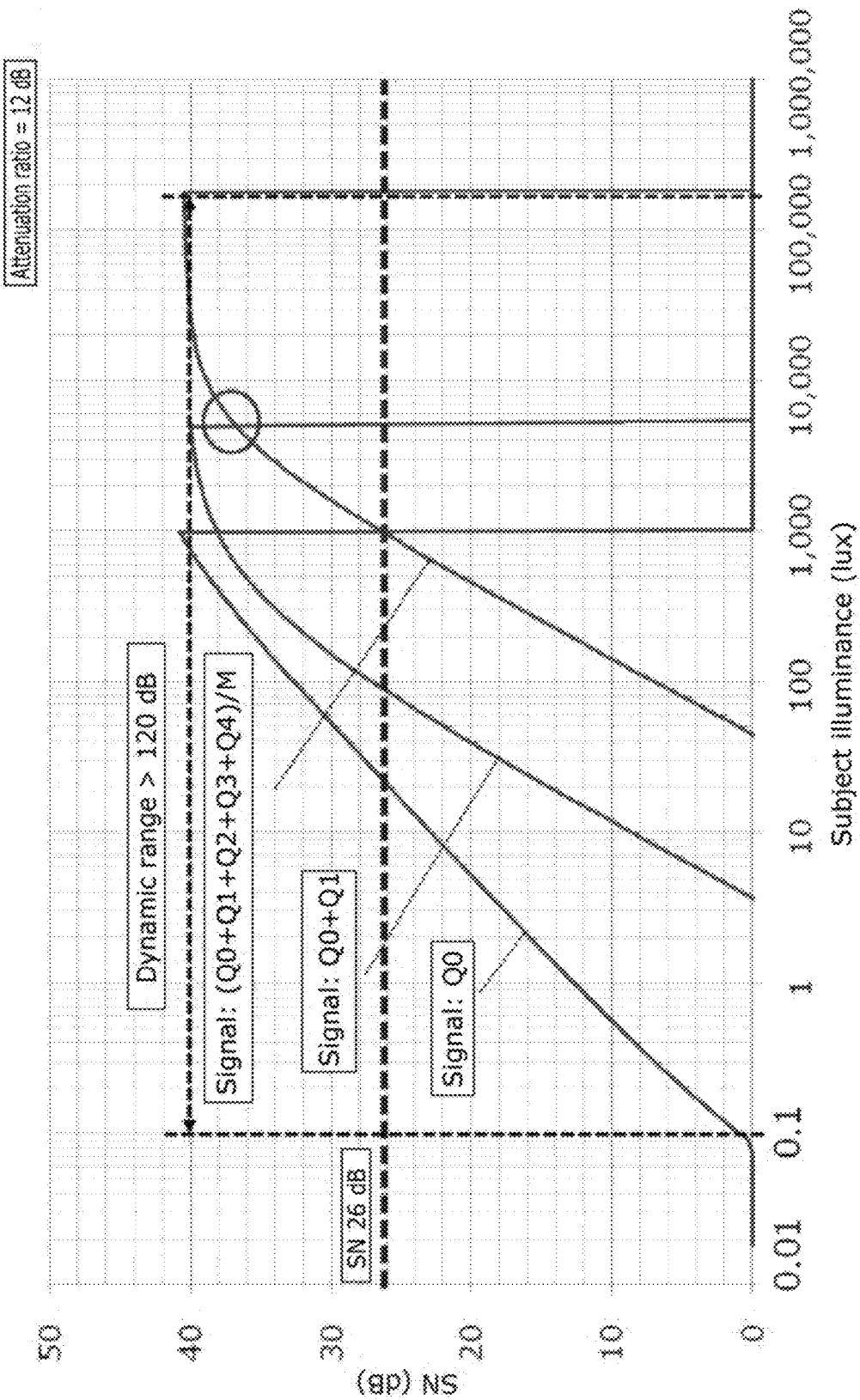
FIG. 63 illustrates the relationship between subject illuminance and gain (SN ratio) according to Embodiment 4.

The kTC noise in this short exposure (high illuminance) appears on the low signal side. For example, this is illustrated in FIG. 63. Here, kTC noise is expressed as $\sqrt{(kTC)}$ at charge amount. Settings must be configured so that this noise is sufficiently smaller than the signal level. Accordingly, at the boundary between the short frame (high-illuminance frame) and the long frame (low-illuminance frame), it is necessary to sufficiently improve the latter SN more than the former SN.

[4.3 Readout Operation Accompanied by Gain Control]

Figure 55A:
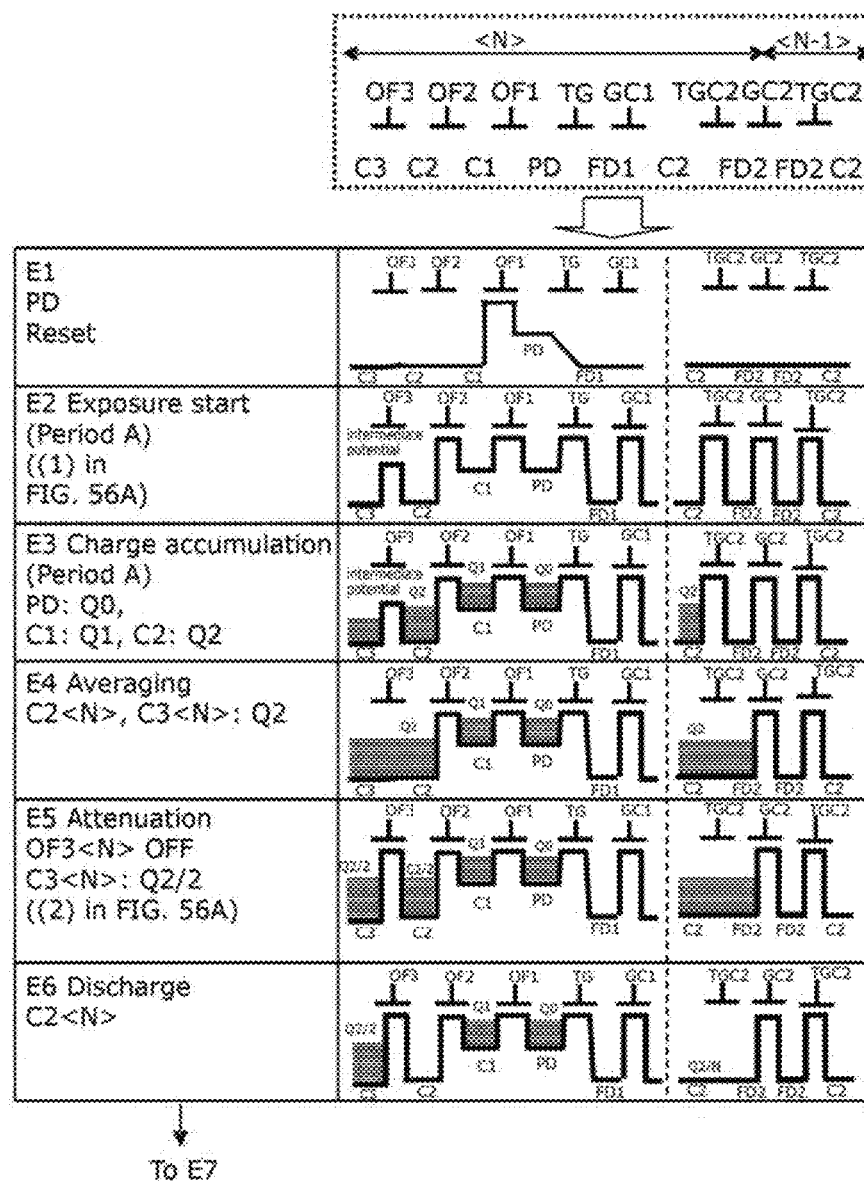
FIG. 55A illustrates potentials at main points in FIG. 54A and FIG. 54B.
Figure 55B:
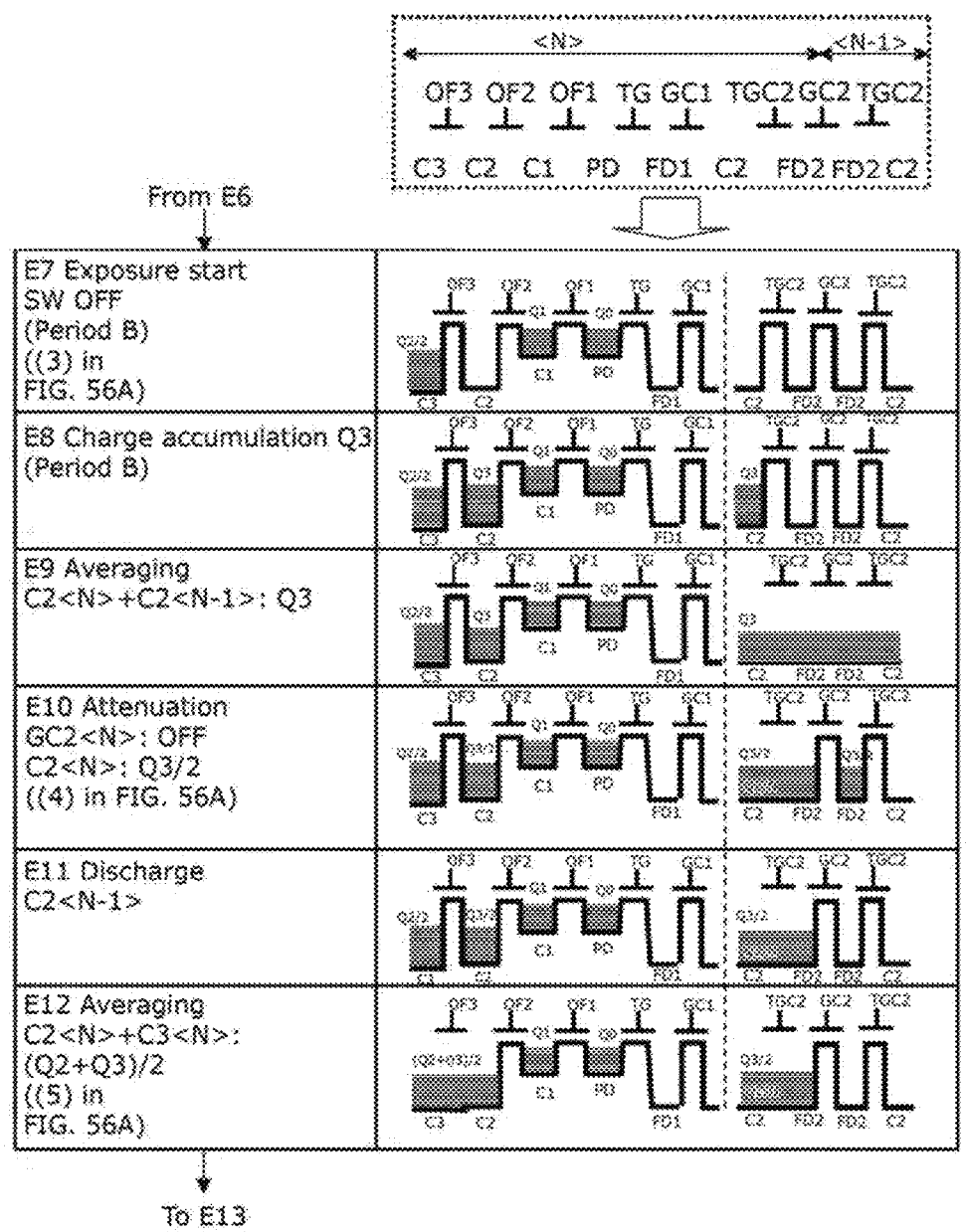
FIG. 55B is a continuation from FIG. 55A illustrating potentials at main points in FIG. 54A and FIG. 54B.
Figure 55C:
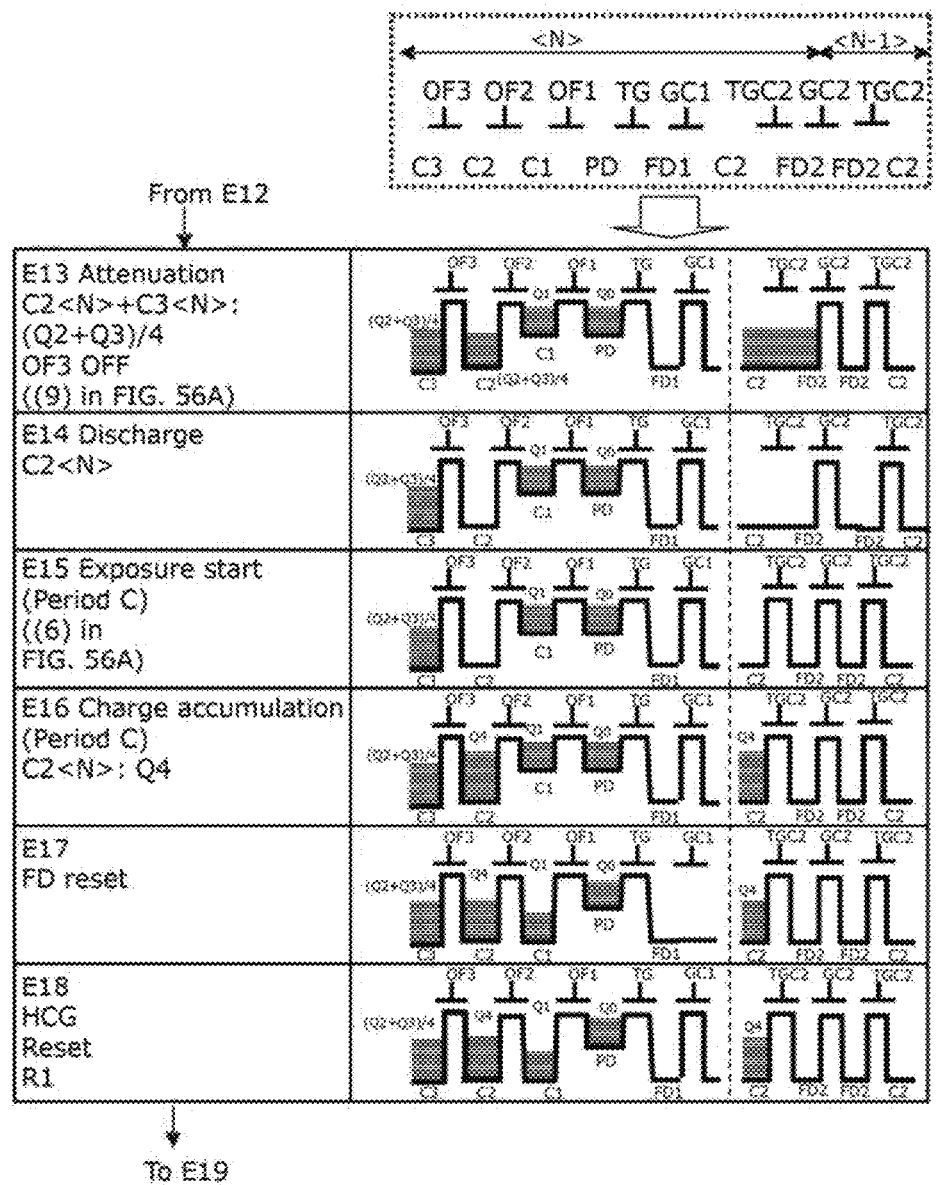
FIG. 55C is a continuation from FIG. 55B illustrating potentials at main points in FIG. 54A and FIG. 54B.
Figure 55D:
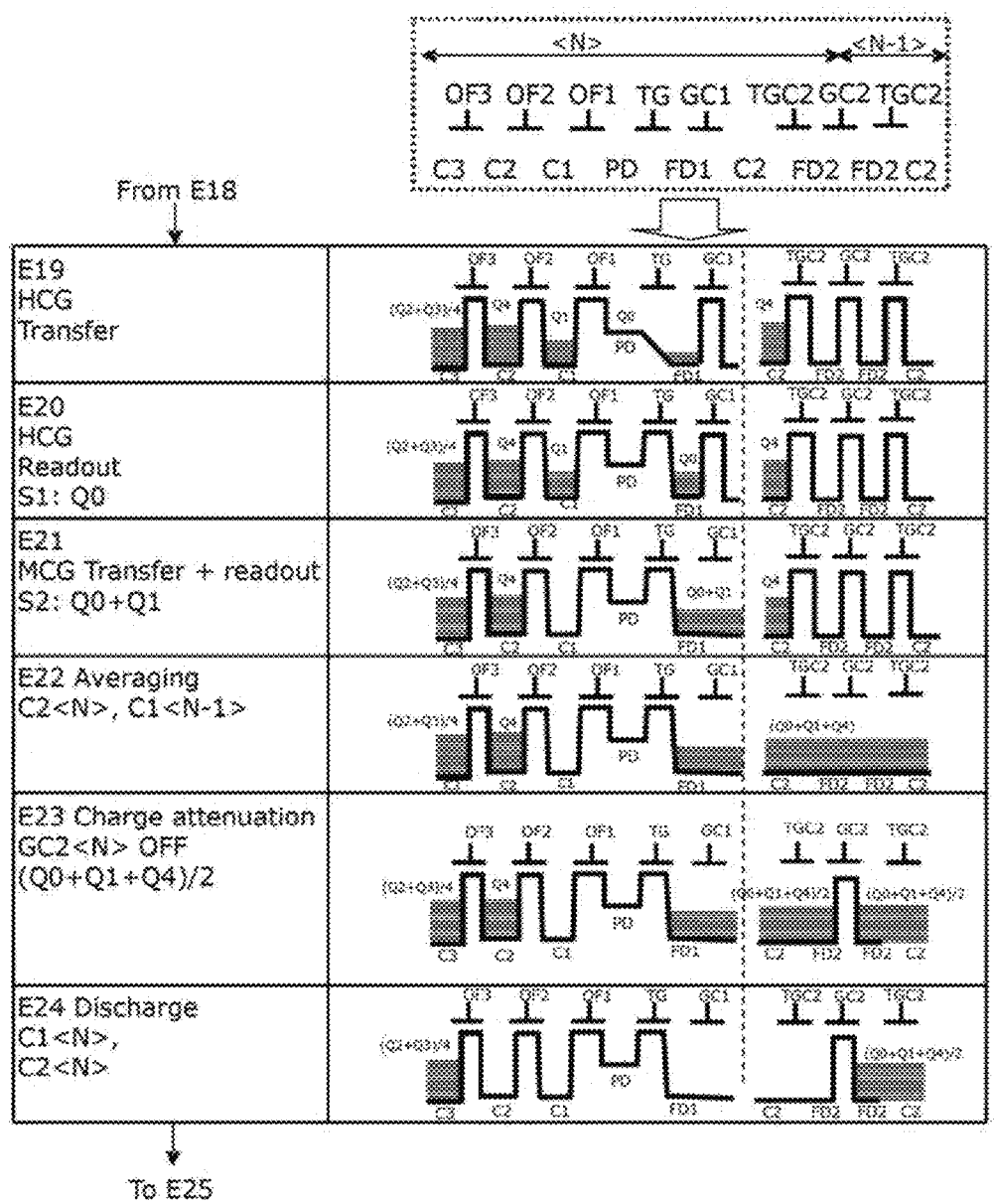
FIG. 55D is a continuation from FIG. 55C illustrating potentials at main points in FIG. 54A and FIG. 54B.
Figure 55E:
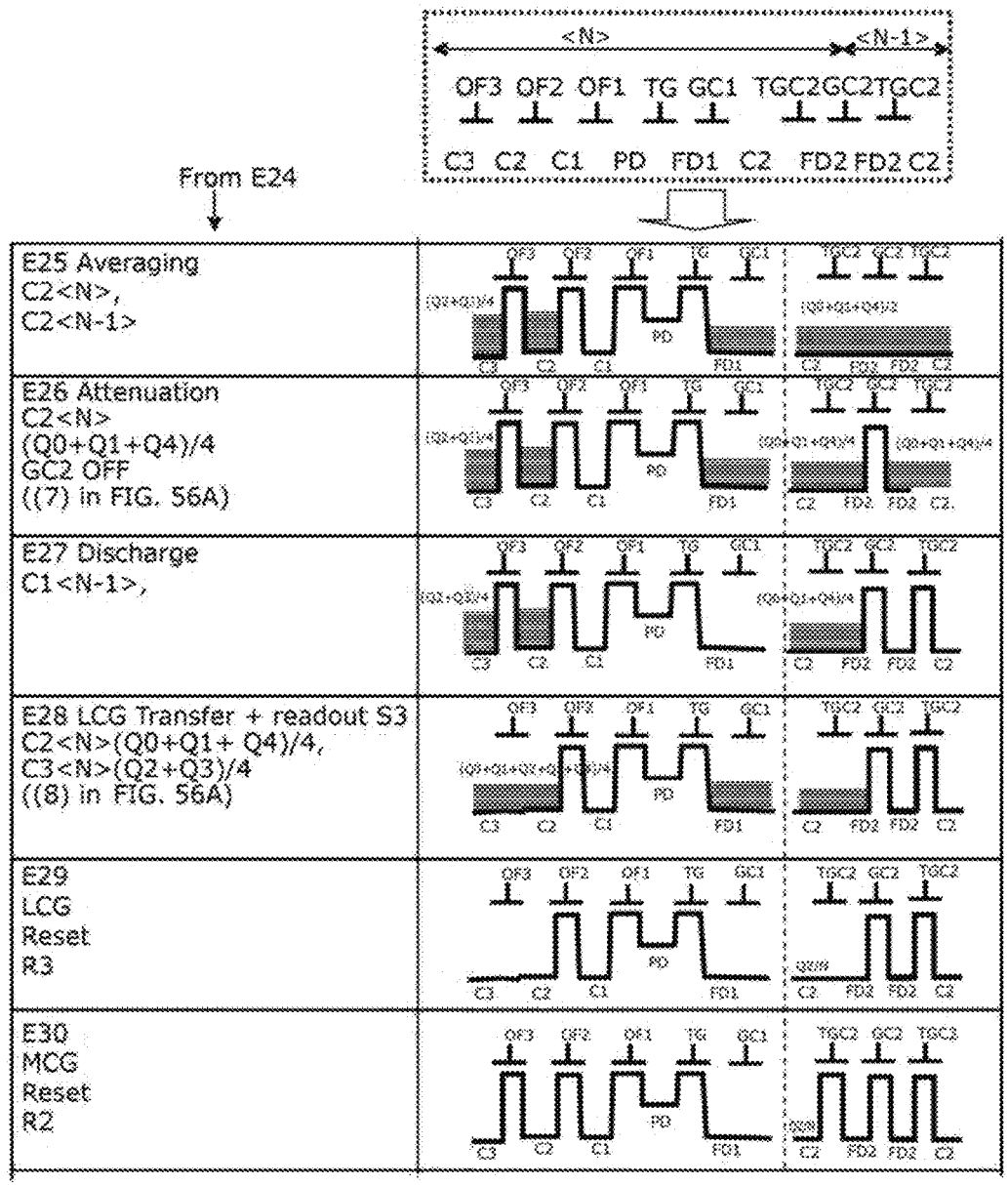
FIG. 55E is a continuation from FIG. 55D illustrating potentials at main points in FIG. 54A and FIG. 54B.

FIG. 54A and FIG. 54B are time charts illustrating examples of pixel readout operations accompanied by gain control according to Embodiment 4, with the main part at 1 V (1 vertical synchronization period) enlarged. In FIG. 54A and FIG. 54B, t* indicates the event number in FIG. 9. E* indicates the event number in FIG. 55A, FIG. 55B, and FIG. 55C.

Note that the content of FIG. 54A and FIG. 54B is non-limiting so long as the timing is a timing that achieves the same advantageous effects as the present embodiment.

Gain GC1 that converts the signal charge at floating diffusion layer FD1 into voltage can be switched between a high gain and a low gain according to the on/off state of gain control transistor GC1.

The period from HCG (R: reset component) to HCG (S: signal component) indicates a readout operation of a signal charge from photodiode PD to floating diffusion layer FD1 in a state in which the conversion gain of floating diffusion layer FD1 is high. The period from MCG (S: signal component) to LCG (S: signal component) to LCG (R: reset component) and to MCG (R: reset component) indicates a readout operation of a signal charge from storage capacitive element C1 and storage capacitive element C2 to floating diffusion layer FD2 in a state in which the conversion gain of floating diffusion layer FD2 is low.

In order to charge redistribute the <N> row pixel signal and the <N−1> row pixel signal, GC2 performs mixing/separating (explanation of the detailed potential figures will be given later).

[4.4 Concept of Pixel Mixing]

Figure 56A:
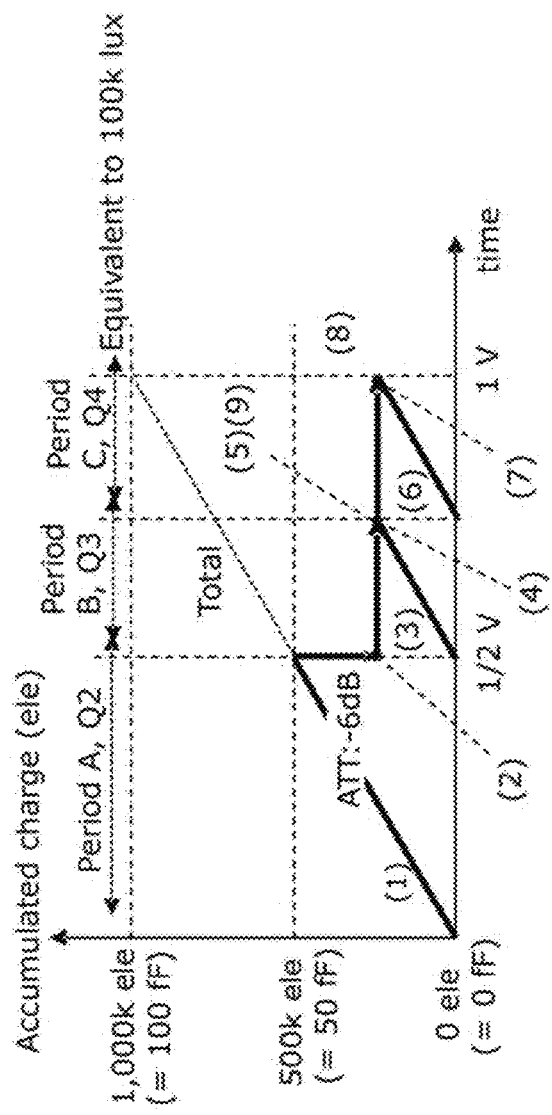
FIG. 56A is an explanatory diagram illustrating the concept of pixel mixing.
Figure 57:
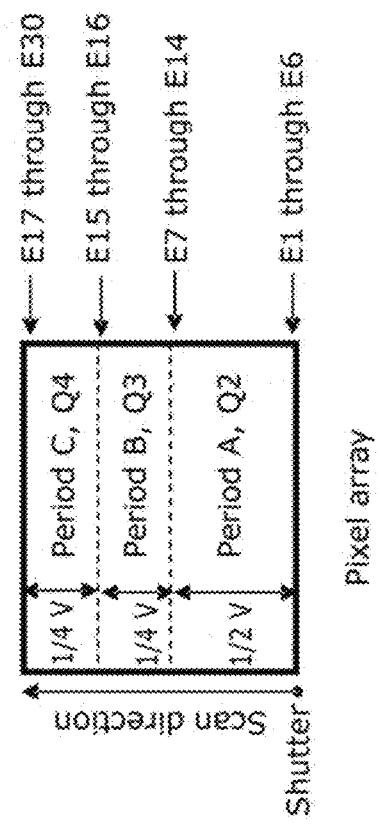
FIG. 57 is an explanatory diagram of the scan periods in FIG. 56A.

FIG. 56A, FIG. 56B, FIG. 56C, and FIG. 57 illustrate the concept of pixel mixing. FIG. 56A is an explanatory diagram illustrating the concept of pixel mixing. FIG. 56B and FIG. 56C are for explaining each point in FIG. 56A. Note that explanation of the detailed potential figures will be given later.

First, the charge that overflows from photodiode PD is accumulated in C1<N>, and the accumulated charge increases as the exposure time increases. If the capacitive element that accumulates the charge is insufficient, 100,000 lux cannot be received, whereby the dynamic range is insufficient.

However, in the present embodiment, the charge amount of C1<N> in a ½ V (½ vertical synchronization period) period corresponding to half of a 1 V (1 vertical synchronization period) period becomes Q1, and furthermore, the charge that overflows is accumulated in C2<N> and C3<N> since overflow gate OF3 is on, whereby the charge amount becomes Q2 ((1) in the figures).

Next, charge is redistributed between C2<N> and C3<N> by turning overflow gate OF3 off, whereby the charge amount of C3<N> becomes Q2/2 ((2) in the figures), and is then held. Thereafter, the no longer necessary charge of C2<N> is discharged.

Next, the accumulation into C2<N> is started once again from ½ V (½ vertical synchronization period) ((3) in the figures). Then, in ¾ V (in the ¾ vertical synchronization period), the charge amount of C2<N> becomes Q3, the charge is redistributed with C2<N−1>, whereby the charge amount of C2<N> becomes Q3/2 ((4) in the figures). Thereafter, the no longer necessary charge of C2<N−1> is discharged.

Next, overflow gate OF3 is turned on, and charge amount Q3/2 of C2<N> and charge amount Q2/2 of C3<N> are combined whereby the total charge becomes (Q2+Q3)/2 ((5) in the figures).

Then, as a result of turning overflow gate OF3 off, charge is redistributed between C3<N> and C2<N>, whereby the charge amount of C3<N> becomes (Q2+Q3)/4 ((9) in the figures), and is then held.

Furthermore, the accumulation into C2<N> is started once again from ¾ V (¾ vertical synchronization period) ((6) in the figures).

On the other hand, charge amount Q0 of photodiode PD read out to the FD2 part, charge amount Q1 of C1<N>, and charge amount Q4 of C2<N> are redistributed between C2<N> and C2<N-1>, whereby the charge amount of C2<N> becomes (Q0+Q1+Q4)/2. Next, as a result of turning gain control transistor GC2 off, charge is redistributed between C2<N> and C2<N-1>, whereby the charge amount of C2<N> becomes (Q0+Q1+Q4)/4 ((7) in the figures) and is then held.

Then, finally, charge (Q0+Q1+Q4)/4 of C2<N> and charge (Q2+Q3)/4 of C3<N> are read out and FD mixed, whereby a signal charge of (Q0+Q1+Q2+Q3)/4 can be obtained.

A feature of the present embodiment is that a storage capacitive element is driven using the capacitance of an adjacent row whose charge has already been discharged to reduce capacitor surface area.

A feature of the exposure method according to the present embodiment is that LED light can be captured with certainty in a 1 V exposure period since a continuous exposure method (PD and storage capacitive element) is employed, whereas LED light is failed to be captured if an intermittent exposure method via a chopper or the like is employed.

Figure 58:
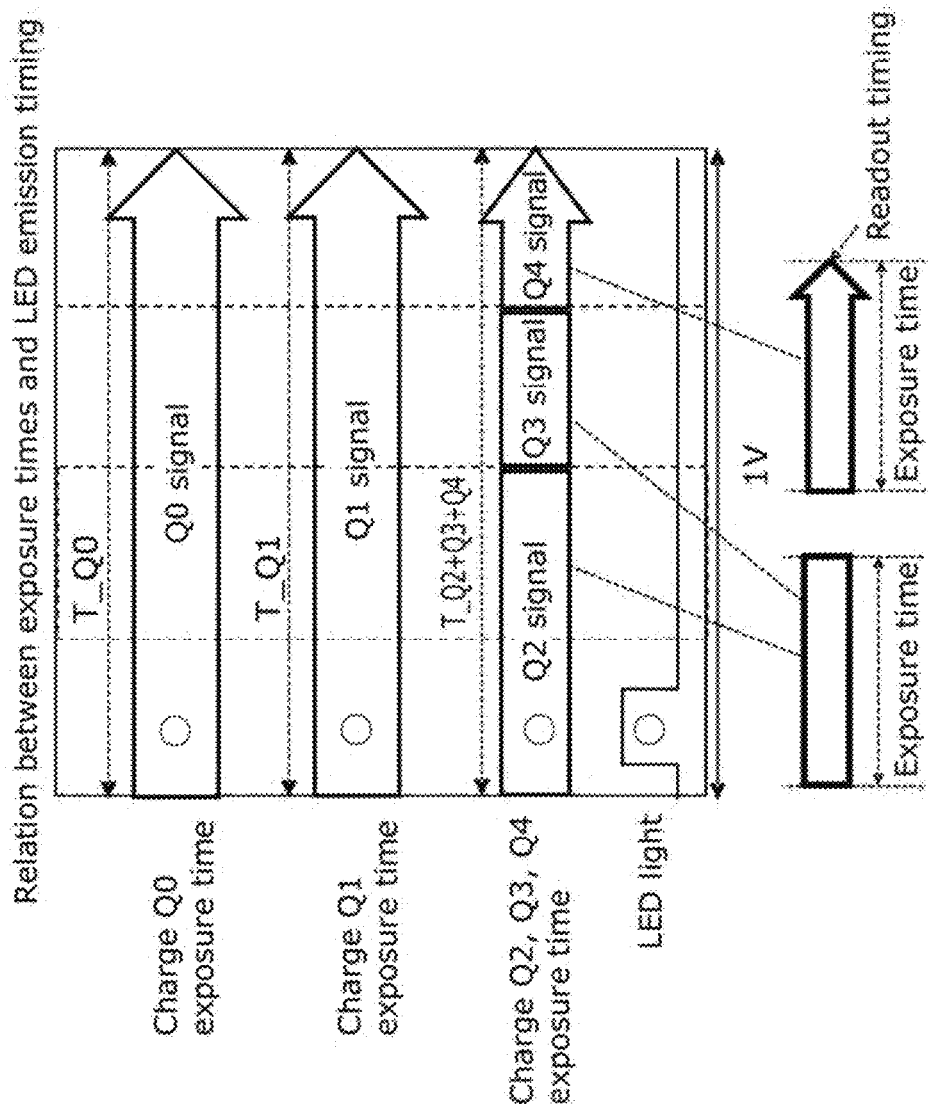
FIG. 58 illustrates timing related to the accumulating of charges of a photodiode and a storage capacitive element.
Figure 59:
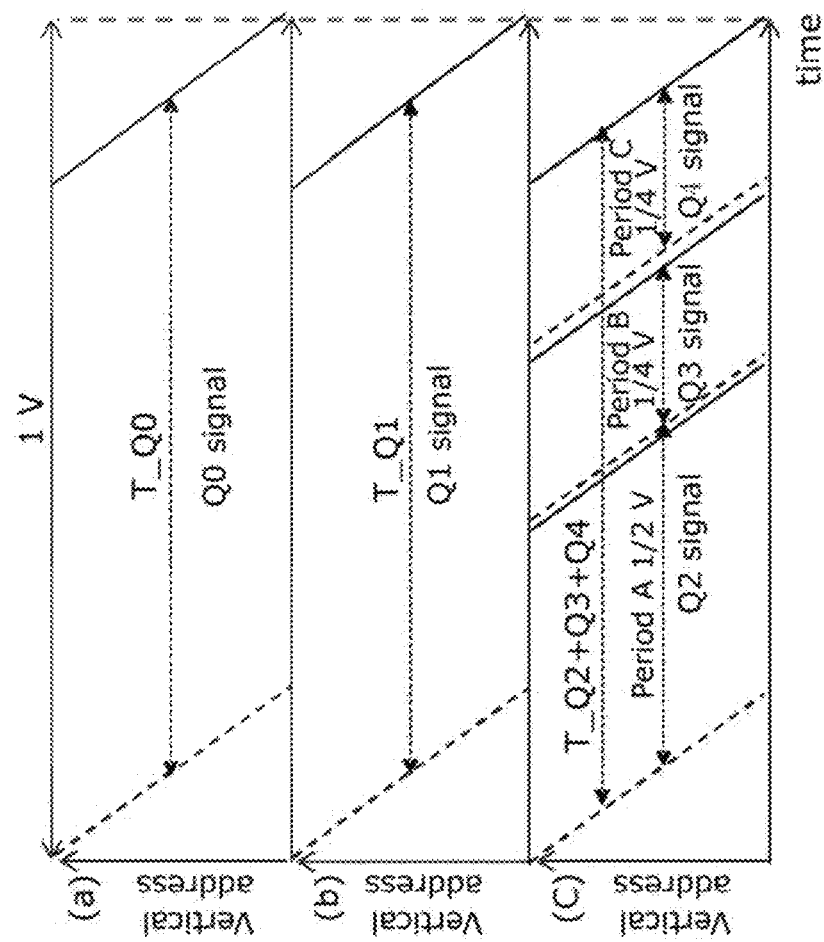
FIG. 59 illustrates timing related to the accumulating of charges of a photodiode and a storage capacitive element.

FIG. 58 and FIG. 59 illustrate timing related to the accumulating of charges of photodiode PD and storage capacitive element C1. Photodiode PD is continuously exposed during the 1 V period and the charge amount is Q0. Moreover, storage capacitive element C1<N> that receives the charge that overflows from photodiode PD is a Q1 signal up to 0-1 V. The signal of storage capacitive element C2<N> that receives this charge that overflows from C1<N> is Q2 up to 0-½ V, Q3 up to ½-¾ V, and Q4 up to ¾-4/4 V. Moreover, since photodiode PD is completely exposed during the 1 V period, it is possible to capture LED light. Here, for the transitions from 0-½ V to ½-¾ V and to ¾-4/4 V, there is a possibility that a non-exposure period may arise at a few H levels, but it is to an extent that does not affect the image quality of the LED light.

[4.5 WDR]

A feature of the present embodiment is that the three frames—the long frame (low-illuminance frame), the middle frame (middle-illuminance frame) and the short frame (high-illuminance frame)—combined to achieve a WDR are exposed at exactly the same timing and the exact same pixels are used, which inhibits false colors, coloring, and blur.

Figure 60:
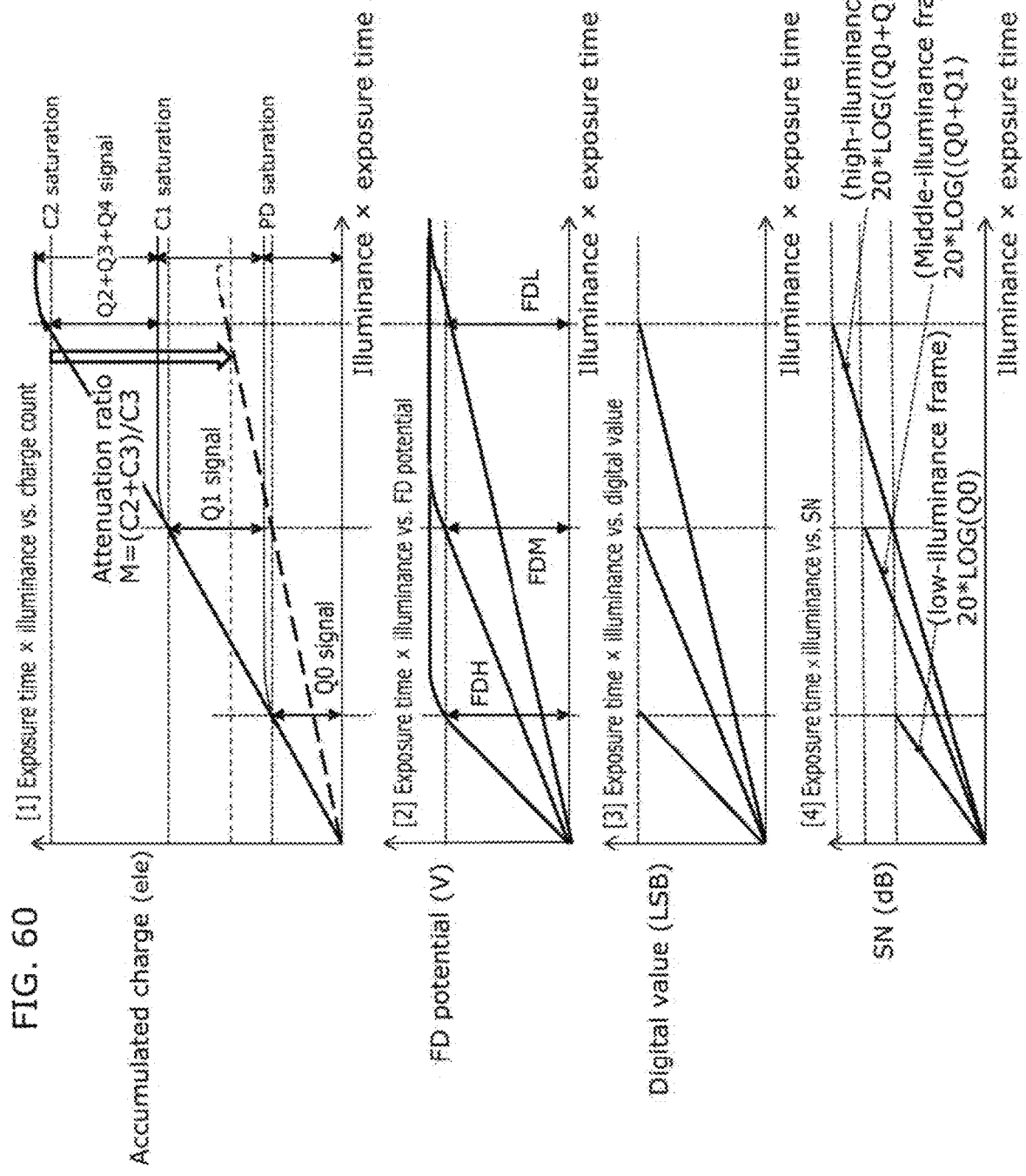
FIG. 60 illustrates [1] charge accumulation level, [2] FD potential, [3] value after AD conversion, and [4] SN relative to the product of illuminance and exposure time.

FIG. 19B and FIG. 60 illustrate an outline of a combining method to achieve a WDR. The WDR is achieved using the signal charge of Q0 as the long frame (low-illuminance frame), the signal charge of Q0+Q1 as the middle frame (middle-illuminance frame), and the signal charge of (Q0+Q1+Q2+Q3+Q4)/M as the short frame (high-illuminance frame).

The product of illuminance and exposure time, illuminance at a certain time, or exposure time at a certain illuminance is represented on the horizontal axes of [1], [2], [3], and [4] in FIG. 60. In [1], charge accumulation level is represented on the vertical axis. In [2], FD potential is represented on the vertical axis. In [3], the value after AD conversion is represented on the vertical axis. In [4], SN is represented on the vertical axis.

Figure 61:
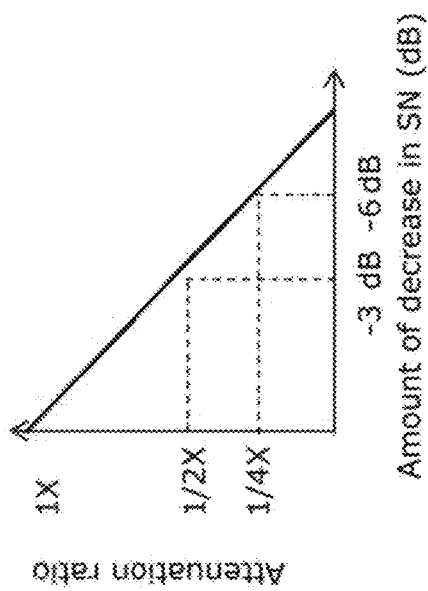
FIG. 61 illustrates SN degradation that accompanies an attenuation ratio of an exposure (high illuminance).

FIG. 61 illustrates SN degradation that accompanies attenuation ratio M of the short exposure (high illuminance). Since SN is determined by shot noise, for example, when attenuation ratio M is double, the SN at the boundary drops by 3 dB. Although the capacitance ratio of storage capacitive element (C1) and storage capacitive element (C2) can be set at an arbitrary attenuation ratio M, SN degradation observed in the WDR result at the boundary of the frames is the benchmark.

FIG. 62 illustrates signal charge amount and FD potential at the first readout, Read1, the second readout, Read2, and the third readout, Read3.

FIG. 63 is an actual result of combination wherein the first Read1 is the long frame (low-illuminance frame) of the WDR, the second Read2 is the middle frame (middle-illuminance frame) of the WDR, and the third Read3 is the short frame (high-illuminance frame) of the WDR. The SN at the connecting part of the frames is at least 26 dB and the dynamic range is at least 120 dB.

WDR circuit 76 included in signal processor 70 is illustrated in greater detail in FIG. 19B.

The pixel signal (long) of the first low-illuminance frame, the pixel signal (middle) of the second middle-illuminance frame, and the pixel signal (short) of the third high-illuminance frame are combined. This combining achieves a wide dynamic range function (WDR function), or stated differently, functions to extend the dynamic range.

Regarding the pixel signal (long) of the first low-Illuminance frame, the gain within the pixel is set high, and regarding the pixel signal (middle) of the second middle-illuminance frame and the pixel signal (short) of the third high-illuminance frame, the gain within the pixel is set low, whereby noise at low illuminances can be improved and the dynamic range can be extended at high illuminances.

FIG. 64 illustrates advantageous effects achieved by the present embodiment, namely storage capacitive element surface area reduction and dynamic range extension. In this way, with the present embodiment, it is possible to extend the dynamic range with smaller storage capacitive elements, and with respect to high-illuminance LED light as well, it is possible to avoid completely missing received signals. Note that Embodiment 4 is based on case number 1.

Moreover, case number 0 is omitted since it is smaller in terms of area size than case number 1.

[4.6 Pixel Potential Structure]

FIG. 55A through FIG. 55E illustrate potentials at main points in FIG. 54A and FIG. 54B. Moreover, here, for simplification, attenuation ratio M=2.

Events are denoted as E1 through E30, and will now be described in order.

E1 is the reset of FD1. The charge of the PD part is discharged by turning reset transistor RS<N>, transfer transistor TG<N>, and gain control transistor GC1<N> on.

E2 is the start of exposure in period A. Reset transistor RS<N>, transfer transistor TG<N>, and gain control transistor GC1<N> are turned off.

E3 is the accumulation of charge in period A. Signal charge Q0 is accumulated in photodiode PD, and the charge that overflows is accumulated in storage capacitive element C1<N> via overflow gate OF1<N>, and furthermore, the charge that overflows is accumulated in C2<N> via overflow gate OF2<N>.

In E4, the charge accumulated in C2<N> is averaged with C3<N> by turning overflow gate OF3<N> on.

In E5, the attenuation ratio is M=(C2<N>+C3<N>)/C3<N> due to charge redistribution as a result of turning overflow gate OF2<N> off. In other words, the charge amount of C3<N> becomes Q2/2.

In E6, the charge of C2<N> that is no longer necessary is discharged by turning storage transfer transistor TGC2<N> and reset transistor RS<N> on.

E7 is the start of exposure in period B. Storage transfer transistor TGC1<N> and reset transistor RS<N> are turned off.

E8 is the accumulation of charge in period B. Signal charge Q0 is accumulated in photodiode PD, Q1 is accumulated in storage capacitive element C1, and the charge that overflows is accumulated in storage capacitive element C2<N> via overflow gate OF2<N> as Q3.

E9 averages C2<N> and C2<N−1> by turning gain control transistor GC2<N>, storage transfer transistor TGC2<N>, and storage transfer transistor TGC2<N−1> on.

E10 performs charge redistribution of C3<N> and C3<N−1> by turning gain control transistor GC2<N>, storage transfer transistor TGC2<N>, and storage transfer transistor TGC2<N−1> off. The accumulated charge of C3<N> becomes Q3/2.

E11 is the reset of FD2. The charge of the FD2 part is discharged by turning reset transistor RS and gain control transistor GC2 on.

E12 turns overflow gate OF3<N> on and averages charge amount Q2/2 of C3<N> and accumulated charge Q3/2 of C3<N>.

In other words, as a result of the averaging, C3<N>+C2<N>=(Q2+Q3)/2.

E13 turns overflow gate OF3 off to perform charge redistribution between C3<N> and C2<N>, whereby C3<N> becomes (Q2+Q3)/4.

In E14, storage transfer transistor TGC2<N> and reset transistor RS<N> are turned on, which discharges the charge of C2<N>.

E15 is the start of exposure in period C. Storage transfer transistor TGC2<N> and reset transistor RS<N> are turned off.

E16 is the accumulation of charge in period C. Signal charge Q0 is accumulated in photodiode PD, and the charge that overflows is accumulated in storage capacitive element C1<N> via overflow gate OF1<N>, and the charge that overflows is further accumulated in C2<N> from overflow gate OF2<N>.

E17 is the reset of FD1. The charge of the FD1 part is discharged by turning reset transistor RS<N> and gain control transistor GC1<N> on.

E18 is the reset of HCG. The HCG state is achieved by turning reset transistor RS<N> and gain control transistor GC1<N> off.

E19 transfers the charge of photodiode PD to the FD1 part by turning transfer transistor TG<N> on.

E20 reads out charge Q0 of photodiode PD accumulated in the FD1 part by turning transfer transistor TG off (HCG signal).

E21 turns storage transfer transistor TGC1<N> on, reads a signal out to FD1, and reads out total value Q0+Q1 of charge Q0 of photodiode PD and charge Q1 of C1<N> (MCG signal).

E22 reads out Q4 of C2<N> by turning gain control transistor GC2<N>, storage transfer transistor TGC2<N>, and storage transfer transistor TGC2<N−1> on. The already read out charge Q0 of photodiode PD and charge Q1 of C1<N> are mixed, whereby the total becomes Q0+Q1+Q4.

In E23, attenuation ratio M resulting from charge redistribution by turning gain control transistor GC2 off becomes (C2<N>+C2<N−1>)/C2<N>, and thus C2<N>=(Q0+Q1+Q4)/2.

In E24, the charge of C1<N> that is no longer necessary is discharged by turning storage transfer transistor TGC1<N> and reset transistor RS<N> on.

In E25, the averaging of C2<N> and C2<N−1> is performed by turning gain control transistor GC2, storage transfer transistor TGC2<N>, and storage transfer transistor TGC2<N−1> on.

In E26, charge is redistributed between C3<N> and C2<N−1> by turning gain control transistor GC2, storage transfer transistor TGC2<N>, and storage transfer transistor TGC2<N−1> off, whereby attenuation ratio M becomes (C2<N>+C2<N−1>)/C2<N>, and thus C2<N>=(Q0+Q1+Q4)/4.

In E27, the charge of C1<N> that is no longer necessary is discharged by turning storage transfer transistor TGC1<N> and reset transistor RS<N> on.

In E28, C2<N>=(Q0+Q1+Q4)/4 and C3<N>=(Q2+Q3)/4 are mixed by turning overflow gate OF2<N> and storage transfer transistor TGC1<N> on, whereby C2<N>+C3<N>= (Q0+Q1+Q2+Q3+Q4)/4 (LCG signal).

In E29, FD1 and FD2 are reset and the readout operation ends.

Embodiment 5

Solid-state imaging apparatus 100 according to Embodiment 5 will be described with a focus on the differences from Embodiment 1. In one example of a configuration of solid-state imaging apparatus 100, the number of controls for horizontal scan line groups 15 differ from Embodiment 1, but all other aspects are the same as Embodiment 1.

The present embodiment is beneficial when the amplitude (dynamic range) of the pixel capacitance is sufficiently high and the pixel dynamic range is attenuated and to match the input dynamic range of the series AD circuit when the pixel dynamic range exceeds the circuit dynamic range.

[5.1 Pixel Circuit Configuration Example]

An example of a configuration of pixel circuit 3 will be described.

Figure 65A:
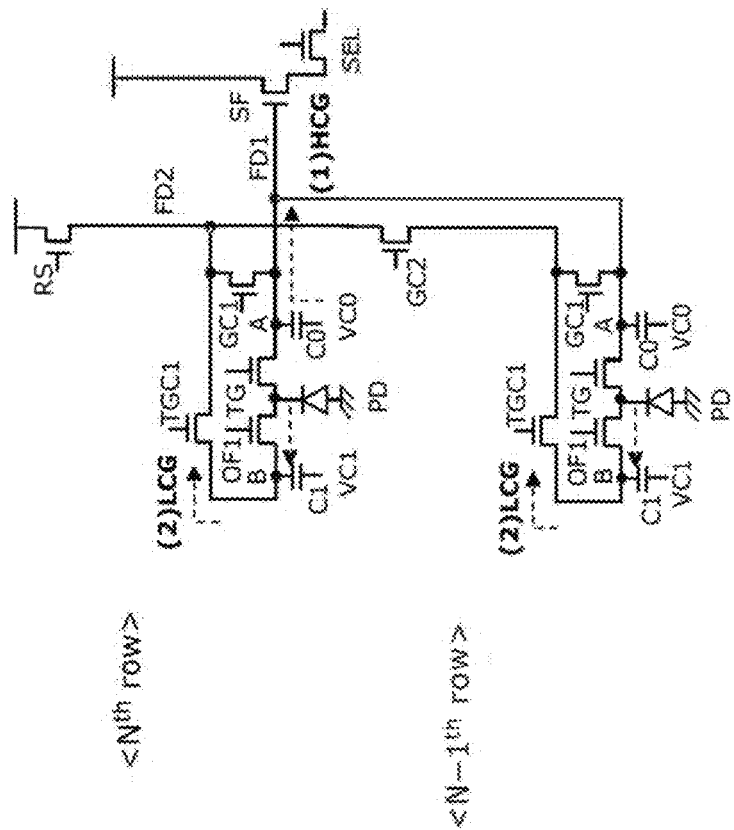
FIG. 65A illustrates an example of a circuit configuration of the vertical two-pixel single-cell structure according to Embodiment 5.
Figure 65B:
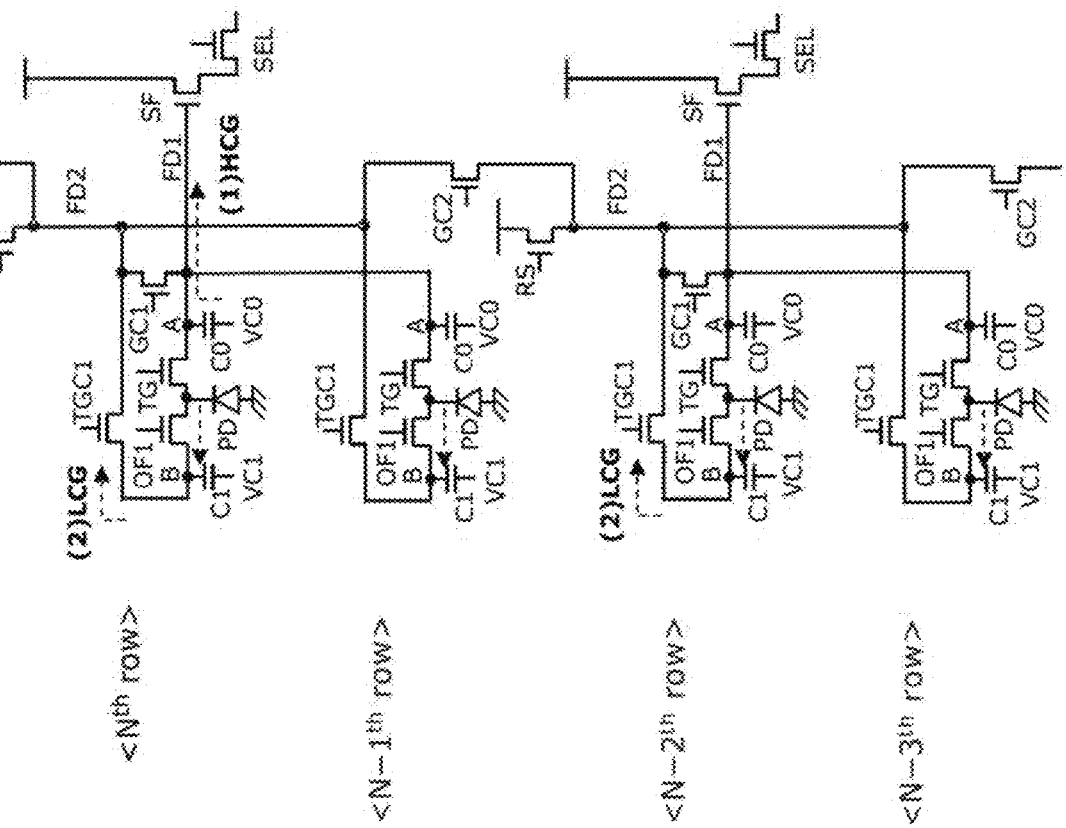
FIG. 65B illustrates an example of a circuit configuration of the vertical four-pixel single-cell structure according to Embodiment 5.

FIG. 2 illustrates an RGB Bayer configuration, FIG. 65A illustrates a vertical two-pixel single-cell circuit configuration of the RGB Bayer configuration, and FIG. 65B illustrates a vertical four-pixel single-cell circuit configuration of the RGB Bayer configuration. Control lines are the same in each of the configurations.

FIG. 65A and FIG. 65B illustrate circuit examples of pixel circuit 3 according to Embodiment 5. The configuration differs from that of Embodiment 1 in that overflow gate OF2, storage capacitive element C2, and storage transfer transistor TGC2 have been omitted.

Horizontal scan line group 15 includes readout control line cφTGC2 and overflow control line φOF2.

Overflow gate OF1 is used both as an overflow gate and a switching transistor that turns on and off according to readout control signal φOF1. When readout control signal φOF1 is high-level, the signal charge resulting from photoelectric conversion by photodiode PD is transferred to storage capacitive element C1 via overflow gate OF1.

When the signal charge resulting from photoelectric conversion by photodiode PD overflows, storage capacitive element C1 can pour the signal charge by adjusting the control voltage of overflow gate OF1. Alternatively, storage capacitive element C1 transfers the signal charge when the signal charge exceeds a preset potential.

Gain control transistor GC2 electrically disconnects or connects floating diffusion layer FD2 in this vertical two-pixel single-cell structure according to gain control signal φGC2. This changes the conversion gain at which the signal charge in floating diffusion layer FD2 is converted into voltage. In other words, in the transferring of the signal charge from photodiode PD to floating diffusion layer FD2, the conversion gain of floating diffusion layer FD can be decreased further if gain control transistor GC2 is turned on.

With this, the transferring of the charge of an adjacent row, that is to say, the charge that passes through storage transfer transistor TGC1 and storage transfer transistor TGC3 can be switched on/off, thereby enabling charge redistribution.

[5.2 Example of Readout Operation by Correlated Double Sampling]

Figure 68A:
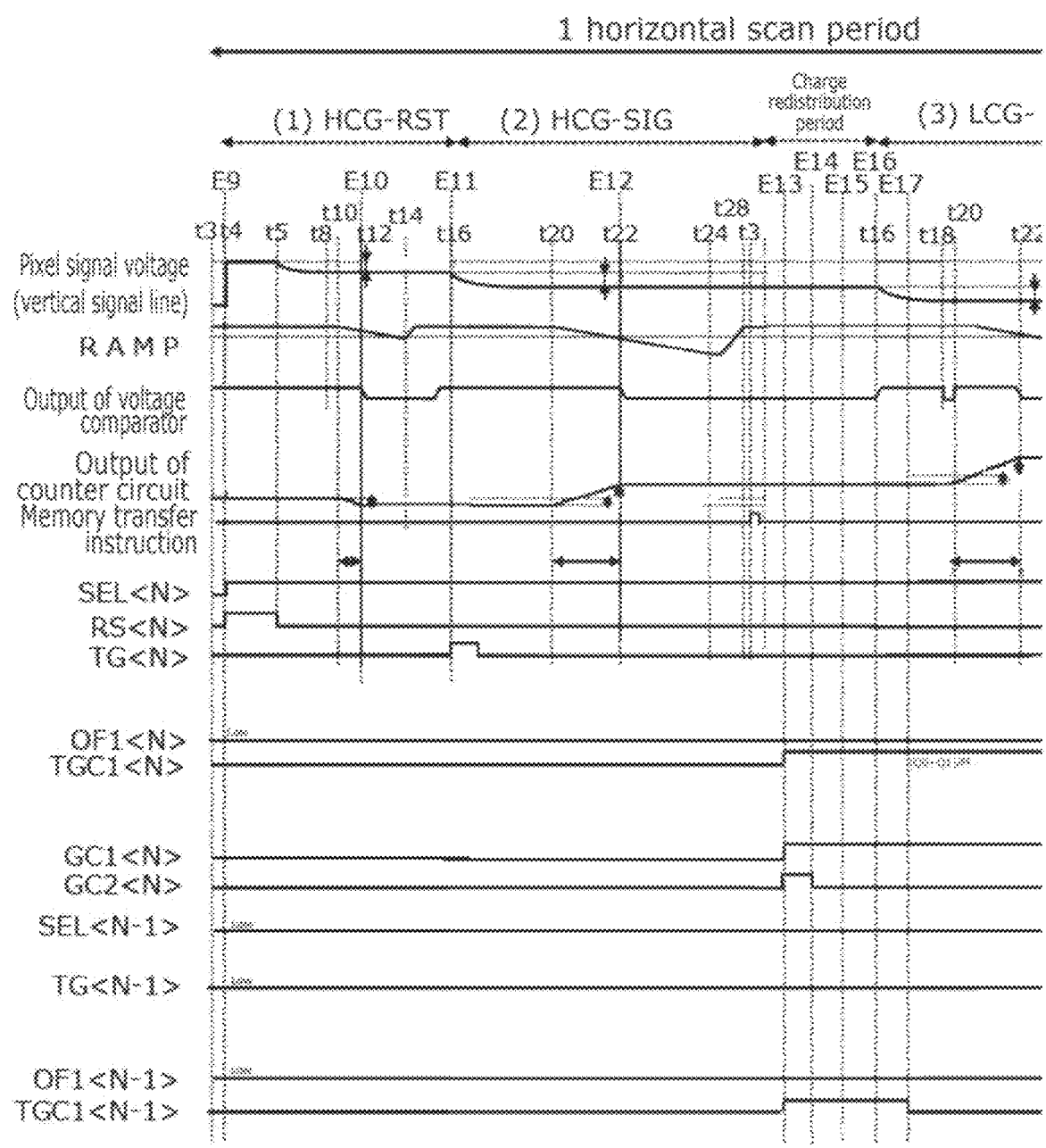
FIG. 68A is a time chart illustrating an example of pixel readout operations accompanied by gain control according to Embodiment 5.
Figure 68B:
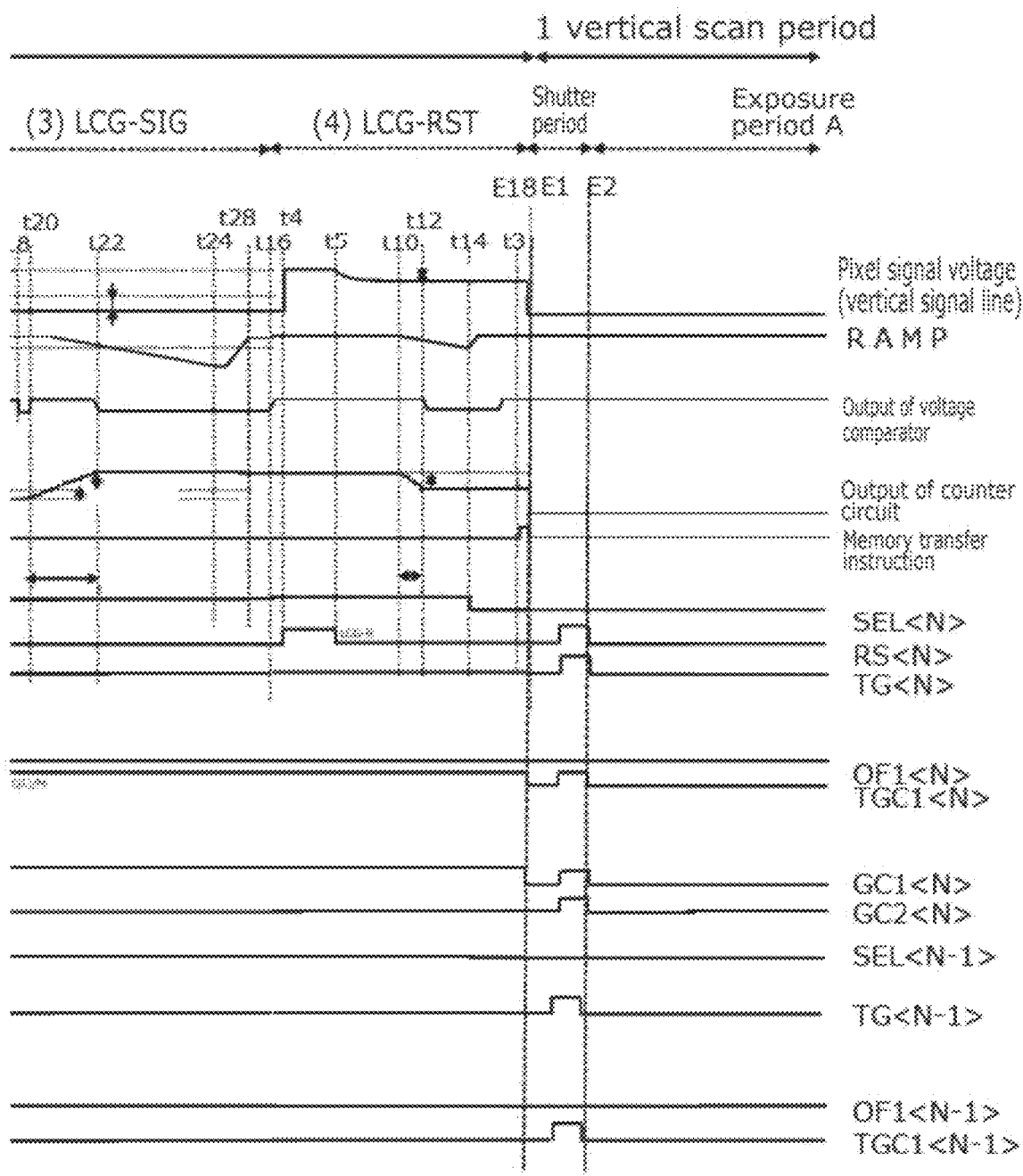
FIG. 68B is a continuation of the time chart of FIG. 68A illustrating an example of pixel readout operations accompanied by gain control according to Embodiment 5.

FIG. 66 illustrates the order in which a few frames are read out in Embodiment 5. FIG. 67 illustrates CDS order in 1 H, which is from HCG (R: reset component) to HCG (S: signal component) to LCG (S: signal component) and to LCG (R: reset component). FIG. 68A and FIG. 68B illustrate FIG. 9 as a base modified to this CDS order. In the transition from HCG (R: reset component) to HCG (S: signal component), pixel reset noise is cancelled. However, in the transition from LCG (S: signal component) to LCG (R: reset component), the DC offset (reset coupling) can be removed, but the pixel reset noise cannot be cancelled, and remains as kTC noise.

The kTC noise in this short exposure (high illuminance) appears on the low signal side. For example, this is illustrated in FIG. 49. Here, kTC noise is expressed as $\sqrt{(kTC)}$ at charge amount. Settings must be configured so that this noise is sufficiently smaller than the signal level. Accordingly, at the boundary between the short exposure (high illuminance) and the long exposure (low illuminance), it is necessary to sufficiently improve the latter SN more than the former SN.

[5.3 Readout Operation Accompanied by Gain Control]

FIG. 68A and FIG. 68B are time charts illustrating examples of pixel readout operations accompanied by gain control according to Embodiment 5, with the main part at 1 V period (1 vertical synchronization period) enlarged. In FIG. 68A and FIG. 68B, t* indicates the event number in FIG. 9. E* indicates the event number in FIG. 69A, FIG. 69B, and FIG. 69C.

Note that the content of FIG. 68A and FIG. 68B is non-limiting so long as the timing is a timing that achieves the same advantageous effects as the present embodiment.

For example, when reading out a signal, GC2<N> may be turned on just like GC1<N> without separating the charge mixed in FD1 and FD2 at GC2<N>, as in Embodiment 1 and Embodiment 2.

Gain GC1 that converts the signal charge at floating diffusion layer FD1 into voltage can be switched between a high gain and a low gain according to the on/off state of gain control transistor GC1. The period from HCG (R: reset component) to HCG (S: signal component) indicates a readout operation of a signal charge from photodiode PD to floating diffusion layer FD1 in a state in which the conversion gain of floating diffusion layer FD1 is high. The period from LCG (S: signal component) to LCG (R: reset component) indicates a readout operation of a signal charge from storage capacitive element C1 and storage capacitive element C2 to floating diffusion layer FD2 in a state in which the conversion gain of floating diffusion layer FD2 is low.

In order to charge redistribute the <N> row pixel signal and the <N−1> row pixel signal, gain control transistor GC2 performs mixing/separating (explanation of the detailed potential figures will be given later).

[5.4 Concept of Pixel Mixing]

Figure 70A:
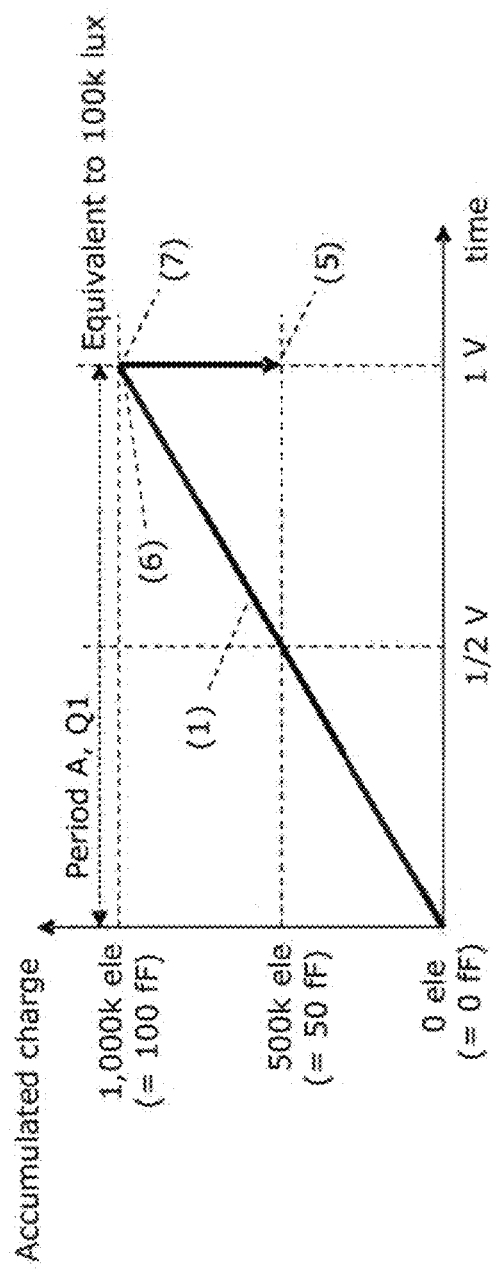
FIG. 70A is an explanatory diagram illustrating the concept of pixel mixing.

FIG. 70A, FIG. 70B, and FIG. 70C illustrate the concept of pixel mixing. FIG. 70A is an explanatory diagram illustrating the concept of pixel mixing. FIG. 70B and FIG. 70C are for explaining each point in FIG. 70A. FIG. 71 is an explanatory diagram of the scan periods in FIG. 70A. Note that explanation of the detailed potential figures will be given later.

First, the charge that overflows from photodiode PD is accumulated in C1<N>, and accumulated charge in C1 increases as the exposure time increases ((1) in the figures). If the capacitive element that accumulates the charge is sufficient, 100,000 lux can be received, whereby the dynamic range can be satisfied.

Then, finally, charge (Q0+Q1)/M of PD and C1<N>, and chargeless C1<N−1> are read out and FD mixed, charge redistributed, and attenuated, resulting in a signal charge of (Q0+Q1)/M ((5) in the figures).

A feature of the present embodiment is that a storage capacitive element is driven using the capacitance of an adjacent row whose charge has already been discharged to reduce capacitor surface area.

A feature of the exposure method according to the present embodiment is that LED light can be captured with certainty in a 1 V period (1 vertical synchronization period) exposure period since a continuous exposure method (PD and storage capacitive element) is employed, whereas LED light is failed to be captured if an intermittent exposure method via a chopper or the like is employed.

Figure 72:
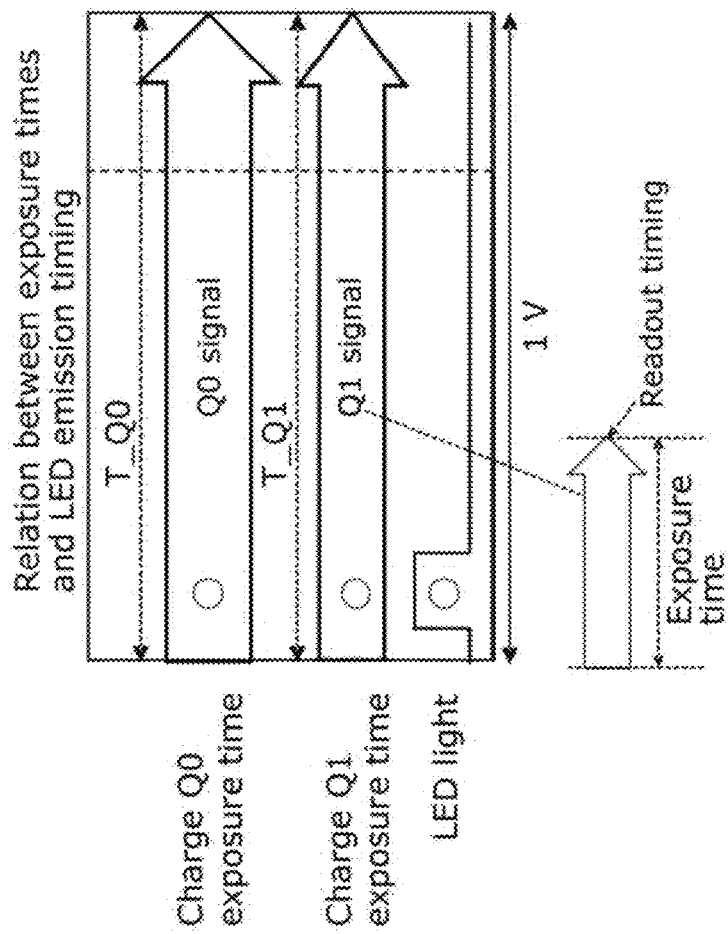
FIG. 72 illustrates timing related to the accumulating of charges of a photodiode and a storage capacitive element.
Figure 73:
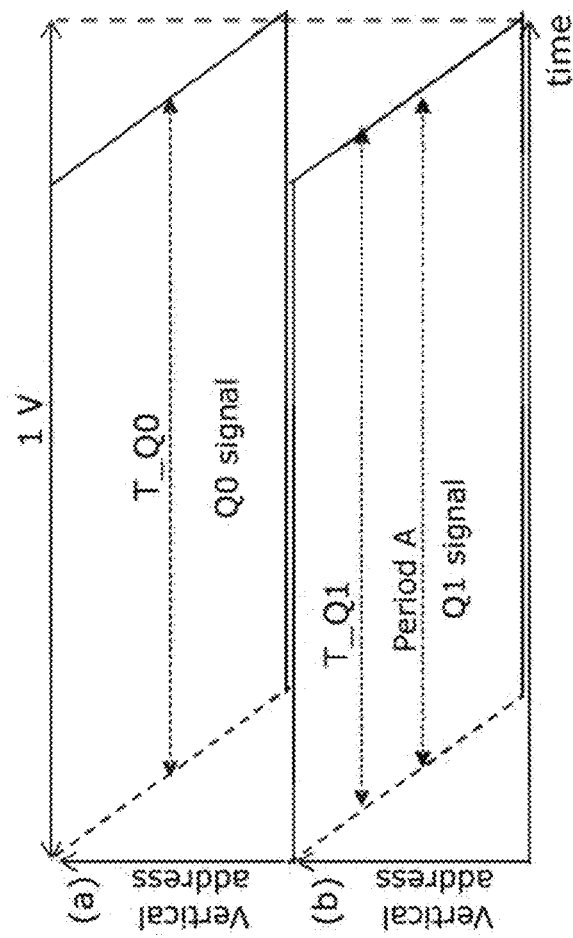
FIG. 73 illustrates timing related to the accumulating of charges of a photodiode and a storage capacitive element.

FIG. 72 and FIG. 73 illustrate timing related to the accumulating of charges of photodiode PD and storage capacitive element C1. Photodiode PD is continuously exposed during the 1 V period (1 vertical synchronization period) and the charge amount is Q0. Storage capacitive element C1<N> that receives the charge that overflows from this photodiode PD is continuously exposed during the 1 V period (1 vertical synchronization period) and the charge amount is Q1. Moreover, since photodiode PD is completely exposed during the 1 V period, it is possible to capture LED light.

[5.5 WDR]

A feature of the present embodiment is that the two frames—the long frame (low-illuminance frame) and the short frame (high-illuminance frame)—combined to achieve a WDR are exposed at exactly the same timing and the exact same pixels are used, which inhibits false colors, coloring, and blur.

Figure 74:
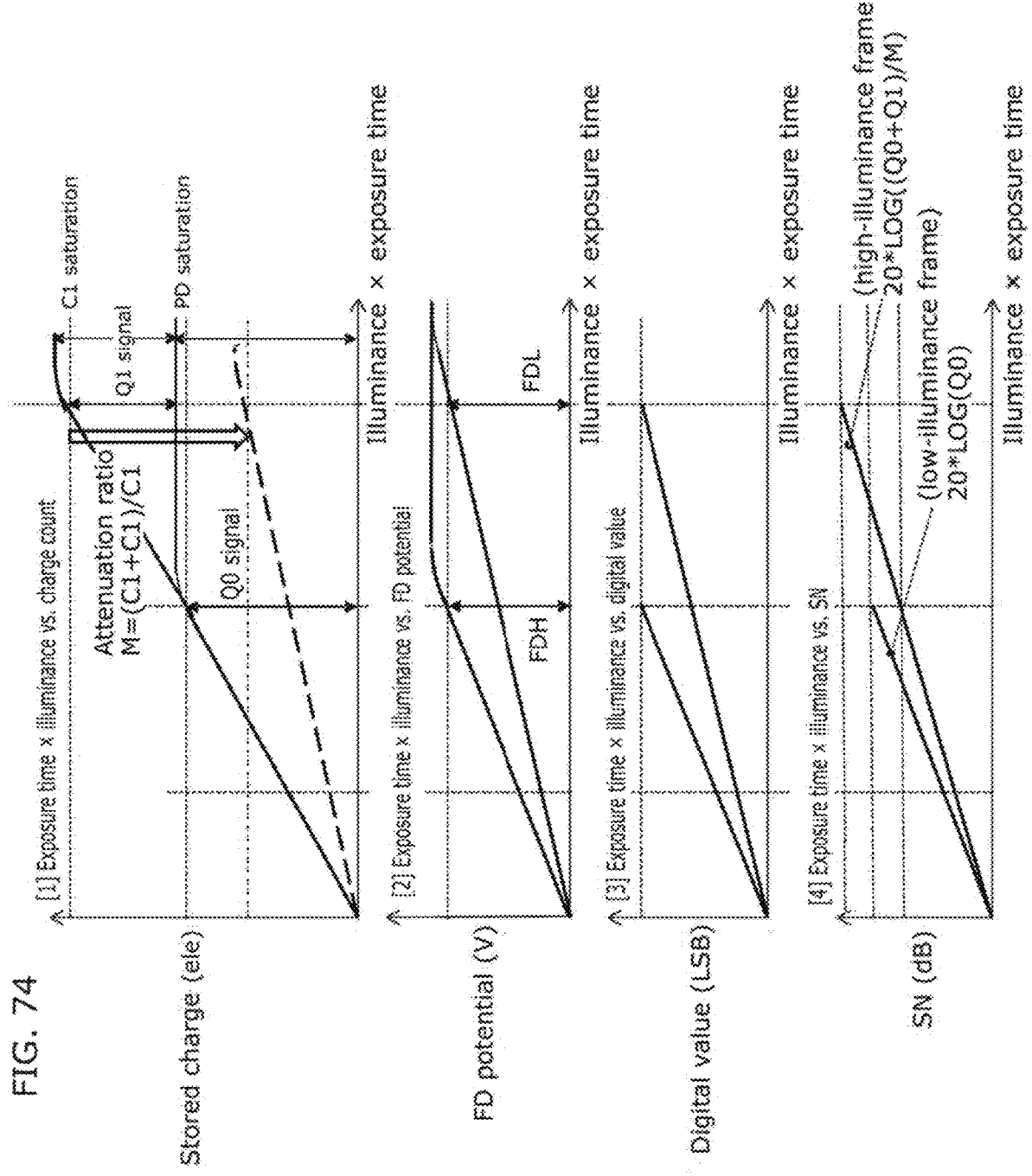
FIG. 74 illustrates [1] charge accumulation level, [2] FD potential, [3] value after AD conversion, and [4] SN relative to the product of illuminance and exposure time.

FIG. 19A and FIG. 74 illustrate an outline of a combining method to achieve a WDR. The WDR is achieved by using the signal charge of Q0 as the long exposure (low illuminance) and the signal charge of (Q0+Q1)/M as the short exposure (high illuminance).

The product of illuminance and exposure time, illuminance at a certain time, or exposure time at a certain illuminance is represented on the horizontal axes of [1], [2], [3], and [4] in FIG. 74. In [1], charge accumulation level is represented on the vertical axis. In [2], FD potential is represented on the vertical axis. In [3], the value after AD conversion is represented on the vertical axis. In [4], SN is represented on the vertical axis.

Figure 75:
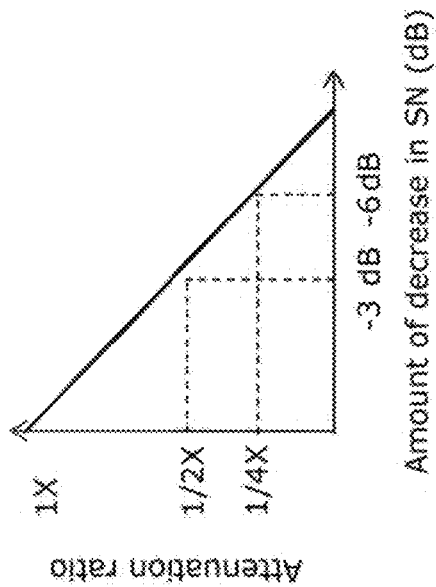
FIG. 75 illustrates SN degradation that accompanies an attenuation ratio of an exposure (high illuminance).

FIG. 75 illustrates SN degradation that accompanies attenuation ratio M of the short exposure (high illuminance). Since SN is determined by shot noise, for example, when attenuation ratio M is double, the SN at the boundary drops by 3 dB. Although the capacitance ratio of storage capacitive element (C1) and storage capacitive element (C2) can be set at an arbitrary attenuation ratio M, SN degradation observed in the WDR result at the boundary of the frames is the benchmark.

FIG. 76 illustrates signal charge amount and FD potential at the first readout, Read1, and the second readout, Read2.

Figure 77:
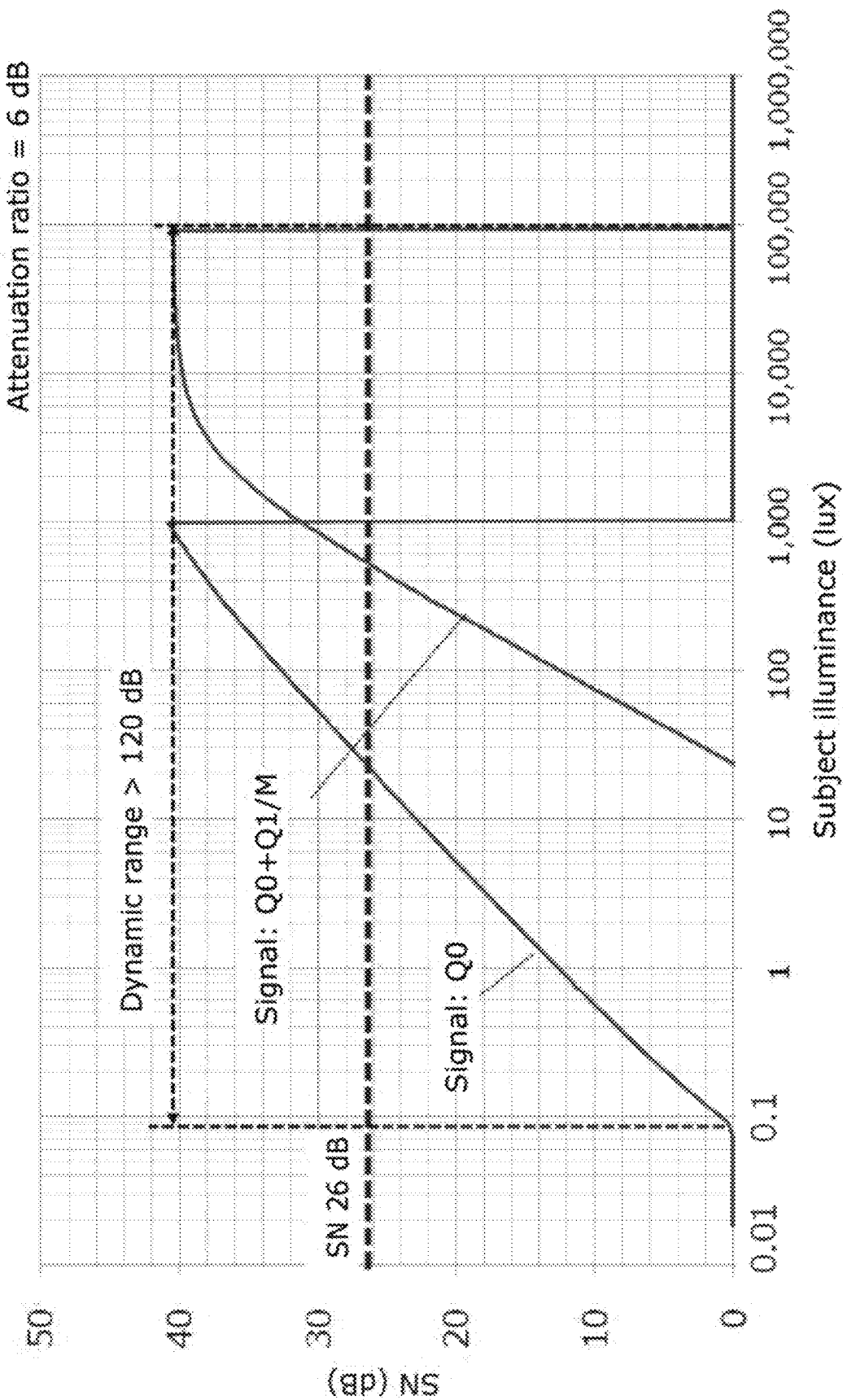
FIG. 77 illustrates the relationship between subject illuminance and gain (SN ratio) according to Embodiment 5.

FIG. 77 is an actual result of combination wherein the first Read1 is the long frame (low-illuminance frame) of the WDR and the second Read2 is the short frame (high-illuminance frame) of the WDR. The SN at the connecting part of the frames is at least 26 dB and the dynamic range is at least 120 dB.

WDR circuit 76 included in signal processor 70 is illustrated in greater detail in FIG. 19A or FIG. 19B.

The pixel signal (long) of the first low-illuminance frame and the pixel signal (short) of the second high-illuminance frame are combined. This combining achieves a wide dynamic range function (WDR function), or stated differently, functions to extend the dynamic range.

Moreover, regarding the pixel signal (long frame) of the first low-illuminance frame, the gain within the pixel is set high, and regarding the pixel signal (short frame) of the second high-illuminance frame, the gain within the pixel is set low, whereby noise at low illuminances is improved and the dynamic range is extended at high illuminances.

[5.6 Pixel Potential Structure]

Figure 69A:
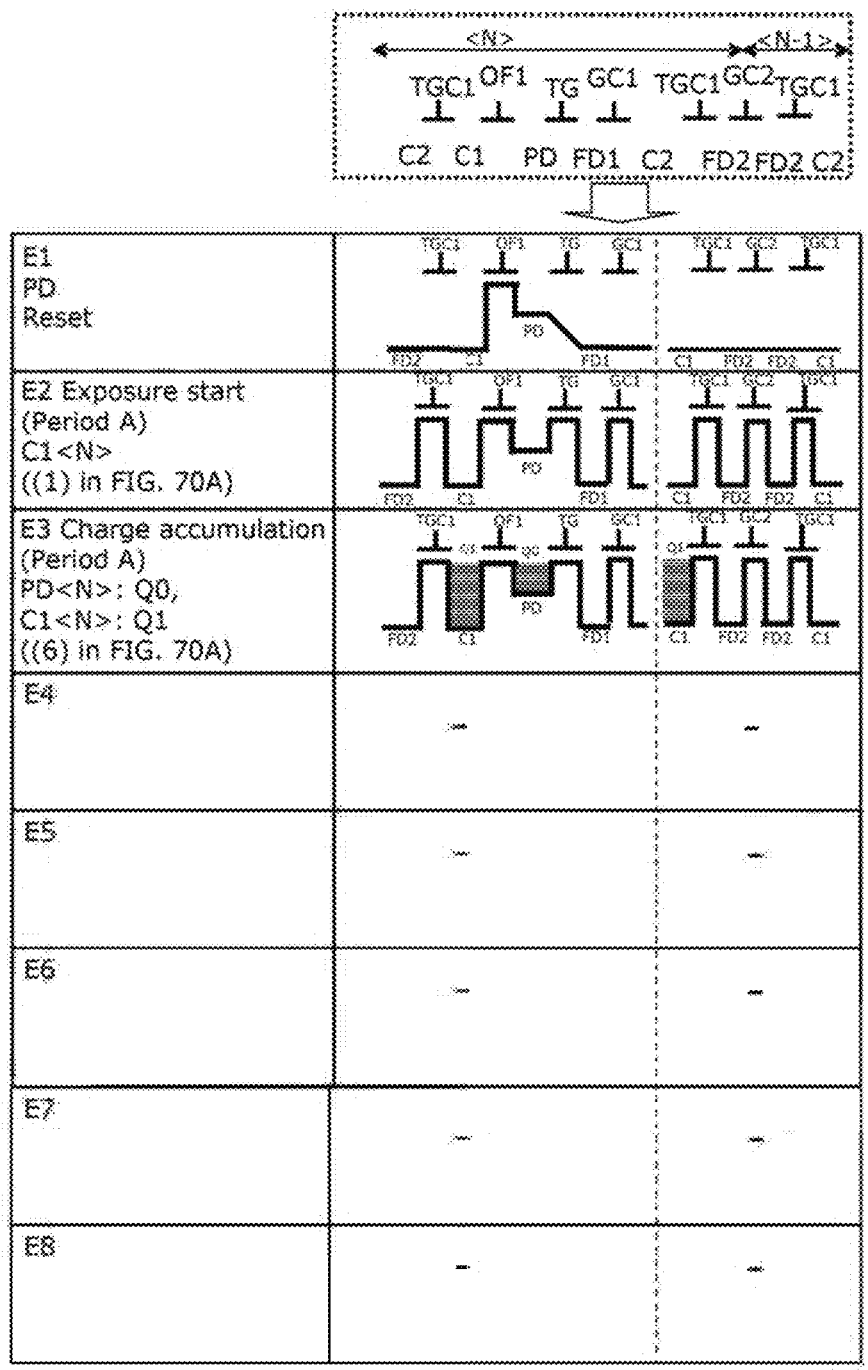
FIG. 69A illustrates potentials at main points in FIG. 68A and FIG. 68B.
Figure 69B:
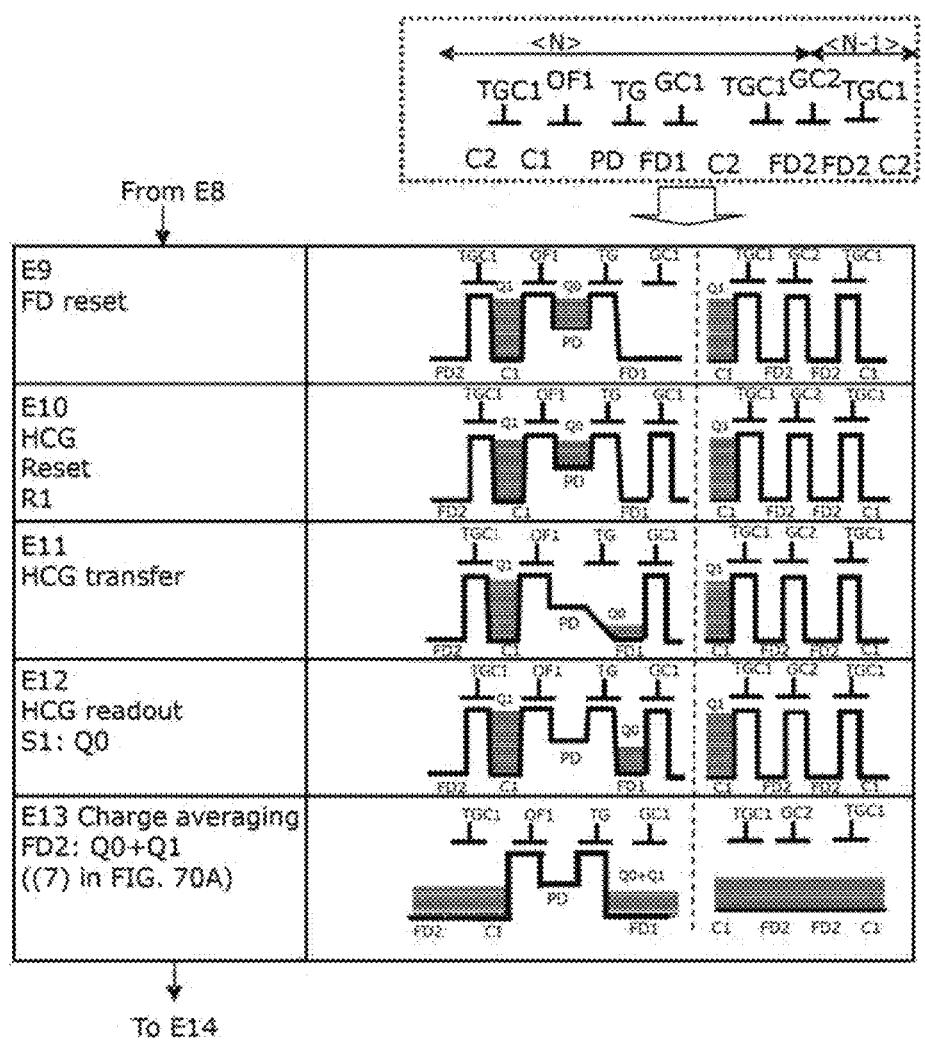
FIG. 69B is a continuation from FIG. 69A illustrating potentials at main points in FIG. 68A and FIG. 68B.
Figure 69C:
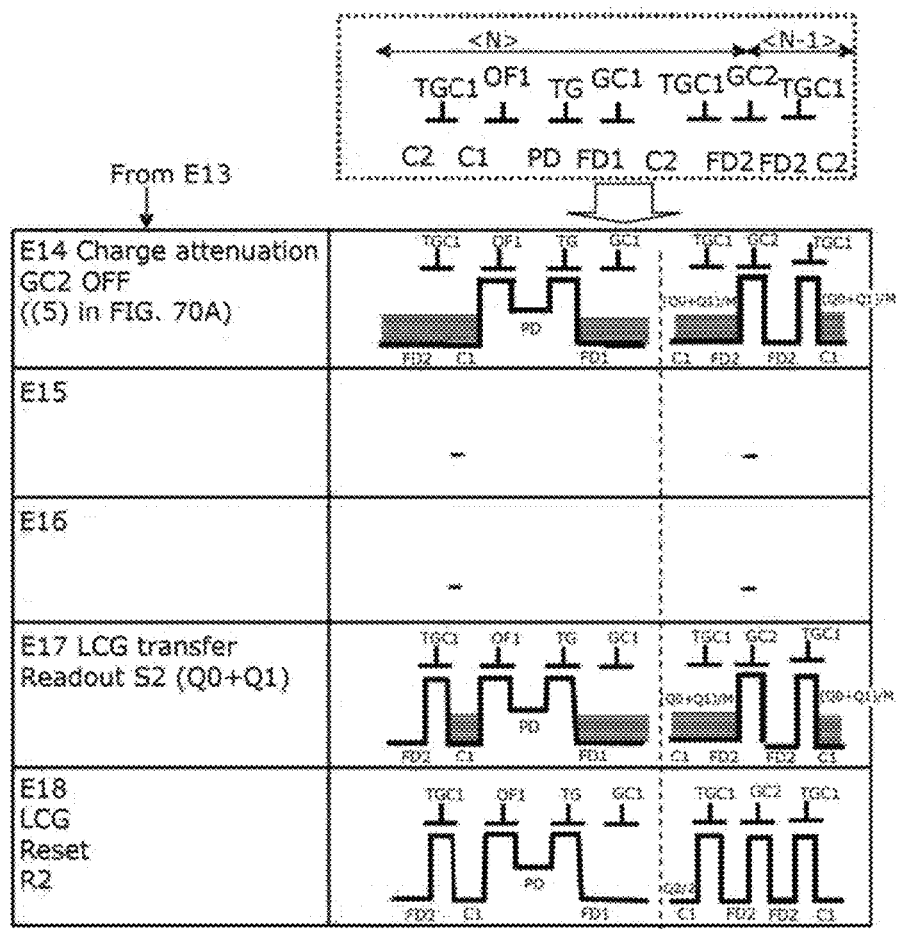
FIG. 69C is a continuation from FIG. 69B illustrating potentials at main points in FIG. 68A and FIG. 68B.

FIG. 69A through FIG. 69C illustrate potentials at main points in FIG. 68A and FIG. 68B.

Events are denoted as E1 through E18, and will now be described in order.

E1 is the reset of FD1. The charge of the PD part is discharged by turning reset transistor RS<N>, transfer transistor TG<N>, and gain control transistor GC1<N> on.

E2 is the start of exposure in period A. Reset transistor RS<N>, transfer transistor TG<N>, and gain control transistor GC1<N> are turned off.

E3 is the accumulation of charge in period A. Signal charge Q0 is accumulated in photodiode PD, and further, Q1 is accumulated in storage capacitive element C1<N>.

E9 is the reset of FD1. The charge of the FD1 part is discharged by turning reset transistor RS<N> and gain control transistor GC1<N> on.

E10 is the reset of HCG. The HCG state is achieved by turning reset transistor RS<N> and gain control transistor GC1<N> off.

E11 transfers the charge of photodiode PD to the FD1 part by turning transfer transistor TG<N> on.

E12 reads out charge Q0 of photodiode PD accumulated in the FD1 part by turning transfer transistor TG<N> off (HCG signal).

E13 reads out charge Q1 of storage transfer transistor C1<N> to Q0 of the FD1 part, turns GC2<N> on, and performs averaging and charge redistribution with C1<N−1>.

In E14, the signal for LCG is attenuated as (Q0+Q1)/M.

In E17, charge amount (Q0+Q1)/M of storage transfer transistor C1<N> is read out (LCG signal). Here, attenuation ratio M=(C1<N>+C1<N−1>)/C1<N>.

In E18, the signals of FD1 and FD2 are reset and the readout operation ends.

Problems related to the overflow of the charge from photodiode PD are the mixing of colors and linearity deviation that accompany the leaking of charge to other elements. Accordingly, the following condition is necessary regarding potential barrier height at each overflow. The charge that overflows from photodiode PD flows in this order: overflow gates OF1, 2<transfer transistor TG, storage transfer transistors TGC1, 2<separation layer.

Note that regarding the overflow gate voltage in particular, there tends to be variations in saturation levels caused by manufacturing variances. Accordingly, regarding the voltages of overflow gate OF1 and overflow gate OF2 in particular, before shipment, it is preferable that trimming is performed to inhibit variations in saturation levels.

Embodiment 6

Hereinafter, an imaging apparatus according to Embodiment 6 will be described with reference to the drawings. Note that the imaging apparatus according to the present embodiment includes one or more solid-state imaging apparatuses 100 according to Embodiment 1 through Embodiment 5 described above. The imaging apparatus will now be described in greater detail.

Figure 78:
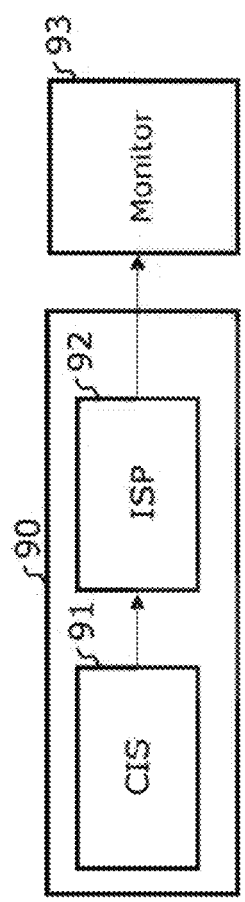
FIG. 78 is a diagram illustrating an example of a configuration of an imaging apparatus according to Embodiment 6.

FIG. 78 is a block diagram of a view system, and illustrates an example of the imaging apparatus according to Embodiment 6. The imaging apparatus in the same figure includes CMOS image sensor (CIS) 91, image signal processor (ISP) 92, and monitor 93. The imaging apparatus is, for example, a digital camera or the camera of a smartphone or the like. CIS 91 corresponds to solid-state imaging apparatus 100 described in the above embodiments. ISP 92 receives an image signal from CIS 91 and performs image processing on the image signal, such as enlarging, shrinking, compression encoding, decoding, etc. Monitor 93 is for the user to check the capturing of images.

Note that CIS 91 and ISP 92 may be realized as a system on a chip (SoC) 90, i.e., may be integrated on a single chip, or as individual chips. When CIS 91 and ISP 92 are individual chips, signal processor 70 may be provided in CIS 91 or ISP 92. Moreover, part of signal processor 70 may be realized as software instead of circuitry.

Figure 79:
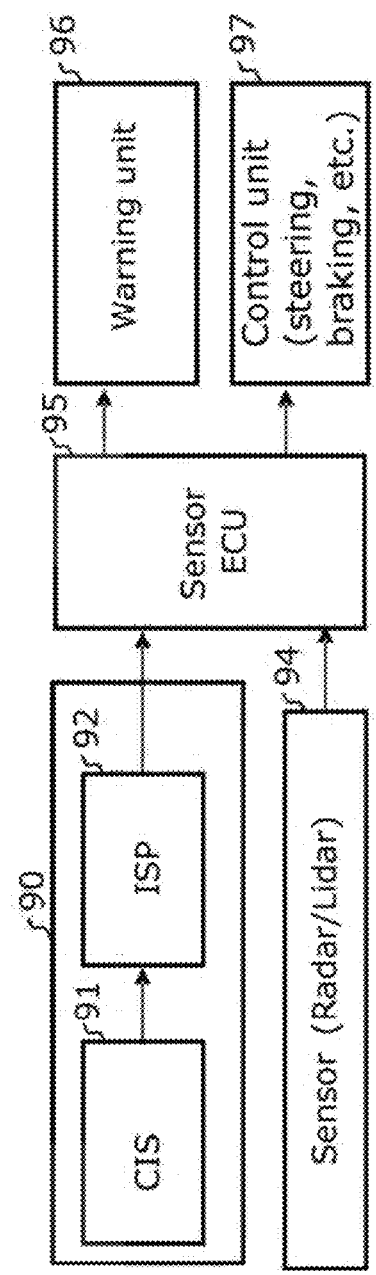
FIG. 79 is a diagram illustrating another example of a configuration of the imaging apparatus according to Embodiment 6.

FIG. 79 is a block diagram of an advanced driver assistance systems (ADAS) sensing system or an autonomous driving sensing system, and illustrates another example of the imaging apparatus according to Embodiment 6. The imaging apparatus in the same figure includes CMOS image sensor (CIS) 91, image signal processor (ISP) 92, sensor 94, sensor electronic control unit (ECU) 95, warning unit 96, and control unit 97. The imaging apparatus is, for example, a camera system provided in an automobile. CIS 91 and ISP 92 correspond to signal processor 70. Sensor 94 is, for example, a radar sensor for measuring distance or a light detection and ranging (lidar) sensor for measuring distance. Sensor ECU 95 receives signals from ISP 92 and sensor 94, and controls warning unit 96 and control unit 97 accordingly.

Warning unit 96 is, for example, a warning lamp or a status indicator lamp in the instrument panel of the automobile. Control unit 97 controls, for example, actuators that move steering and braking mechanisms in the automobile.

Note that the imaging apparatus illustrated in FIG. 1 may be connected to a monitor in the view system, may be compatible with an advanced driver assistance systems (ADAS) sensing system or an autonomous driving sensing system, and may give warnings or carry out control (steering, braking, etc.) via the sensor ECU in the sensing system.

Figure 80:
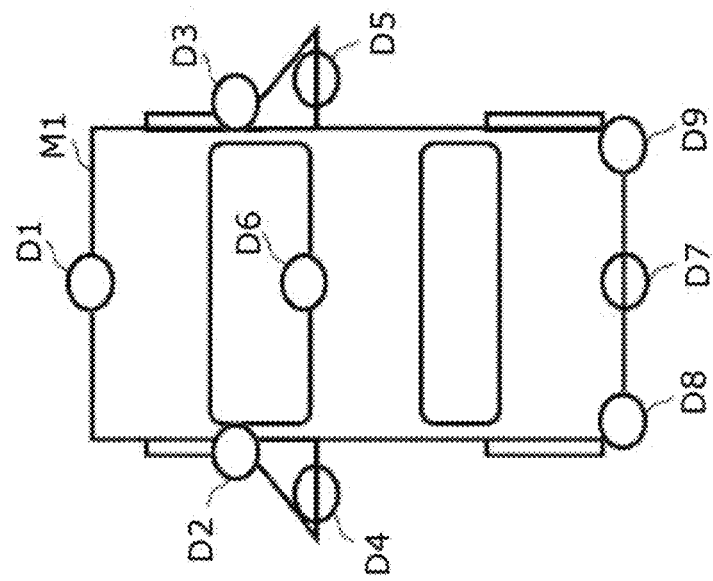
FIG. 80 illustrates an example of how an automobile is provided with the imaging apparatus according to Embodiment 6.
Figure 81:
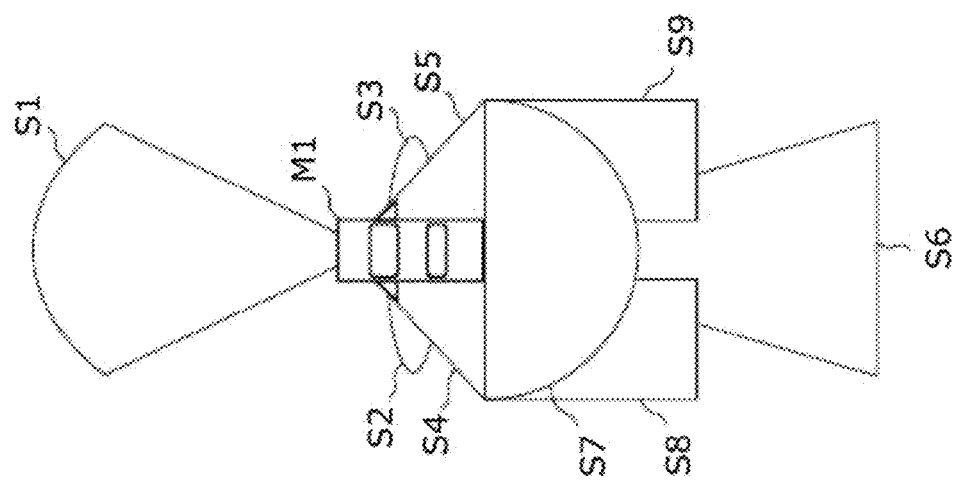
FIG. 81 illustrates an example of imaging ranges corresponding to the example in FIG. 80 according to Embodiment 6.

FIG. 80 illustrates an example of how automobile M1 is provided with the imaging apparatus according to Embodiment 6. FIG. 81 illustrates an example of imaging ranges corresponding to the example in FIG. 80 according to Embodiment 6.

In FIG. 80, for example, imaging apparatuses, each of which is the imaging apparatus illustrated in FIG. 1, are attached at attachment locations D1 through D9. Attachment location D1 is the front of automobile M1. Attachment location D2 is the left side of the body of automobile M1. Attachment location D3 is the right side of the body of automobile M1. Attachment location D4 is the left side-view mirror. Attachment location D5 is the right side-view mirror. Attachment location D6 is the rear-view mirror. Attachment location D7 is the central region of the rear of automobile M1. Attachment location D8 is the left side of the rear of automobile M1. Attachment location D9 is the right side of the rear of automobile M1.

In FIG. 81, imaging ranges S1 through S9 correspond to the cameras at attachment locations D1 through D9, respectively.

As illustrated in FIG. 80 and FIG. 81, imaging apparatuses can be positioned to function as front-view, surround-view, side-view, rear-view, or intelligent-rear-view cameras for a view system or sensing on transport equipment (vehicle, automobile), according to their respective imaging ranges.

As described above, the imaging apparatus according to Embodiment 6 includes the imaging apparatus described above and illustrated in FIG. 1, and forms any one of a view system, an advanced driver assistance systems (ADAS) sensing system, or an autonomous driving sensing system.

Here, the imaging apparatus is provided in at least one of a front mirror, a left side-mirror, a right side-mirror, or a rear-view mirror of the transport equipment.

The distance measuring device according to Embodiments 1 through 6 described above includes: photodiode PD that generates a signal charge dependent on an amount of light received; an overflow element group that accumulates a signal charge that overflows from photodiode PD; and floating diffusion layer FD that selectively holds a signal charge transferred from photodiode PD and a signal charge transferred from the overflow element group. The overflow element group includes m groups (m≥2) connected in series in stages, each group including overflow element OF and storage capacitive element C, whereby the overflow element groups include overflow elements OF1 through OFm and storage capacitive elements C1 through Cm. Each overflow element OF1 through OFm transfers, to the storage capacitive element among C1 through Cm that is included in the same group as the overflow element, a signal charge that overflows from photodiode PD or a signal charge from an upstream storage capacitive element among C1 through C(m−1).

Here, a signal charge accumulated in a storage capacitive element among C1 through Cm may be attenuated by charge redistribution using the storage capacitive element, either during an exposure time and after the exposure time or after the exposure time.

Here, the signal charge may be used in generation of a low-illuminance frame and a high-illuminance frame that are for a wide dynamic range function (WDR function) and have different degrees of exposure contrasts. A signal charge of photodiode PD may be used for the low-illuminance frame. A signal charge attenuated by the charge redistribution may be used for the high-illuminance frame. A pixel signal of the low-illuminance frame and a pixel signal of the high-illuminance frame that have the same coordinates may be signal charges that are from the same pixel and have the same exposure time.

Here, 1 V (one vertical scan period) may be divided into first exposure period A and second exposure period B. During first exposure period A, a signal charge that overflows from photodiode PD may be accumulated in eleventh storage capacitive element C(m−1). After first exposure period A, a signal charge of twelfth storage capacitive element Cm may be held as a signal charge redistributed with eleventh storage capacitive element C(m−1), and a signal charge of eleventh storage capacitive element C(m−1) may be discharged. During second exposure period B, a signal charge that overflows from photodiode PD may be accumulated in eleventh storage capacitive element C(m−1). After second exposure period B, a signal of photodiode PD and a signal charge attenuated by redistribution of the signal charge accumulated in eleventh storage capacitive element C(m−1) with thirteenth storage capacitive element Cm in an adjacent row are held. Next, the signal charge of twelfth storage capacitive element Cm and the signal charge of thirteenth storage capacitive element Cm in the adjacent row may be mixed in the floating diffusion layer and read out. Eleventh storage capacitive element C(m−1) may be storage capacitive element C(m−1) located one stage before the last stage, twelfth storage capacitive element Cm may be storage capacitive element Cm located in the last stage, and thirteenth storage capacitive element Cm may be storage capacitive element Cm located in the last stage in an adjacent pixel of the adjacent row.

Here, one vertical scan period may be divided into first exposure period A, second exposure period B, and third exposure period C. During first exposure period A, a signal charge that overflows from photodiode PD may be held while being attenuated by redistribution between twenty first storage capacitive element Cm−1 and twenty second storage capacitive element Cm. After first exposure period A, the signal charge of twenty first storage capacitive element Cm−1 may be discharged. During second exposure period B, a signal charge that overflows from photodiode PD may be accumulated in twenty first storage capacitive element Cm−1. After second exposure period B, twenty second storage capacitive element Cm may hold a signal charge attenuated by redistribution with twenty first storage capacitive element Cm−1, and the signal charge of twenty first storage capacitive element Cm−1 may be discharged. During third exposure period C, a signal charge that overflows from photodiode PD may be further accumulated in twenty first storage capacitive element Cm−1. After third exposure period C, a signal charge of twenty first storage capacitive element Cm−1, a signal of photodiode PD, and a signal charge attenuated by redistribution with twenty third storage capacitive element Cm−1 in an adjacent row may be held. Next, the signal charge of twenty first storage capacitive element Cm−1 and the signal charge of twenty second storage capacitive element Cm may be mixed in the floating diffusion layer and read out. Twenty first storage capacitive element C(m−1) may be storage capacitive element C(m−1) located one stage before the last stage, twenty second storage capacitive element Cm may be storage capacitive element Cm located in the last stage, and twenty third storage capacitive element Cm may be storage capacitive element C(m−1) located one stage before the last stage in an adjacent pixel of the adjacent row.

Here, exposure period A may be set to the same length as one vertical scan period. During exposure period A, a signal charge that overflows from photodiode PD may be accumulated in thirty first storage capacitive element Cm. After exposure period A, a signal of photodiode PD and a charge attenuated by redistribution of the signal charge accumulated in thirty first storage capacitive element Cm with thirty second storage capacitive element Cm in an adjacent row may be held, mixed in the floating diffusion layer, and read out. Thirty first storage capacitive element Cm may be a last-stage storage capacitive element Cm, and thirty second storage capacitive element Cm may be a last-stage storage capacitive element Cm in an adjacent pixel of the adjacent row.

Here, solid-state imaging apparatus 100 may include: a pixel array of pixel cells each including a plurality of unit pixels. Each of the plurality of unit pixels may include photodiode PD, the overflow element group, first transfer transistor TG, capacitive element C0, first storage transfer transistor TGC1, second storage transfer transistor TGC2, and floating diffusion layer FD. Floating diffusion layer FD may include first floating region FD1 and second floating region FD2. A signal charge of photodiode PD may be transferred, via first transfer transistor TG, to first floating region FD1 that includes capacitive element C0. The signal charge of photodiode PD may be transferred to first stage storage capacitive element C1 via first stage overflow element OF1. The signal charge of first stage storage capacitive element C1 may be transferred to second floating region FD2 via first storage transfer transistor TGC1. The signal charge of first stage storage capacitive element C1 may be transferred to second stage storage capacitive element C2 via second stage overflow element OF2. The signal charge of second stage storage capacitive element C2 may be transferred to second floating region FD2 via second storage transfer transistor TGC2. Each of the pixel cells may include gain control transistor GC1 that controls whether to connect first floating region FD1 and second floating region FD2.

Here, each of the plurality of unit pixels may further include third storage transfer transistor TGC3. The signal charge of second stage storage capacitive element C2 may be transferred to third stage storage capacitive element C3 via second stage overflow element OF2. The signal charge of third stage storage capacitive element C3 may be transferred to second floating region FD2 via third storage transfer transistor TGC3.

Here, each of the pixel cells may not include second storage transfer transistor TGC2, and second stage overflow element OF2 may have the characteristics of a bidirectional switch.

Here, each of the pixel cells may not include third storage transfer transistor TGC3, and third stage overflow element OF3 may have the characteristics of a bidirectional switch.

Here, second stage storage capacitive element C2, second storage transfer transistor TGC2, and second stage overflow element OF2 may be omitted.

Here, each of the pixel cells may include reset transistor RS, amplification transistor SF, and selection transistor SEL. In each of pixel cells, the plurality of unit pixels may share reset transistor RS, amplification transistor SF, and selection transistor SEL. In each of the plurality of unit pixels, the floating diffusion layer may be connected to gain control transistor GC2.

Here, one end (the voltage application end) of the storage capacitive element may be set to an intermediate potential between a potential of a pixel power supply potential and a potential of GND. Upon activation of the shutter, connection to the pixel power supply may be made and a maximum positive voltage difference may be applied. During exposure, a voltage of another end (the signal charge accumulation end) of the storage capacitive element may be capable of being reduced from the pixel power supply to a maximum negative voltage difference over the exposure time.

This makes it possible to improve dark current characteristics of the pixel since the dynamic range of the signal is increased and the voltage of the other end (the signal charge accumulation end) of the storage capacitive element is reduced.

Here, one end of the storage capacitive element may be made of polysilicon.

Here, when a pixel cell among the pixel cells has a vertical two-pixel single-cell structure, the gain control element (GC2) may be provided every two rows, and when a pixel cell among the pixel cells has a four-pixel single-cell structure, the gain control element (GC2) may be provided every four rows.

Here, a signal charge from a unit pixel may be used in the generation of two frames, the two frames being a low-illuminance frame and a high-illuminance frame that are for a wide dynamic range function (WDR function). The high-Illuminance frame may be based on the signal charge attenuated by the charge redistribution. A pixel signal from the low-illuminance frame and a pixel signal from the high-illuminance frame may have the same exposure time.

Here, a signal charge from a unit pixel may be used in the generation of three frames, the three frames being a low-illuminance frame, a middle-illuminance frame, and a high-illuminance frame that are for a wide dynamic range function (WDR function). The high-illuminance frame may be based on the signal charge attenuated by the charge redistribution. A pixel signal from the low-illuminance frame, a pixel signal from the middle-illuminance frame, and a pixel signal from the high-illuminance frame may have the same exposure time.

Here, pixel signals for correlated double sampling (CDS) may be read out in listed order of a reset component for the high-illuminance frame (HGC-R), a signal component for the high-illuminance frame (HGC-S), a signal component for the low-illuminance frame (LGC-S), and a reset component for the low-illuminance frame (LGC-R).

Here, pixel signals for correlated double sampling (CDS) may be read out in listed order of a reset component for the high-illuminance frame (HGC-R), a signal component for the high-illuminance frame (HGC-S), a signal component for the middle-illuminance frame (MGC-S), a signal component for the low-illuminance frame (LGC-S), a reset component for the low-illuminance frame (LGC-R), and a reset component for the middle-illuminance frame (MGC-R).

Here, the solid-state imaging apparatus may include a top chip and a bottom chip. The top chip may be a back-side illumination image sensor. The bottom chip may be mounted with circuit components and a capacitive element may be arranged on the uppermost layer on the wiring side thereof. The top chip and the bottom chip may be put together with their wiring sides facing each other. The capacitive element on the bottom chip may be used as the storage capacitive element of the unit pixel of the top chip.

Here, solid-state imaging apparatus 100 may include: photodiode PD that generates a signal charge dependent on an amount of light received; storage capacitive element C1 that accumulates a signal charge that overflows from photodiode PD; overflow element OF1 that transfers the signal charge that overflows from photodiode PD to storage capacitive element C1; and a floating diffusion layer that selectively holds a signal charge transferred from photodiode PD and a signal charge transferred from storage capacitive element C1.

An imaging apparatus includes solid-state imaging apparatus 100 described above. The imaging apparatus is compatible with at least one of a view system for transport equipment, an advanced driver assistance systems (ADAS) sensing system for transport equipment, or an autonomous driving sensing system for transport equipment. The imaging apparatus is provided in at least one of a front-view mirror, a surround-view mirror, a side mirror, a rear tailgate mirror, or a rear-view mirror of the transport equipment.

Other Embodiments

The solid-state imaging apparatus and the imaging apparatus including the solid-state imaging apparatus according to the present disclosure have been described based on exemplary embodiments, but are not limited thereto. Those skilled in the art will readily appreciate that variations resulting from arbitrarily combining elements from the exemplary embodiments, variations resulting from modifying the exemplary embodiments that do not depart from the scope of the present disclosure, and various devices equipped with the solid-state imaging apparatus and the imaging apparatus including the solid-state imaging apparatus according to the present disclosure are included in the present invention.

INDUSTRIAL APPLICABILITY

The present disclosure is applicable in solid-state imaging apparatuses and imaging apparatuses.

The invention claimed is:
1. A solid-state imaging apparatus, comprising:
a photodiode that generates a signal charge dependent on an amount of light received;
an overflow element group that accumulates an overflow signal charge that overflows from the photodiode; and
a floating diffusion layer that selectively holds a transferred signal charge transferred from the photodiode via a first transfer transistor and the overflow signal charge transferred from the overflow element group, wherein:
the overflow element group is disposed at an opposite side of the floating diffusion layer with respect to the first transfer transistor on a path connecting the floating diffusion layer, the first transfer transistor and the overflow element group,
the overflow element group comprises m groups connected in series in stages, each group comprising an overflow element and a storage capacitive element, m≥2, and
the overflow element among the m groups transfers, to the storage capacitive element included in a same group as the overflow element, the overflow signal charge that overflows from the photodiode or a subsequent overflow signal charge from an upstream storage capacitive element among the m groups, and the storage capacitive element stores the overflow signal charge of the subsequent overflow signal charge as a stored signal charge.
2. The solid-state imaging apparatus according to claim 1, wherein the stored signal charge accumulated in the storage capacitive element of each of the m groups is attenuated by charge redistribution using the storage capacitive element, either during an exposure time and after the exposure time or after the exposure time.
3. The solid-state imaging apparatus according to claim 2, wherein:
the signal charge of the photodiode is used for a low-illuminance frame,
an attenuated stored signal charge attenuated by the charge redistribution is used for a high-illuminance frame,
the low-illuminance frame and the high-illuminance frame are for a wide dynamic range function and have different degrees of exposure contrast, and
a pixel signal of the low-illuminance frame and a pixel signal of the high-illuminance frame that have same coordinates are signal charges that are from a same pixel and have a same exposure time.
4. The solid-state imaging apparatus according to claim 1, wherein one vertical scan period is divided into a first exposure period and a second exposure period,
during the first exposure period, a charge that overflows from the photodiode is accumulated in a first storage capacitive element,
after the first exposure period, a first signal charge of the first storage capacitive element is discharged and a second signal charge of a second storage capacitive element is held as a redistributed signal charge redistributed with the first storage capacitive element,
during the second exposure period, the overflow signal charge that overflows from the photodiode is accumulated in the first storage capacitive element,
after the second exposure period, the signal charge of the photodiode and an attenuated signal charge attenuated by redistribution of the signal charge accumulated in the first storage capacitive element with a third storage capacitive element in an adjacent row are held,
next, the second signal charge of the second storage capacitive element and a third signal charge of the third storage capacitive element in the adjacent row are mixed in the floating diffusion layer and read out, and
the first storage capacitive element is a storage capacitive element located one stage before a last stage, the second storage capacitive element is a storage capacitive element located in the last stage, and the third storage capacitive element is a storage capacitive element located in the last stage in an adjacent pixel of the adjacent row.
5. The solid-state imaging apparatus according to claim 1, wherein one vertical scan period is divided into a first exposure period, a second exposure period, and a third exposure period,
during the first exposure period, the overflow signal charge that overflows from the photodiode is held while being attenuated by redistribution between a first storage capacitive element and a second storage capacitive element,
after the first exposure period, a first signal charge of the first storage capacitive element is discharged,
during the second exposure period, the overflow signal charge that overflows from the photodiode is accumulated in the twenty first storage capacitive element,
after the second exposure period, the second storage capacitive element holds an attenuated signal charge attenuated by redistribution with the first storage capacitive element, and the first signal charge of the first storage capacitive element is discharged, during the third exposure period, the overflow signal charge that overflows from the photodiode is further accumulated in the first storage capacitive element, after the third exposure period, the first signal charge of the first storage capacitive element, the signal charge of the photodiode, and an attenuated signal charge attenuated by redistribution with a third storage capacitive element in an adjacent row are held, next, the first signal charge of the first storage capacitive element and a second signal charge of the second storage capacitive element are mixed in the floating diffusion layer and read out, and the first storage capacitive element is a storage capacitive element located one stage before the last stage, the second storage capacitive element is a storage capacitive element located in the last stage, and the third storage capacitive element is a storage capacitive element located one stage before the last stage in an adjacent pixel of the adjacent row.

6. The solid-state imaging apparatus according to claim 1, wherein an exposure period is set to a same length as one vertical scan period, during the exposure period, the overflow signal charge that overflows from the photodiode is accumulated in a first storage capacitive element, after the exposure period, the signal charge of the photodiode and an attenuated signal charge attenuated by redistribution of the first signal charge accumulated in the first storage capacitive element with a second storage capacitive element in an adjacent row are held, mixed in the floating diffusion layer, and read out, and the first storage capacitive element is a storage capacitive element located in a last stage, and the second storage capacitive element is a storage capacitive element located in the last stage in an adjacent pixel of the adjacent row.

7. The solid-state imaging apparatus according to claim 1, wherein the solid-state imaging apparatus includes a pixel array of pixel cells each including a plurality of unit pixels, each of the plurality of unit pixels includes the photodiode, the overflow element group, the first transfer transistor, a capacitive element, a first storage transfer transistor, a second storage transfer transistor, and the floating diffusion layer, the floating diffusion layer includes a first floating region and a second floating region, the signal charge of the photodiode is transferred, via the first transfer transistor, to the first floating region that includes the capacitive element, the signal charge of the photodiode is transferred to a first stage storage capacitive element via a first stage overflow element, a first stored signal charge of the first stage storage capacitive element is transferred to the second floating region via the first storage transfer transistor, the first stored signal charge of the first stage storage capacitive element is transferred to a second stage storage capacitive element via a second stage overflow element, a second stored signal charge of the second stage storage capacitive element is transferred to the second floating region via the second storage transfer transistor, and each of the pixel cells includes a gain control element that controls whether to connect the first floating region and the second floating region.

8. The solid-state imaging apparatus according to claim 7, wherein each of the plurality of unit pixels further includes a third storage transfer transistor, the second stored signal charge of the second stage storage capacitive element is transferred to a third stage storage capacitive element via the second stage overflow element, and a third stored signal charge of the third stage storage capacitive element is transferred to the second floating region via the third storage transfer transistor.

9. The solid-state imaging apparatus according to claim 7, wherein each of the pixel cells does not include the second storage transfer transistor, and the second stage overflow element has characteristics of a bidirectional switch.

10. The solid-state imaging apparatus according to claim 8, wherein each of the pixel cells does not include the third storage transfer transistor, and a third stage overflow element has characteristics of a bidirectional switch.

11. The solid-state imaging apparatus according to claim 7, wherein the second stage storage capacitive element, the second storage transfer transistor, and the second stage overflow element are omitted.

12. The solid-state imaging apparatus according to claim 7, wherein each of the pixel cells includes a reset transistor, an amplification transistor, and a selection transistor, in each of the pixel cells, the plurality of unit pixels share the reset transistor, the amplification transistor, and the selection transistor, and in each of the plurality of unit pixels, the floating diffusion layer is connected to the gain control element.

13. The solid-state imaging apparatus according to claim 1, wherein one end of the storage capacitive element is set to an intermediate potential between a potential of a pixel power supply potential and a potential of ground voltage (GND), at a shutter timing, connection to the pixel power supply is made and a maximum positive voltage difference is applied, and during exposure, a voltage of another end of the storage capacitive element is capable of being reduced from the pixel power supply potential to a maximum negative voltage difference over exposure time.

14. The solid-state imaging apparatus according to claim 12, wherein when a pixel cell among the pixel cells has a vertical two-pixel single-cell structure, the gain control element is provided every two rows, and when the pixel cell among the pixel cells has a four-pixel single-cell structure, the gain control element is provided every four rows.

15. The solid-state imaging apparatus according to claim 2, wherein the signal charge from a unit pixel is used in generation of two frames, the two frames being a low-illuminance frame and a high-illuminance frame that are for a wide dynamic range function, the high-illuminance frame is based on an attenuated stored signal charge attenuated by the charge redistribution, and a pixel signal from the low-illuminance frame and a pixel signal from the high-illuminance frame have a same exposure time.

16. The solid-state imaging apparatus according to claim 2, wherein the signal charge from a unit pixel is used in generation of three frames, the three frames being a low-illuminance frame, a middle-illuminance frame, and a high-illuminance frame that are for a wide dynamic range function, the high-illuminance frame is based on an attenuated stored signal charge attenuated by the charge redistribution, and a pixel signal from the low-illuminance frame, a pixel signal from the middle-illuminance frame, and a pixel signal from the high-illuminance frame have a same exposure time.

17. The solid-state imaging apparatus according to claim 15, wherein pixel signals for correlated double sampling (CDS) are read out in listed order of a reset component for the high-illuminance frame, a signal component for the high-illuminance frame, a signal component for the low-illuminance frame, and a reset component for the low-illuminance frame.

18. The solid-state imaging apparatus according to claim 16, wherein pixel signals for correlated double sampling (CDS) are read out in listed order of a reset component for the high-illuminance frame, a signal component for the high-illuminance frame, a signal component for the middle-illuminance frame, a signal component for the low-illuminance frame, a reset component for the low-illuminance frame, and a reset component for the middle-illuminance frame.

19. The solid-state imaging apparatus according to claim 1, wherein the overflow element group has a lateral overflow architecture or a vertical overflow architecture.

20. An imaging apparatus, comprising:

the solid-state imaging apparatus according to claim 1, wherein the imaging apparatus is compatible with at least one of a view system for transport equipment, an advanced driver assistance systems (ADAS) sensing system for transport equipment, or an autonomous driving sensing system for transport equipment, and the imaging apparatus is provided in at least one of a front-view mirror, a surround-view mirror, a side mirror, a rear tailgate mirror, or a rear-view mirror of the transport equipment.

* * * * *